(12) United States Patent
Yamazaki et al.

(10) Patent No.: US 11,735,403 B2
(45) Date of Patent: Aug. 22, 2023

(54) SPUTTERING TARGET AND METHOD FOR MANUFACTURING THE SAME

(71) Applicant: Semiconductor Energy Laboratory Co., Ltd., Atsugi (JP)

(72) Inventors: Shunpei Yamazaki, Setagaya (JP); Motoki Nakashima, Isehara (JP); Haruyuki Baba, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 86 days.

(21) Appl. No.: 17/384,867

(22) Filed: Jul. 26, 2021

(65) Prior Publication Data
US 2021/0358729 A1 Nov. 18, 2021

Related U.S. Application Data

(62) Division of application No. 15/642,652, filed on Jul. 6, 2017, now Pat. No. 11,081,326.

(30) Foreign Application Priority Data

Jul. 11, 2016 (JP) .................. 2016-137190
Jul. 22, 2016 (JP) .................. 2016-144334

(51) Int. Cl.
*H01J 37/34* (2006.01)
*H01L 29/786* (2006.01)
(Continued)

(52) U.S. Cl.
CPC .......... *H01J 37/3429* (2013.01); *B28B 1/008* (2013.01); *B28B 11/24* (2013.01);
(Continued)

(58) Field of Classification Search
None
See application file for complete search history.

(56) References Cited

U.S. PATENT DOCUMENTS 7,674,650 B2   3/2010   Akimoto et al.
7,732,819 B2   6/2010   Akimoto et al.
(Continued)

FOREIGN PATENT DOCUMENTS

CN   001545567 A   11/2004
CN   101882630 A   11/2010
(Continued)

OTHER PUBLICATIONS

International Search Report (Application No. PCT/IB2017/053577) dated Oct. 10, 2017.
(Continued)

*Primary Examiner* — Jason Berman
(74) *Attorney, Agent, or Firm* — Robinson Intellectual Property Law Office; Eric J. Robinson

(57) ABSTRACT

A novel metal oxide or a novel sputtering target is provided. A sputtering target includes a conductive material and an insulating material. The insulating material includes an oxide, a nitride, or an oxynitride including an element M1. The element M1 is one or more kinds of elements selected from Al, Ga, Si, Mg, Zr, Be, and B. The conductive material includes an oxide, a nitride, or an oxynitride including indium and zinc. A metal oxide film is deposited using the sputtering target in which the conductive material and the insulating material are separated from each other.

8 Claims, 25 Drawing Sheets

(51) Int. Cl.
| | |
|---|---|
| *H01L 29/66* | (2006.01) |
| *H01L 21/02* | (2006.01) |
| *H01L 27/12* | (2006.01) |
| *C23C 14/34* | (2006.01) |
| *C23C 14/08* | (2006.01) |
| *B28B 11/24* | (2006.01) |
| *B28B 1/00* | (2006.01) |
| *C04B 35/01* | (2006.01) |
| *C04B 35/453* | (2006.01) |
| *C04B 35/58* | (2006.01) |
| *H01L 29/423* | (2006.01) |
| *H01L 29/24* | (2006.01) |
| *G02F 1/1368* | (2006.01) |
| *G02F 1/1335* | (2006.01) |
| *G02F 1/1333* | (2006.01) |

(52) U.S. Cl.
CPC ............ *C04B 35/01* (2013.01); *C04B 35/453* (2013.01); *C04B 35/58* (2013.01); *C23C 14/086* (2013.01); *C23C 14/3414* (2013.01); *H01J 37/3414* (2013.01); *H01J 37/3417* (2013.01); *H01J 37/3426* (2013.01); *H01L 21/02554* (2013.01); *H01L 21/02565* (2013.01); *H01L 21/02631* (2013.01); *H01L 27/127* (2013.01); *H01L 27/1225* (2013.01); *H01L 29/42384* (2013.01); *H01L 29/66969* (2013.01); *H01L 29/7869* (2013.01); *H01L 29/78648* (2013.01); *H01L 29/78696* (2013.01); *C04B 2235/3205* (2013.01); *C04B 2235/3206* (2013.01); *C04B 2235/3217* (2013.01); *C04B 2235/3232* (2013.01); *C04B 2235/3239* (2013.01); *C04B 2235/3244* (2013.01); *C04B 2235/3251* (2013.01); *C04B 2235/3256* (2013.01); *C04B 2235/3258* (2013.01); *C04B 2235/3279* (2013.01); *C04B 2235/3284* (2013.01); *C04B 2235/3286* (2013.01); *C04B 2235/3287* (2013.01); *C04B 2235/3293* (2013.01); *C04B 2235/3409* (2013.01); *C04B 2235/3418* (2013.01); *C04B 2235/3852* (2013.01); *C04B 2235/72* (2013.01); *C04B 2235/781* (2013.01); *C04B 2235/785* (2013.01); *C04B 2235/786* (2013.01); *C04B 2235/80* (2013.01); *G02F 1/1368* (2013.01); *G02F 1/133345* (2013.01); *G02F 1/133514* (2013.01); *G02F 1/133553* (2013.01); *G02F 2203/02* (2013.01); *H01L 29/24* (2013.01)

(56) References Cited

U.S. PATENT DOCUMENTS

| | | | |
|---|---|---|---|
| 7,910,490 B2 | 3/2011 | Akimoto et al. | |
| 7,932,521 B2 | 4/2011 | Akimoto et al. | |
| 8,153,031 B2 | 4/2012 | Yano et al. | |
| 8,274,077 B2 | 9/2012 | Akimoto et al. | |
| 8,426,868 B2 | 4/2013 | Akimoto et al. | |
| 8,455,371 B2 | 6/2013 | Yano et al. | |
| 8,466,463 B2 | 6/2013 | Akimoto et al. | |
| 8,629,069 B2 | 1/2014 | Akimoto et al. | |
| 8,669,550 B2 | 3/2014 | Akimoto et al. | |
| 8,748,886 B2 | 6/2014 | Yamazaki et al. | |
| 8,790,959 B2 | 7/2014 | Akimoto et al. | |
| 8,796,069 B2 | 8/2014 | Akimoto et al. | |
| 8,847,220 B2 | 9/2014 | Yamazaki | |
| 8,860,108 B2 | 10/2014 | Yamazaki et al. | |
| 8,894,825 B2 * | 11/2014 | Yamazaki | H01L 29/4966 204/192.12 |
| 8,907,336 B2 | 12/2014 | Shieh et al. | |
| 8,921,853 B2 | 12/2014 | Yamazaki | |
| 8,952,377 B2 | 2/2015 | Yamazaki et al. | |
| 8,952,381 B2 | 2/2015 | Yamazaki | |
| 9,045,823 B2 | 6/2015 | Osada et al. | |
| 9,082,857 B2 | 7/2015 | Yamazaki et al. | |
| 9,099,562 B2 | 8/2015 | Akimoto et al. | |
| 9,099,563 B2 | 8/2015 | Shieh et al. | |
| 9,136,338 B2 | 9/2015 | Yano et al. | |
| 9,190,525 B2 | 11/2015 | Yamazaki | |
| 9,214,474 B2 | 12/2015 | Yamazaki | |
| 9,245,958 B2 | 1/2016 | Yamazaki | |
| 9,267,199 B2 | 2/2016 | Yamazaki et al. | |
| 9,306,078 B2 | 4/2016 | Shieh et al. | |
| 9,397,194 B2 | 7/2016 | Yamazaki et al. | |
| 9,583,632 B2 | 2/2017 | Yamazaki | |
| 9,865,696 B2 | 1/2018 | Yamazaki | |
| 10,090,136 B2 | 10/2018 | Tao et al. | |
| 10,128,381 B2 | 11/2018 | Yamazaki et al. | |
| 10,468,535 B2 | 11/2019 | Morita et al. | |
| 2004/0180217 A1 | 9/2004 | Inoue et al. | |
| 2004/0222089 A1 | 11/2004 | Inoue et al. | |
| 2006/0289303 A1 | 12/2006 | Kurihara | |
| 2008/0308774 A1 | 12/2008 | Inoue et al. | |
| 2008/0308805 A1 | 12/2008 | Akimoto et al. | |
| 2010/0051949 A1 | 3/2010 | Yamazaki et al. | |
| 2010/0300878 A1 | 12/2010 | Osada et al. | |
| 2011/0104851 A1 | 5/2011 | Akimoto et al. | |
| 2011/0121290 A1 | 5/2011 | Akimoto et al. | |
| 2012/0068130 A1 | 3/2012 | Inoue et al. | |
| 2013/0009111 A1 | 1/2013 | Morita et al. | |
| 2013/0126344 A1 | 5/2013 | Chau et al. | |
| 2013/0292671 A1 | 11/2013 | Yamazaki et al. | |
| 2014/0042434 A1 | 2/2014 | Yamazaki | |
| 2014/0231798 A1 | 8/2014 | Ono et al. | |
| 2014/0241978 A1 * | 8/2014 | Yamazaki | H01L 29/78696 264/681 |
| 2015/0021593 A1 | 1/2015 | Yamazaki | |
| 2015/0340513 A1 | 11/2015 | Akimoto et al. | |
| 2016/0141157 A1 | 5/2016 | Hagmann et al. | |
| 2016/0149055 A1 | 5/2016 | Yamazaki et al. | |
| 2016/0160342 A1 | 6/2016 | Yamazaki et al. | |
| 2016/0172383 A1 | 6/2016 | Nagatsuka | |
| 2017/0178904 A1 | 6/2017 | Yamazaki et al. | |
| 2018/0006124 A1 | 1/2018 | Murakawa et al. | |
| 2018/0012910 A1 | 1/2018 | Yamazaki et al. | |
| 2018/0013002 A1 | 1/2018 | Yamazaki et al. | |
| 2018/0013003 A1 | 1/2018 | Yamazaki | |

FOREIGN PATENT DOCUMENTS

| | | |
|---|---|---|
| CN | 102016112 A | 4/2011 |
| CN | 102792451 A | 11/2012 |
| CN | 103050412 A | 4/2013 |
| CN | 103130493 A | 6/2013 |
| CN | 104487402 A | 4/2015 |
| CN | 104619674 A | 5/2015 |
| CN | 105378138 A | 3/2016 |
| EP | 1422312 A | 5/2004 |
| EP | 1431414 A | 6/2004 |
| EP | 2159845 A | 3/2010 |
| EP | 2264211 A | 12/2010 |
| EP | 2278041 A | 1/2011 |
| EP | 2280092 A | 2/2011 |
| EP | 2284293 A | 2/2011 |
| JP | 56-134729 A | 10/1981 |
| JP | 2007-096055 A | 4/2007 |
| JP | 2007-123861 A | 5/2007 |
| JP | 2008-280216 A | 11/2008 |
| JP | 2008-285760 A | 11/2008 |
| JP | 2011-119674 A | 6/2011 |
| JP | 2011-199108 A | 10/2011 |
| JP | 2012-140706 A | 7/2012 |
| JP | 5118810 | 1/2013 |
| JP | 2014-062316 A | 4/2014 |
| JP | 2014-138105 A | 7/2014 |
| JP | 2014-194076 A | 10/2014 |
| JP | 2015-038980 A | 2/2015 |
| KR | 2004-0030889 A | 4/2004 |
| KR | 10-1344594 | 12/2013 |

(56) References Cited

FOREIGN PATENT DOCUMENTS

| KR | 2014-0037948 A | 3/2014 |
|---|---|---|
| KR | 2015-0010572 A | 1/2015 |
| TW | I238199 | 8/2005 |
| TW | 201012956 | 4/2010 |
| TW | 201245097 | 11/2012 |
| TW | 201410637 | 3/2014 |
| TW | 201505073 | 2/2015 |
| WO | WO-2003/014409 | 2/2003 |
| WO | WO-2009/142289 | 11/2009 |
| WO | WO-2009/151003 | 12/2009 |
| WO | WO-2011/024909 | 3/2011 |
| WO | WO-2012/039351 | 3/2012 |
| WO | WO-2012/096267 | 7/2012 |
| WO | WO-2012/108504 | 8/2012 |
| WO | WO-2014/010383 | 1/2014 |

OTHER PUBLICATIONS

Written Opinion (Application No. PCT/IB2017/053577) dated Oct. 10, 2017.
Nomura.K et al., "Local coordination structure and electronic structure of the large electron mobility amorphous oxide semiconductor In—Ga—Zn—O: Experiment and ab initio calculations", Phys. Rev. B (Physical Review. B), Jan. 18, 2007, vol. 75, No. 3, pp. 035212-1-035212-5.
Murakami.M et al., "Theoretical Examination on a Significantly Low Off-State Current of a Transistor Using Crystalline In—Ga—Zn-Oxide", AM-FPD '12 Digest of Technical Papers, Jul. 4, 2012, pp. 171-174.
Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.
Wager.J, "Oxide TFTs: A Progress Report", Information Display, 2016, vol. 32, No. 1, pp. 16-21.
Xiao.T et al., "Metal Oxide TFT Turnkey Manufacturing Solutions for a-Si TFT Lines", SID Digest '16 : SID International Symposium Digest of Technical Papers, 2016, pp. 318-321.
Yamazaki.S et al., "Achievement of a high-mobility FET with a cloud-aligned composite oxide semiconductor", Jpn. J. Appl. Phys. (Japanese Journal of Applied Physics), Oct. 13, 2016, vol. 55, pp. 115504-1-115504-7.
Matsubayashi.D et al., "20-nm-node trench-gate-self-aligned crystalline In—Ga—Zn-Oxide FET with high frequency and low off-state current", IEDM 15: Technical Digest of International Electron Devices Meeting, Dec. 7, 2015, pp. 141-144.
Kurosawa.Y et al., "The crystallinity of nano-crystalline IGZO thin films", Extended Abstracts (The 75th Autumn Meeting 2014), The Japan Society of Applied Physics and Related Societies, Sep. 18, 2014, pp. 21-033.
Yamazaki.S et al., "Future Possibilities of Crystalline Oxide Semiconductor, Especially C-Axis-Aligned Crystalline IGZO", SID Digest '15 : SID International Symposium Digest of Technical Papers, Jun. 1, 2015, pp. 673-676.
Yamazaki.S, "Discovery of Indium Gallium Zinc Oxide (CAAC/CAC-OS) and Application to Next-generation Display Devices", 9th HTCMC & GFMAT, Jun. 27, 2016, pp. 1-55.
Taiwanese Office Action (Application No. 105142763) dated May 22, 2020.
Chinese Office Action (Application No. 201780043223.8) dated Sep. 25, 2020.
Chinese Office Action (Application No. 201780043223.8) dated Mar. 23, 2021.

\* cited by examiner $\Delta CB_{001} > \Delta CB_{002}$
$CB_{001} \approx CB_{002}$ $CB_{001} > CB_{002}$ $\Delta CB_{001} > \Delta CB_{002} > 0$

SPUTTERING TARGET AND METHOD FOR MANUFACTURING THE SAME

TECHNICAL FIELD

The present invention relates to an object, a method, or a manufacturing method. The present invention relates to a process, a machine, manufacture, or a composition of matter. In particular, one embodiment of the present invention relates to a metal oxide, a method for forming the metal oxide, a sputtering target, or a method for manufacturing the sputtering target. One embodiment of the present invention relates to a semiconductor device, a display device, a liquid crystal display device, a light-emitting device, a power storage device, a memory device, a method for driving them, or a method for manufacturing them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

BACKGROUND ART

As a semiconductor material applicable to a transistor, an oxide has been attracting attention. For example, Patent Document 1 discloses a field-effect transistor including an amorphous oxide of any of an In—Zn—Ga—O-based oxide, an In—Zn—Ga—Mg—O-based oxide, an In—Zn—O-based oxide, an In—Sn—O-based oxide, an In—O-based oxide, an In—Ga—O-based oxide, and a Sn—In—Zn—O-based oxide.

Non-Patent Document 1 discusses a structure in which an active layer of a transistor includes two layers of metal oxides of an In—Zn—O-based oxide and an In—Ga—Zn—O-based oxide.

REFERENCE

Patent Document

[Patent Document 1] Japanese Patent No. 5118810

Non-Patent Document

[Non-Patent Document 1] John F. Wager, "Oxide TFTs: A Progress Report", Information Display 1/16, SID 2016, January/February 2016, Vol. 32, No. 1, pp. 16-21

DISCLOSURE OF INVENTION

In Patent Document 1, an active layer of a transistor is formed using an amorphous oxide of any of an In—Zn—Ga—O-based oxide, an In—Zn—Ga—Mg—O-based oxide, an In—Zn—O-based oxide, an In—Sn—O-based oxide, an In—O-based oxide, an In—Ga—O-based oxide, and a Sn—In—Zn—O-based oxide. In other words, the active layer of the transistor includes one of the amorphous oxides. The transistor whose active layer includes one of the amorphous oxides has a problem of a small on-state current, which is one of electrical characteristics of the transistor. Alternatively, the transistor whose active layer includes one of the amorphous oxides has a problem of decreased reliability.

In Non-Patent Document 1, a channel-protective bottom-gate transistor achieves high field-effect mobility ($\mu$=62 cm$^2$V$^{-1}$s$^{-1}$). An active layer of the transistor is a two-layer stack of an In—Zn oxide and an In—Ga—Zn oxide, and the thickness of the In—Zn oxide where a channel is formed is 10 nm. However, the S value (the subthreshold swing (SS)), which is one of transistor characteristics, is as large as 0.41 V/decade. Moreover, the threshold voltage (Vth), which is also one of transistor characteristics, is −2.9 V, which means that the transistor has a normally-on characteristic.

In view of the above problems, an object of one embodiment of the present invention is to provide a novel metal oxide. Another object of one embodiment of the present invention is to provide a novel sputtering target. Another object of one embodiment of the present invention is to give favorable electrical characteristics to a semiconductor device. Another object of one embodiment of the present invention is to provide a highly reliable semiconductor device. Another object of one embodiment of the present invention is to provide a semiconductor device with a novel structure. Another object of one embodiment of the present invention is to provide a display device with a novel structure.

Note that the descriptions of these objects do not disturb the existence of other objects. In one embodiment of the present invention, there is no need to achieve all the objects. Other objects will be apparent from and can be derived from the description of the specification, the drawings, the claims, and the like.

An embodiment of the present invention is a sputtering target including a conductive material and an insulating material. The insulating material includes an oxide, a nitride, or an oxynitride including an element M1. The element M1 is one or more kinds of elements selected from Al, Ga, Si, Mg, Zr, Be, and B. The conductive material includes an oxide, a nitride, or an oxynitride including indium and zinc. The conductive material and the insulating material are separated from each other.

In the above structure, the element M1 is preferably Ga.

An embodiment of the present invention is a sputtering target including a conductive material and an insulating material. The insulating material includes an oxide, a nitride, or an oxynitride comprising an element M1. The element M1 is one or more kinds of elements selected from Al, Ga, Si, Mg, Zr, Be, and B. The conductive material includes an oxide, a nitride, or an oxynitride including one or both of indium and zinc and an element M2. The element M2 is one or more kinds of elements selected from Ti, Ge, Sn, V, Ni, Mo, W, and Ta. The conductive material and the insulating material are separated from each other.

In the above structure, it is preferable that the element M1 be Ga and the element M2 be Ti or Ge.

An embodiment of the present invention is a puttering target including a conductive material and an insulating material. The insulating material including an oxide, a nitride, or an oxynitride including an element M1. The element M1 is two or more kinds of elements selected from Al, Ga, Si, Mg, Zr, Be, and B. The conductive material includes one or both of indium and zinc. The conductive material and the insulating material are separated from each other.

In the structure, the element M1 is preferably two or more of Al, Ga, and Si.

In the above structure, the insulating material preferably further includes zinc.

In the above structure, the atomic ratio of indium included in the conductive material is preferably higher than the atomic ratio of the element M1 included in the insulating material. In the above structure, each of the conductive material and the insulating material is preferably in a particulate form. In the above structure, the conductive material and the insulating material preferably each include a region having a diameter of less than 10 μm or a similar value.

Another embodiment of the present invention is a method for manufacturing a sputtering target, including the steps of weighing an oxide of an element M1 and a first zinc oxide, which are raw materials of an insulating material, and an indium oxide and a second zinc oxide, which are raw materials of a conductive material, in which the element M1 is one or more kinds of elements selected from Al, Ga, Si, Mg, Zr, Be, and B; forming a first mixture by mixing the oxide of the element M1 and the first zinc oxide; forming a first molded body by molding the first mixture with pressure; forming a first baked body by baking the first molded body; forming a first powder by pulverizing the first baked body; forming a second mixture by mixing the indium oxide and the second zinc oxide; forming a second molded body by molding the second mixture with pressure; forming a second baked body by baking the second molded body; forming a second powder by pulverizing the second baked body; forming a third mixture by mixing the first powder and the second powder; and forming a third molded body by molding the third mixture with pressure. A step of baking the third molded body is not performed after the step of forming the third molded body.

Another embodiment of the present invention is a method for manufacturing a sputtering target, including the steps of weighing an oxide of an element M1 and a first zinc oxide, which are raw materials of an insulating material, and an indium oxide and a second zinc oxide, which are raw materials of a conductive material, in which the element M1 is one or more kinds of elements selected from Al, Ga, Si, Mg, Zr, Be, and B; forming a first mixture by mixing the oxide of the element M1 and the first zinc oxide; forming a first molded body by molding the first mixture with pressure; forming a first baked body by baking the first molded body; forming a first powder by pulverizing the first baked body; forming a second mixture by mixing the indium oxide and the second zinc oxide; forming a second molded body by molding the second mixture with pressure; forming a second baked body by baking the second molded body; forming a second powder by pulverizing the second baked body; forming a third mixture by mixing the first powder and the second powder; forming a third molded body by molding the third mixture with pressure; and forming a third baked body by baking the third molded body. The third molded body is baked at a temperature at which part of the conductive material and part of the insulating material are not combined with each other.

In the above structure, the third molded body is preferably baked at a temperature lower than baking temperatures of the first molded body and the second molded body.

Another embodiment of the present invention is a method for manufacturing a sputtering target, including the steps of weighing an oxide of an element M1, which is a raw material of an insulating material, and an indium oxide, a zinc oxide, and an oxide of an element M2, which are raw materials of a conductive material, in which the element M1 is one or more kinds of elements selected from Al, Ga, Si, Mg, Zr, Be, and B, and the element M2 is one or more kinds of elements selected from Ti, Ge, Sn, V, Ni, Mo, W, and Ta; forming a first mixture by mixing the indium oxide, the zinc oxide, and the oxide of the element M2; forming a first molded body by molding the first mixture with pressure; forming a first baked body by baking the first molded body; forming a first powder by pulverizing the first baked body; forming a second mixture by mixing the first powder and the oxide of the element M1; and forming a second molded body by molding the second mixture with pressure. A step of baking the second molded body is not performed after the step of forming the second molded body.

Another embodiment of the present invention is a method for manufacturing a sputtering target, including the steps of weighing an oxide of an element M1, which is a raw material of an insulating material, and an indium oxide, a zinc oxide, and an oxide of an element M2, which are raw materials of a conductive material, in which the element M1 is one or more kinds of elements selected from Al, Ga, Si, Mg, Zr, Be, and B, and the element M2 is one or more kinds of elements selected from Ti, Ge, Sn, V, Ni, Mo, W, and Ta; forming a first mixture by mixing the indium oxide, the zinc oxide, and the oxide of the element M2; forming a first molded body by molding the first mixture with pressure; forming a first baked body by baking the first molded body; forming a first powder by pulverizing the first baked body; forming a second mixture by mixing the first powder and the oxide of the element M1; forming a second molded body by molding the second mixture with pressure; and forming a second baked body by baking the second molded body. The second molded body is baked at a temperature at which part of the conductive material and part of the insulating material are not combined with each other.

Another embodiment of the present invention is a method for manufacturing a sputtering target, including the steps of weighing an oxide of an element M1A and an oxide of an element M1B, which are raw materials of an insulating material, and an indium oxide and a zinc oxide, which are raw materials of a conductive material, in which the element M1A is one or more kinds of elements selected from Al, Ga, Si, Mg, Zr, Be, and B, and the element M1B is one or more kinds of elements selected from Al, Ga, Si, Mg, Zr, Be, and B and includes an element of a different kind from the element M1A; forming a first mixture by mixing the oxide of the element M1A and the oxide of the element M1B; forming a first molded body by molding the first mixture with pressure; forming a first baked body by baking the first molded body; forming a first powder by pulverizing the first baked body; forming a second mixture by mixing the first powder, the indium oxide, and the zinc oxide; and forming a second molded body by molding the second mixture with pressure. A step of baking the second molded body is not performed after the step of forming the second molded body.

Another embodiment of the present invention is a method for manufacturing a sputtering target, including the steps of weighing an oxide of an element M1A and an oxide of an element M1B, which are raw materials of an insulating material, and an indium oxide and a zinc oxide, which are raw materials of a conductive material, in which the element M1A is one or more kinds of elements selected from Al, Ga, Si, Mg, Zr, Be, and B, and the element M1B is one or more kinds of elements selected from Al, Ga, Si, Mg, Zr, Be, and B and includes an element of a different kind from the element M1A; forming a first mixture by mixing the oxide of the element M1A and the oxide of the element M1B; forming a first molded body by molding the first mixture with pressure; forming a first baked body by baking the first molded body; forming a first powder by pulverizing the first baked body; forming a second mixture by mixing the first powder, the indium oxide, and the zinc oxide; forming a second molded body by molding the second mixture with pressure; and forming a second baked body by baking the second molded body. The second molded body is baked at a temperature at which part of the conductive material and part of the insulating material are not combined with each other.

In the above structure, the second molded body is preferably baked at a temperature lower than a baking temperature of the first molded body.

In the above structure, a zinc oxide may be further used as a raw material of the insulating material.

According to one embodiment of the present invention, a novel metal oxide can be provided. According to one embodiment of the present invention, a novel sputtering target can be provided. According to one embodiment of the present invention, a semiconductor device with favorable electrical characteristics can be provided. A highly reliable semiconductor device can be provided. A semiconductor device with a novel structure can be provided. A display device with a novel structure can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BEST MODE FOR CARRYING OUT THE INVENTION

Figure 1A:
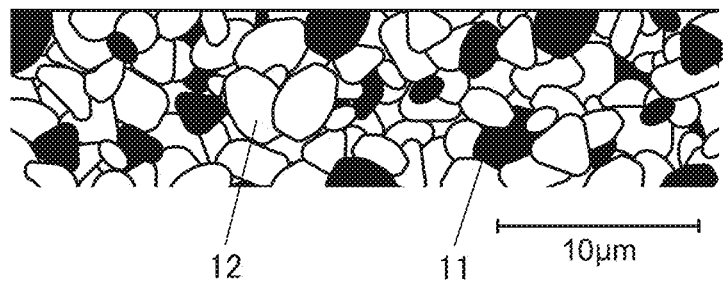
FIG. 1A is a schematic view of a sputtering target and FIG. 1B is a schematic view illustrating deposition using the sputtering target.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the term "electrically connected" includes the case where components are connected through an "object having any electric function". There is no particular limitation on the "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification and the like, a "silicon oxynitride film" refers to a film that includes oxygen at a higher proportion than nitrogen, and a "silicon nitride oxide film" refers to a film that includes nitrogen at a higher proportion than oxygen.

In the description of modes of the present invention in this specification and the like with reference to the drawings, the same components in different drawings are commonly denoted by the same reference numeral in some cases.

In this specification and the like, the terms "film" and "layer" can be interchanged with each other depending on the case. For example, the term "conductive layer" can be changed into the term "conductive film" in some cases. Also, the term "insulating film" can be changed into the term "insulating layer" in some cases.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

In this specification and the like, a normally-on transistor is in an on-state even without application of potential by a power source (0 V). For example, in some cases, the normally-on characteristics mean that the threshold voltage of a transistor is negative when 0 V is applied to a gate of the transistor.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, a metal oxide having at least one of an amplification function, a rectification function, and a switching function can be referred to as a metal oxide semiconductor (abbreviated to an OS). That is, an OS FET is a transistor including a metal oxide or an oxide semiconductor.

In this specification and the like, a metal oxide including nitrogen is also referred to as a metal oxide in some cases. Alternatively, a metal oxide including nitrogen may be referred to as a metal oxynitride.

In this specification and the like, the energy gap is a difference in energy between the energy level of the valence band maximum (Ev edge) and the energy level of the conduction band minimum (Ec edge) in the band structure. The energy gap may be replaced with the band gap.

Embodiment 1

In this embodiment, a metal oxide and a sputtering target for depositing the metal oxide, which are embodiments of the present invention, are described.

The metal oxide described in this embodiment preferably includes at least indium. In particular, indium and zinc are preferably included. In addition, an element M1 (the element M1 is one or more kinds of elements selected from Al, Ga, Si, Mg, Zr, Be, and B) is included. Furthermore, an element M2 (the element M2 is one or more kinds of elements selected from Ti, Ge, Sn, V, Ni, Mo, W, and Ta) is preferably included.

Here, the case where a metal oxide includes indium, the element M1, the element M2, and zinc is considered. The terms of the atomic ratio of indium, the element M1, the element M2, and zinc included in the metal oxide are denoted by [In], [M1], [M2], and [Zn], respectively.

<Sputtering target>

Figure 1B:
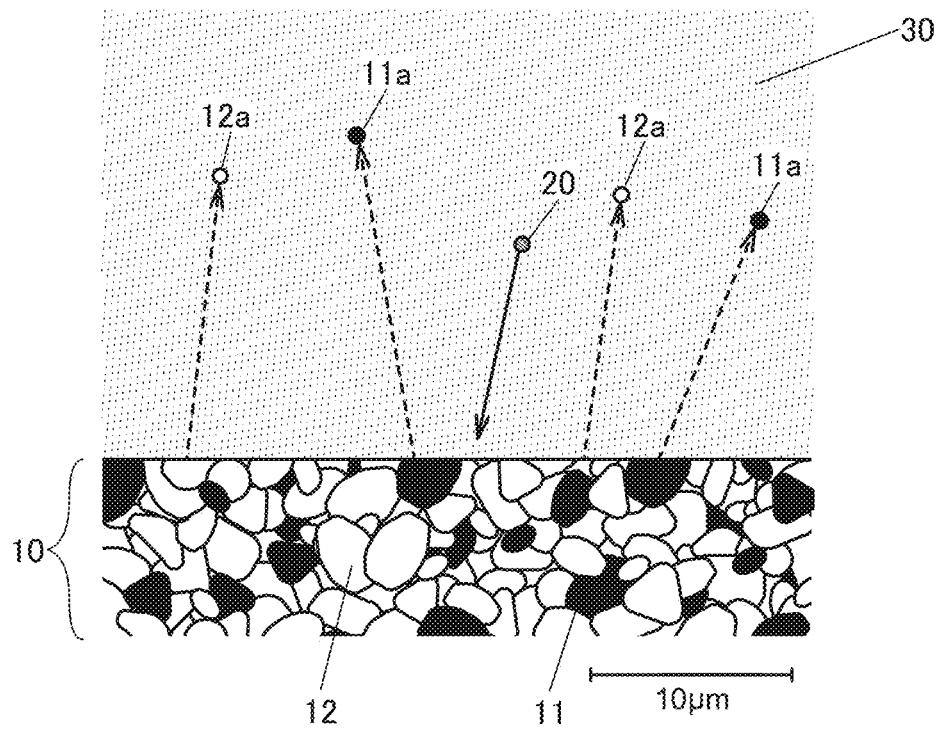

First, a sputtering target for depositing a metal oxide by a sputtering method is described with reference to FIGS. 1A and 1B. FIG. 1A is a cross-sectional view of a sputtering target 10 for depositing a metal oxide by a sputtering method. FIG. 1B illustrates deposition of a metal oxide using the sputtering target 10.

The sputtering target 10 includes a first region 11 including an insulating material (also referred to as a dielectric material) and a second region 12 including a conductive material. The first region 11 and the second region 12 are separated from each other. The first region 11 preferably has higher resistance than the second region 12. It is preferable that the sputtering target 10 be functionally separated into the first region 11 functioning as an insulating region (also referred to as a dielectric region) and the second region 12 functioning as a conductive region. In other words, two phases having different characteristics, i.e., the first region 11 functioning as an insulating region and the second region 12 functioning as a conductive region, exist in the sputtering target 10.

As illustrated in FIGS. 1A and 1B, the first region 11 and the second region 12 are preferably in a particulate form. The diameter of each of the first region 11 and the second region 12 is preferably less than 10 μm.

The sputtering target 10 may partly include a crystal structure, such as a nano-crystal (nc) structure or a polycrystalline structure. In the case where one or both of the first region 11 and the second region 12 have a nano-crystal structure, the diameter is preferably larger than or equal to 0.5 nm and smaller than or equal to 3 nm, larger than or equal to 1 nm and smaller than or equal to 2 nm, or a value in the vicinity thereof.

The first region 11 preferably includes the element M1 (the element M1 is one or more kinds of elements selected from Al, Ga, Si, Mg, Zr, Be, and B), or both the element M1 and zinc. The first region 11 may include an oxide of the element M1, or an oxide of the element M1 and zinc. For example, the first region 11 includes an M1 oxide, an M1-Zn oxide, an In-M1-Zn oxide, an In-M1-M2-Zn oxide, or the like in some cases. The first region 11 may include a nitride or an oxynitride of the element M1 or a nitride or an oxynitride of the element M1 and zinc. For example, the first region 11 may include aluminum nitride or silicon nitride. Note that the atomic ratio of In in the first region 11 is preferably lower than the atomic ratio of In in the second region 12, and the atomic ratio of the element M2 in the first region 11 is preferably lower than the atomic ratio of the element M2 in the second region 12.

The second region 12 preferably includes one or both of indium and zinc. In addition, the second region 12 preferably includes the element M2 (the element M2 is one or more kinds of elements selected from Ti, Ge, Sn, V, Ni, Mo, W, and Ta). The second region 12 may include an oxide, a nitride, and/or an oxynitride including one or both of indium and zinc. The second region 12 may include an oxide, a nitride, and/or an oxynitride including the element M2 (the element M2 is one or more kinds of elements selected from Ti, Ge, Sn, V, Ni, Mo, W, and Ta). For example, the second region 12 may include tantalum nitride. For example, an In oxide, a Zn oxide, an In—Zn oxide, an In-M2 oxide, a Zn-M2 oxide, an In—Zn-M2 oxide, or the like is included in some cases.

In the sputtering target 10, it is preferable that part of the insulating material and part of the conductive material not be combined with each other. For example, it is preferable that the element M1 in the first region 11 and indium in the second region 12 not be combined with each other.

For example, in the case where the element M1 is Ga and the element M2 is Ti, the first region 11 preferably includes a Ga oxide, a Ga—Zn oxide, an In—Ga—Zn oxide, an In—Ga—Ti—Zn oxide, or the like, and the second region 12 preferably includes an In oxide, a Zn oxide, an In—Zn oxide, an In—Ti oxide, a Zn—Ti oxide, an In—Zn—Ti oxide, or the like.

For example, in the case where the element M1 is Ga and the element M2 is Ge, the first region 11 preferably includes a Ga oxide, a Ga—Zn oxide, an In—Ga—Zn oxide, an In—Ga—Ge—Zn oxide, or the like, and the second region 12 preferably includes an In oxide, a Zn oxide, an In—Zn oxide, an In—Ge oxide, a Zn—Ge oxide, an In—Zn—Ge oxide, or the like.

For example, in the case where the element M1 is Ga and Al and the element M2 is Ti, the first region 11 preferably includes a Ga oxide, an Al oxide, a Ga—Al oxide, a Ga—Zn oxide, an Al—Zn oxide, a Ga—Al—Zn oxide, an In—Ga—Zn oxide, an In—Al—Zn oxide, an In—Ga—Al—Zn oxide, an In—Ga—Ti—Zn oxide, an In—Al—Ti—Zn oxide, an In—Ga—Al—Ti—Zn oxide, or the like, and the second region 12 preferably includes an In oxide, a Zn oxide, an In—Zn oxide, an In—Ti oxide, a Zn—Ti oxide, an In—Zn—Ti oxide, or the like.

For example, in the case where the element M1 is Ga and the element M2 is not included, the first region 11 preferably includes a Ga oxide, a Ga—Zn oxide, an In—Ga—Zn oxide, or the like, and the second region 12 preferably includes an In oxide, a Zn oxide, an In—Zn oxide, or the like.

When the amount of the conductive material is larger than the amount of the insulating material in a metal oxide deposited using the sputtering target 10, the carrier mobility of the metal oxide can be increased. Such a metal oxide can be deposited with the sputtering target 10 in which the atomic ratio of indium in the conductive material is higher than the atomic ratio of the element M1 in the insulating material.

The valence of the element M2 is greater than the valences of In, Ga, and Zn. For example, in the case where the element M2 is Ti, Zn has a valence of 2, In and Ga each have a valence of 3, and Ti has a valence of 4. With the use of the element M2 (here, Ti) whose valence is greater than those of In, Ga, and Zn in the metal oxide, this element serves as a carrier supply source and can increase the carrier density of a region including the element M2 in the metal oxide deposited using the sputtering target 10. In addition, Ti is more strongly bonded to oxygen than In, Ga, and Zn. For this reason, when Ti is included in the metal oxide, the generation of oxygen vacancies can be suppressed. Therefore, when the metal oxide deposited using the sputtering target 10 is used in a semiconductor layer of a transistor, the field-effect mobility of the transistor is improved and oxygen vacancies are reduced, whereby a semiconductor device with high reliability can be obtained.

The sputtering target 10 preferably has an atomic ratio of [In]:[M1]:[M2]:[Zn]=4:1:1:4, an atomic ratio of [In]:[M1]:[M2]:[Zn]=5:0.5:0.5:7, or an atomic ratio in the vicinity thereof. For example, in the case where the element M1 is Ga and the element M2 is Ti or Ge, it is preferable to use a metal oxide target having an atomic ratio of In:Ga:Ti:Zn=4:1:1:4, an atomic ratio of In:Ga:Ge:Zn=4:1:1:4, an atomic ratio of In:Ga:Ti:Zn=5:0.5:0.5:7, an atomic ratio of In:Ga:Ge:Zn=5:0.5:0.5:7, or an atomic ratio in the vicinity thereof. For example, the atomic ratio of the element M2 is preferably substantially the same as or smaller than the atomic ratio of the element M1. The composition of the sputtering target 10 is not limited to the above examples.

Note that the atomic ratio of metal elements in the formed metal oxide film varies from the above atomic ratios of metal elements of the sputtering targets in a range of ±40%.

In the sputtering target 10 described in this embodiment, the first region 11 may include two or more kinds of the elements listed above as the element M1. In the sputtering target 10 described in this embodiment, the second region 12 does not necessarily include the element M2.

When the sputtering target 10 includes, as the insulating material, two or more kinds of the elements listed above as the element M1, the energy gap of a region including the element M1 in a metal oxide deposited using the sputtering target 10 can be increased in some cases.

When the first region 11 and the second region 12 each include zinc, in a metal oxide film deposited using the sputtering target 10, both a first component region including at least the element M1 and a second component region including at least In can include zinc. Furthermore, the metal oxide film can include zinc between the first component region and the second component region. When the metal oxide film includes zinc in such a manner, carriers (electrons) flow through the metal oxide film using also zinc as a conductive path.

<Method for Manufacturing Sputtering Target>

Next, methods for manufacturing the sputtering target 10 are described with reference to flow charts in FIG. 2, FIG. 3, and FIG. 4.

First, a method for manufacturing the sputtering target 10 is described with reference to a flow chart in FIG. 2.

Raw materials of the conductive material and raw materials of the insulating material are weighed (step S101). For example, in the case where the element M2 is Ti, powdery indium oxide, powdery zinc oxide, powdery titanium oxide, and the like can be used as the raw materials of the conductive material. The raw materials of the conductive material are not limited to these, and a powdery oxide of the element M2 or the like may be used as appropriate. For example, in the case where the element M1 is Ga, powdery Ga oxide and the like can be used as the raw materials of the insulating material. The raw materials of the insulating material are not limited to these, and a powdery oxide of the element M1 or the like may be used as appropriate. Although the oxides of elements are used in the above example, oxynitrides, nitrides, or the like may be used.

In weighing the raw materials of the conductive material and the insulating material, for example, a powdery indium oxide, a powdery oxide of the element M1, a powdery oxide of the element M2, and a powdery zinc oxide are weighed so that the atomic ratio of [In]:[M1]:[M2]:[Zn] is 4:1:1:4, 5:0.5:0.5:7, or the like as described above.

When raw materials with high purity are used as the raw materials of the conductive material and the insulating material, the sputtering target 10 with low impurity concentration can be easily obtained in a later step. Specifically, the concentration of each alkali metal can be lower than 10 ppm by weight, preferably lower than 5 ppm by weight, further preferably lower than 2 ppm by weight. The concentration of each alkaline earth metal can be lower than 5 ppm by weight, preferably lower than 2 ppm by weight, further preferably lower than 1 ppm by weight. The concentration of each halogen can be lower than 10 ppm by weight, preferably lower than 5 ppm by weight, further preferably lower than 2 ppm by weight. Note that these impurity concentrations may be measured by secondary ion mass spectrometry (SIMS), glow discharge mass spectrometry (GDMS), inductively coupled plasma mass spectrometry (ICP-MS), or the like.

Then, the weighed raw materials of the conductive material are mixed and a mixture is formed (step S102). For example, a powdery indium oxide, a powdery zinc oxide, and a powdery oxide of the element M2 are mixed and a mixture is formed. In the following description, this mixture is referred to as a mixture of the conductive material in some cases.

Next, the conductive material mixture is spread over a mold and molded (step S103). Pressure is applied to the mixture spread over the mold with a pressing machine or the like, whereby a molded body is formed. In the following description, this molded body is referred to as a molded body of the conductive material in some cases.

The molded body of the conductive material is baked, whereby a baked body is formed (step S104). A furnace (also referred to as a baking furnace or a sintering furnace) is used in the step of baking. Baking is performed in an atmosphere containing one or more of a rare gas, a nitrogen gas, and an oxygen gas. In the following description, this baked body is referred to as a baked body of the conductive material in some cases.

The molded body of the conductive material is preferably baked at a temperature at which indium, zinc, and the element M2 (e.g., Ti, Ge, or the like), which are included in the conductive material, are combined with each other to form an oxide, e.g., at a temperature at which indium, zinc, and the element M2 react with each other by heat and are transformed into a compound different from the raw materials. For example, the molded body of the conductive material is baked at higher than or equal to 400° C. and lower than or equal to 2500° C., preferably higher than or equal to 900° C. and lower than or equal to 1900° C.

An oxide is formed in such a manner that the molded body of the conductive material is baked and indium, zinc, and the element M2, which are included in the conductive material, are combined with each other, whereby the second region 12 of the sputtering target 10 to be manufactured can include large amounts of indium, zinc, and the element M2.

Figure 2:
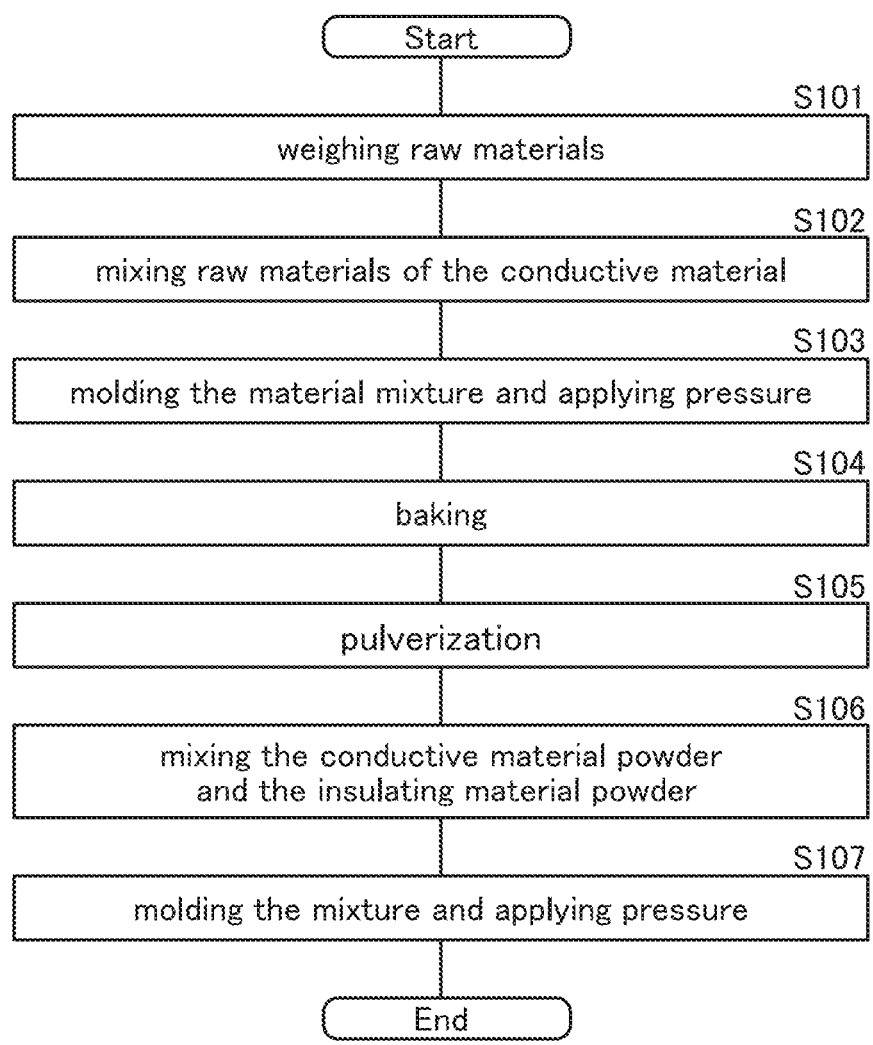
FIG. 2 is a flow chart illustrating a method for manufacturing a sputtering target.

The step S103 in which molding and application of pressure are performed and the step S104 in which baking is performed are separately performed in the method shown in the flow chart in FIG. 2; however, the method described in this embodiment is not limited thereto. For example, pressure may be applied with a pressing machine while the mixture spread over the mold is baked at a low temperature.

Next, the baked body of the conductive material is pulverized, so that a powder is formed (step S105). In the following description, this powder is referred to as a powder of the conductive material in some cases.

The powder of the conductive material and a powder of the insulating material are mixed and a mixture is formed (step S106). The powder of the insulating material refers to the raw materials of the insulating material weighed in the step S101.

The mixture of the powder of the conductive material and the powder of the insulating material is spread over a mold and molded (step S107). Pressure is applied to the mixture spread over the mold with a pressing machine or the like, whereby a molded body is formed. In the following description, this molded body is referred to as a molded body of the conductive material and the insulating material in some cases.

As shown in the flow chart in FIG. 2, the molded body of the conductive material and the insulating material is formed only by application of pressure without heat treatment at a high temperature, e.g., baking, whereby the conductive material and the insulating material can be prevented from being combined with each other. For example, indium can be prevented from being combined with the element M1 or the like. Thus, the first region 11 functioning as an insulating region and the second region 12 functioning as a conductive region can be provided separately in the sputtering target 10.

The mixed powder of indium oxide, zinc oxide, and the oxide of the element M2, which are to form the conductive material, is formed through the steps S102 to S105 in advance, so that the second region 12 functioning as a conductive region can include a large amount of the element M2.

As described above, when the element M2 having a valence larger than those of In and Zn is included in the second region 12 of the sputtering target 10, the element M2 serves as a carrier supply source, and the carrier density of the metal oxide deposited using the sputtering target 10 can be increased.

Next, finishing treatment is performed on the molded body of the conductive material and the insulating material, so that the sputtering target 10 is obtained. Specifically, the molded body of the conductive material and the insulating material is divided or grounded so as to adjust the length, the width, and the thickness. Furthermore, since abnormal discharge might occur when a surface of the molded body of the conductive material and the insulating material has minute unevenness, polishing treatment is performed on the surface. The polishing treatment is preferably performed by chemical mechanical polishing (CMP).

In the step S106 in which the powder of the conductive material and the powder of the insulating material are mixed, water and organic substances (a dispersing agent and a binder) may be further added to give slurry. When the powder of the conductive material and the powder of the insulating material are mixed to give slurry, the diameters of the first region 11 and the second region 12 in the sputtering target 10 can be further decreased. In the step S102, the raw materials of the conductive material may be mixed to give slurry in a similar manner.

In this case, one or more suction ports are provided at a bottom of the mold over which the slurry is spread for molding in the step S103 and water or the like is sucked therethrough. Furthermore, a filter is provided at the bottom of the mold, through which the powders of the raw materials of the conductive material do not pass but water and the organic substances pass. Specifically, a filter in which a porous resin film is attached over a woven fabric or a felt may be used.

In the step S103, water and the like is sucked from the slurry with the filter provided at the bottom of the mold, so that water and the organic substances are removed from the slurry and the molded body is formed.

Note that in the obtained molded body, water and the organic substances are slightly left; thus, drying treatment and a removal of the organic substances are performed. The drying treatment is preferably natural drying because the molded body is less likely to be cracked.

The sputtering target 10 is formed in such a manner that pressure is applied to the mixture of the powder of the conductive material and the powder of the insulating material in the above description; however, this embodiment is not limited thereto. For example, the sputtering target 10 may be formed in such a manner that the molded body formed by pressure application is baked at a low temperature to give a baked body. A furnace (also referred to as a baking furnace or a sintering furnace) is used in the step of baking. Baking is performed in an atmosphere containing one or more of a rare gas, a nitrogen gas, and an oxygen gas.

The molded body of the conductive material and the insulating material is preferably baked at a temperature at which the conductive material and the insulating material are not combined with each other, e.g., at a temperature at which indium is not combined with the element M1 or the like. Specifically, the molded body of the conductive material and the insulating material is preferably baked at a temperature at which the conductive material and the insulating material do not react with each other by heat and are not transformed into a compound different from the raw materials. For example, the molded body of the conductive material and the insulating material is baked at a temperature lower than the temperature at which the molded body of the conductive material is baked in the step S104. For example, the molded body of the conductive material and the insulating material is preferably baked at higher than or equal to 200° C. and lower than 1000° C.

The sputtering target 10 formed in such a manner that the molded body of the conductive material and the insulating material is baked at a low temperature can have a further improved strength.

In the case where the molded body of the conductive material and the insulating material is baked at a low temperature, an alloy including the conductive material and/or the insulating material is formed in part of the target in some cases.

In the case where slurry including the mixture is used as described above in manufacturing the sputtering target 10, water and the organic substances slightly left in the molded body of the conductive material and the insulating material can be removed by low-temperature baking.

The low-temperature baking is not necessarily performed in the step different from the step of molding and applying pressure in the step S107. For example, pressure may be applied with a pressing machine while the mixture spread over the mold is baked at a low temperature.

Next, a method for manufacturing the sputtering target 10, which is different from that shown in FIG. 2, is described with reference to the flow chart in FIG. 3. In the method for manufacturing the sputtering target 10 shown in FIG. 3, as the raw materials of the insulating material, two or more elements are selected from Al, Ga, Si, Mg, Zr, Be, and B, which can be used as the element M1. In the following description, the typical case is described where a powdery oxide of an element M1A (the element M1A is one or more kinds of elements selected from Al, Ga, Si, Mg, Zr, Be, and B) and a powdery oxide of an element M1B (the element M1B is one or more kinds of elements selected from Al, Ga, Si, Mg, Zr, Be, and B, and includes an element of different kind from the element M1A) are used.

Figure 3:
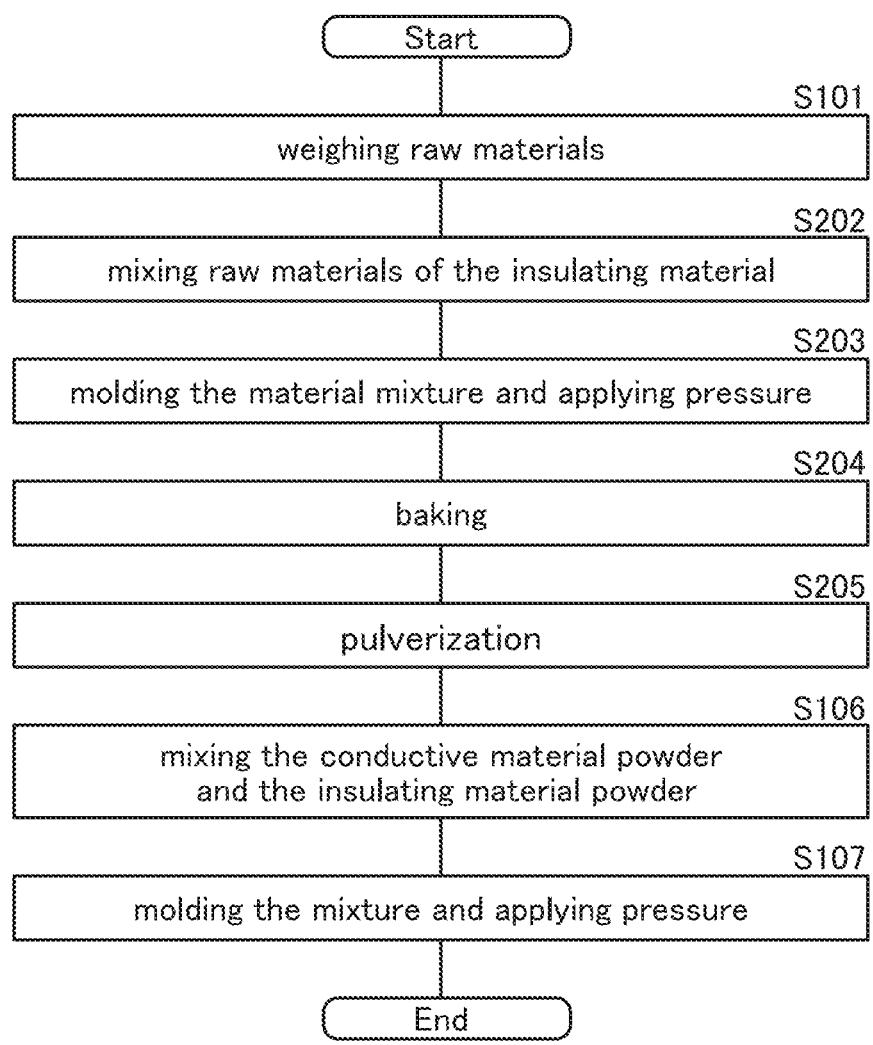
FIG. 3 is a flow chart illustrating a method for manufacturing a sputtering target.

The method for manufacturing the sputtering target 10 shown in FIG. 3 is different from the method for manufacturing the sputtering target 10 shown in FIG. 2 in that steps S202 to S205 are performed after the step S101 instead of the steps S102 to S105.

The raw materials of the conductive material and the raw materials of the insulating material are weighed in the step S101, and the weighed raw materials of the insulating material are mixed to form a mixture (step S202). For example, an oxide of the element M1A and an oxide of the element M1B are mixed and a mixture is formed. In the following description, this mixture is referred to as a mixture of the insulating material in some cases.

The mixture of the insulating material is spread over a mold and molded (step S203). Pressure is applied to the mixture spread over the mold with a pressing machine or the like, whereby a molded body is formed. In the following description, this molded body is referred to as a molded body of the insulating material in some cases.

The molded body of the insulating material is baked, whereby a baked body is formed (step S204). A furnace (also referred to as a baking furnace or a sintering furnace) is used in the step of baking. Baking is performed in an atmosphere containing one or more of a rare gas, a nitrogen gas, and an oxygen gas. In the following description, this baked body is referred to as a baked body of the insulating material in some cases.

The molded body of the insulating material is preferably baked at a temperature at which the element M1A and the element M1B (e.g., Al, Ga, Si, or the like), which are included in the insulating material, are combined with each other to form an oxide, e.g., at a temperature at which the element M1A and the element M1B react with each other by heat and are transformed into a compound different from the raw materials. For example, the molded body of the insulating material is baked at higher than or equal to 400° C. and lower than or equal to 2900° C., preferably higher than or equal to 900° C. and lower than or equal to 2100° C.

An oxide is formed in such a manner that the molded body of the insulating material is baked and the element M1A and the element M1B, which are included in the insulating material, are combined with each other, whereby the first region 11 of the sputtering target 10 to be manufactured can include large amounts of the element M1A and the element M1B.

The step S203 in which molding and application of pressure are performed and the step S204 in which baking is performed are separately performed in the method shown in the flow chart in FIG. 3; however, the method described in this embodiment is not limited thereto. For example, pressure may be applied with a pressing machine while the mixture spread over the mold is baked at a low temperature.

Next, the baked body of the insulating material is pulverized, so that a powder is formed (step S205). In the following description, this powder is referred to as a powder of the insulating material in some cases.

In the step S106, a powder of the conductive material (e.g., a powdery indium oxide and a powdery zinc oxide) and the powder of the insulating material formed in the step S205 are mixed and a mixture is formed. The powder of the conductive material refers to the raw materials of the conductive material weighed in the step S101. The following steps can be performed in a manner similar to those in the flow chart in FIG. 2.

As described above, the powder in which the oxide of the element M1A and the oxide of the element M1B, which are to form the insulating material, are mixed is formed through the steps S202 to S205 in advance, whereby two or more kinds of elements selected from Al, Ga, Si, Mg, Zr, Be, and B which can be used as the element M1 can be included in the first region 11 of the sputtering target. Thus, the energy gap of a region including the element M1 can be increased in a metal oxide film deposited using the sputtering target 10 in some cases.

Figure 4:
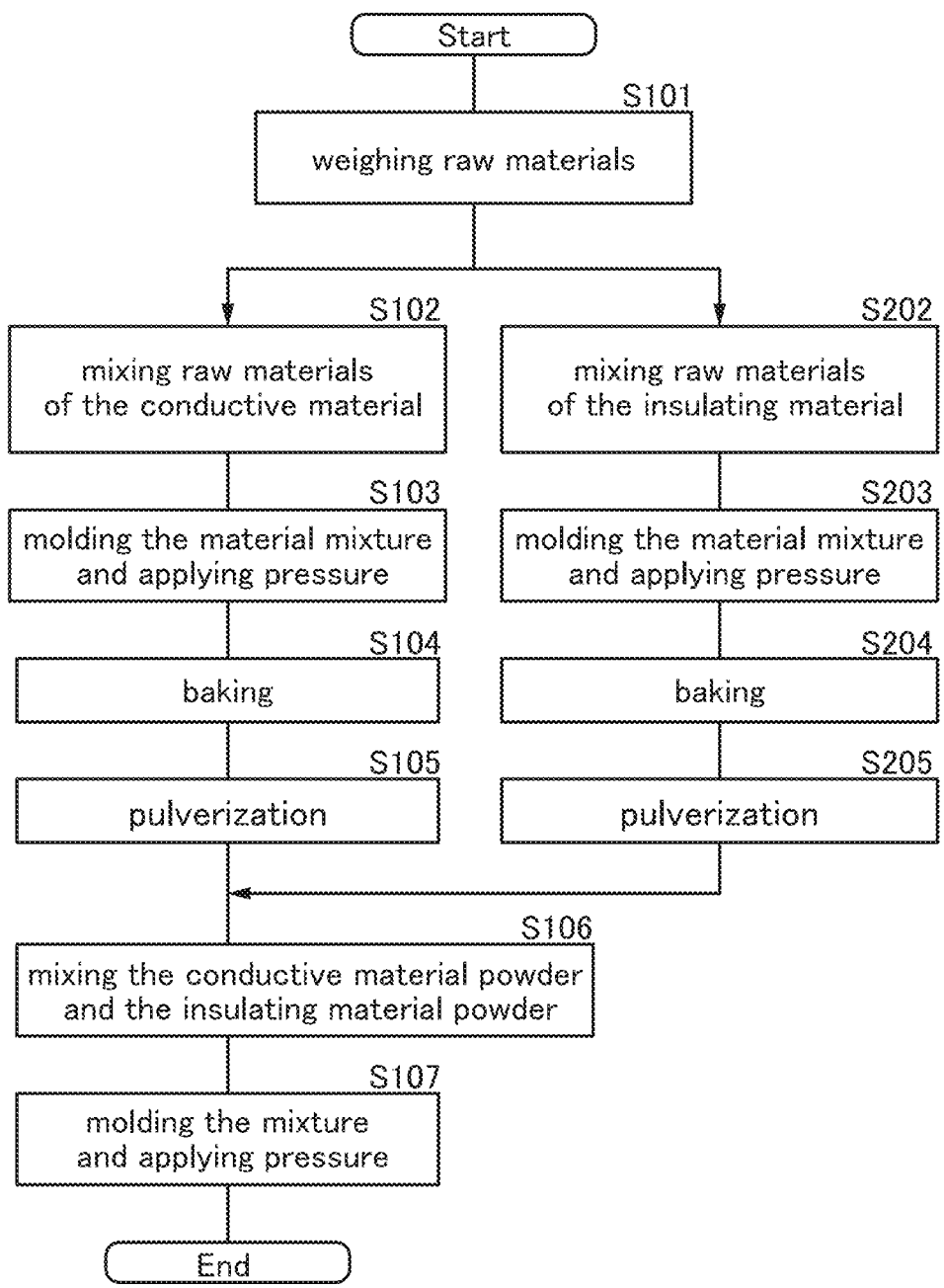
FIG. 4 is a flow chart illustrating a method for manufacturing a sputtering target.

Alternatively, as shown in FIG. 4, the steps S202 to S205 in FIG. 3 may be added to the method for manufacturing the sputtering target 10 shown in FIG. 2. In other words, the sequence of the steps S102 to S105 is performed in parallel with the sequence of the steps S202 to S205 after the step S101. Accordingly, the steps S101 to S107 are performed in a manner similar to those shown in FIG. 2 and the steps S202 to S205 are performed in a manner similar to those shown in FIG. 3. Note that either of the sequence of the steps S102 to S105 and the sequence of the steps S202 to S205 may be performed first.

The sputtering target 10 in which the first region 11 and the second region 12 each include zinc can be manufactured by a method similar to the manufacturing method shown in the flow chart in FIG. 4. An example in which the sputtering target 10 having an atomic ratio of [In]:[Ga]:[Zn]=4:2:4 is manufactured using Ga as the element M1 is described below with reference to FIG. 5. Note that in the manufacturing method described below, the kinds and the atomic ratio of elements are not limited to the above, and a target can be manufactured with appropriate kinds and an appropriate atomic ratio of elements by a similar method.

In weighing raw materials, powdery indium oxide, powdery gallium oxide, and powdery zinc oxide are prepared, and a method similar to that in the step S101 is employed. In order that the first region 11 and the second region 12 include zinc, a first zinc oxide to be included in the insulating material and a second zinc oxide to be included in the conductive material are separately weighed.

Thus, for example, the powdery indium oxide, the powdery gallium oxide, the powdery first zinc oxide, and the powdery second zinc oxide are weighed so that the atomic ratio of [In]:[Ga]:[Zn1]:[Zn2] is 4:2:2:2. Note that Zn1 refers to a first zinc and Zn2 refers to a second zinc.

Figure 5:
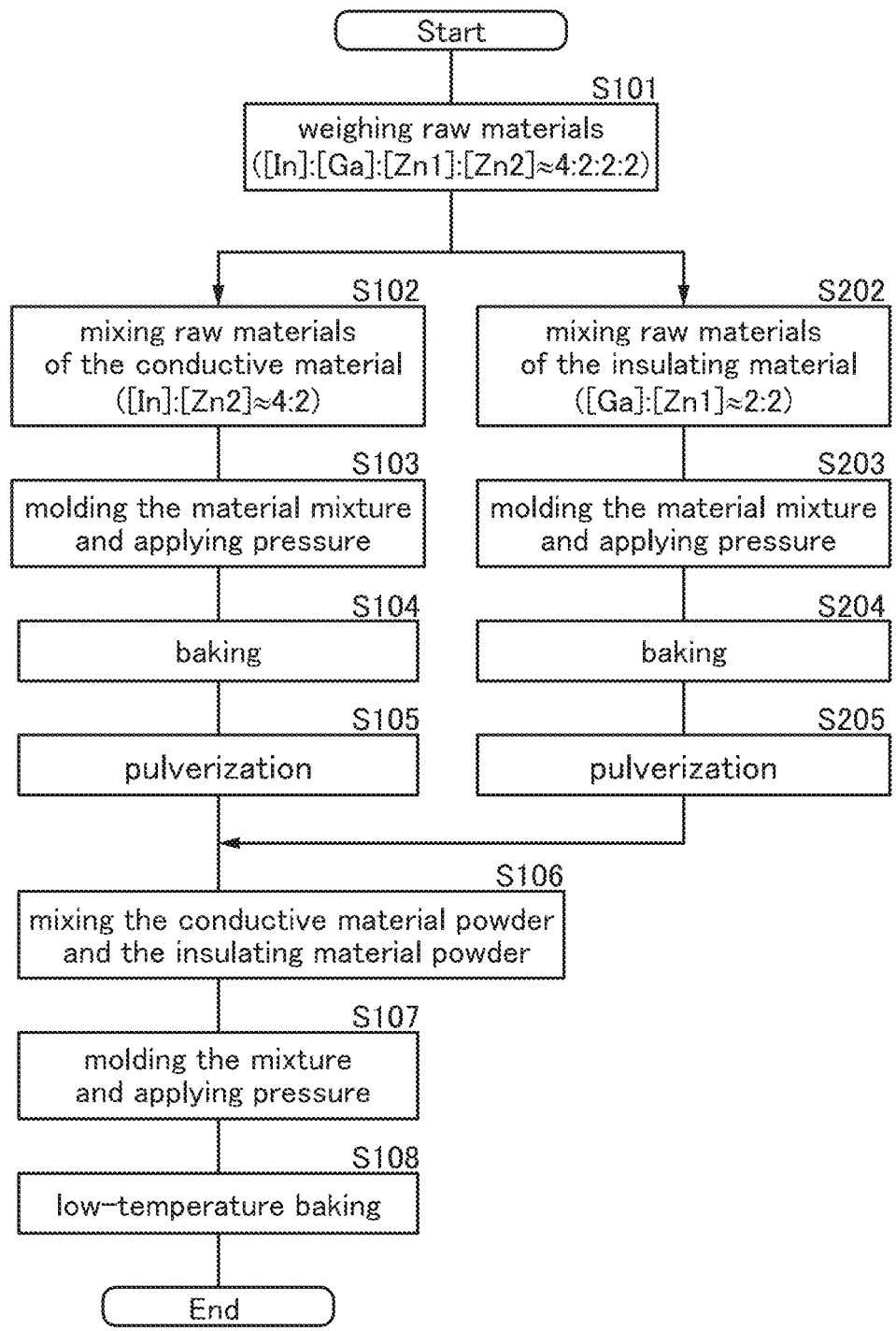
FIG. 5 is a flow chart illustrating a method for manufacturing a sputtering target.

The steps S102 to S105 shown in FIG. 5 are performed using the powdery indium oxide and the powdery second zinc oxide weighed in the step S101 in a manner similar to the steps S102 to S105 in the above example. In the step S102, the powdery indium oxide and the powdery second zinc oxide are mixed at an atomic ratio of [In]:[Zn2]=4:2, and a mixture is formed.

The example in which the powdery indium oxide and the powdery second zinc oxide are mixed at an atomic ratio of [In]:[Zn2]=4:2 as the raw materials of the conductive material is described above; however, the manufacturing method described in this embodiment is not limited to this example, and the amounts of the powdery indium oxide and the powdery second zinc oxide to be mixed are determined as appropriate. For example, by mixing at an atomic ratio of [In]:[Zn2]=4:2, the energy gap of a baked body formed from these raw materials of the conductive material is preferably adjusted to approximately 2.7 eV to 3.2 eV.

As shown in FIG. 2 and the like, the element M2 may be used as a raw material of the conductive material. For example, in the case where Ti, W, Sn, or the like is used as the element M2, powdery titanium oxide, powdery tungsten oxide, powdery tin oxide, or the like may be used. The content of the element M2 is preferably greater than or equal to 0.01 atomic % and less than or equal to 2 atomic %, further preferably greater than or equal to 0.1 atomic % and less than or equal to 0.5 atomic % with respect to the content of the element M1 (e.g., Ga). When the element M2 is included as an impurity in the mixture of the conductive material including the indium oxide and the second zinc oxide in this manner, the amount of change in the energy gap of the baked body formed from the mixture of the conductive material, which is caused by the element M2, is preferably 0.3 eV or less.

The above description can be referred to for the steps S103 to S105. In the case where a molded body of indium oxide and the second zinc oxide is baked in the step S104, the molded body is baked at higher than or equal to 400° C. and lower than or equal to 1700° C., preferably higher than or equal to 900° C. and lower than or equal to 1500° C. For example, the molded body is baked at approximately 1400° C.

The steps S202 to S205 shown in FIG. 5 are performed using the powdery gallium oxide and the powdery first zinc oxide weighed in the step S101 in a manner similar to the steps S202 to S205 in the above example. In the step S202, the powdery gallium oxide and the powdery first zinc oxide are mixed at an atomic ratio of [Ga]:[Zn1]=2:2, and a mixture is formed.

The example in which the powdery gallium oxide and the powdery first zinc oxide are mixed at an atomic ratio of [Ga]:[Zn1]=2:2 as the raw materials of the insulating material is described above; however, the manufacturing method described in this embodiment is not limited to this example. For example, the content of Zn1 is set to higher than or equal to 15 atomic % and lower than or equal to 85 atomic % with respect to the content of Zn1 and Ga. Thus, gallium oxide with an energy gap of approximately 5 eV and zinc oxide with an energy gap of approximately 3 eV are mixed, whereby the energy gap of a baked body formed from the raw materials of the insulating material can be adjusted.

The above description can be referred to for the steps S203 to S205. In the case where a molded body of gallium oxide and the first zinc oxide is baked in the step S204, the molded body is baked at higher than or equal to 400° C. and lower than or equal to 1700° C., preferably higher than or equal to 900° C. and lower than or equal to 1500° C. For example, the molded body is baked at approximately 1400° C.

Next, similarly to the step S106 in the above description, the powder of the conductive material formed in the step S105 and the powder of the insulating material formed in the step S205 are mixed in the step S106 in FIG. 5, whereby a mixture is formed.

Similarly to the step S107 in the above description, the mixture of the conductive material and the insulating material is spread over a mold and molded in the step S107 in FIG. 5.

Then, low-temperature baking is preferably performed as the step S108 in FIG. 5. A furnace (also referred to as a baking furnace or a sintering furnace) is used in the step of baking. Baking is performed in an atmosphere containing one or more of a rare gas, a nitrogen gas, and an oxygen gas.

The molded body of the conductive material and the insulating material is preferably baked at a temperature at which the conductive material and the insulating material are not combined with each other, e.g., at a temperature at which indium is not combined with the element M1 or the like. Specifically, the molded body of the conductive material and the insulating material is preferably baked at a temperature at which the conductive material and the insulating material do not react with each other by heat and are not transformed into a compound different from the raw materials. Accordingly, for example, the molded body of the conductive material and the insulating material is baked at a temperature lower than the baking temperatures in the steps S104 and S204. For example, the molded body of the conductive material and the insulating material is baked at a temperature lower than the baking temperatures in the steps S104 and S204 by approximately 200° C. to 300° C. Specifically, the molded body of the conductive material and the insulating material is preferably baked at higher than or equal to 200° C. and lower than 1200° C.

The sputtering target 10 formed in such a manner that the molded body of the conductive material and the insulating material is baked at a low temperature can have a further improved strength.

The low-temperature baking in the step S108 is not necessarily performed in the step different from the step of molding and applying pressure in the step S107. For example, pressure may be applied with a pressing machine while the mixture spread over the mold is baked at a low temperature.

In the case where the sputtering target 10 has strength high enough at the end of the step S107, the process may be terminated after the step S107 and the step S108 is not necessarily performed.

As shown in the flow chart in FIG. 5, the sputtering target 10 is manufactured in such a manner that high-heat treatment such as baking is not performed after the powder of the conductive material and the powder of the insulating material are individually formed by baking and pulverizing the raw materials of the conductive material and the raw materials of the insulating material. In this manner, the sputtering target 10 can be manufactured without combination of the conductive material and the insulating material, e.g., without combination of indium and the element M1 and the like. Thus, the first region 11 functioning as an insulating region and the second region 12 functioning as a conductive region can be provided separately in the sputtering target 10.

The powder in which indium oxide and the second zinc oxide, which are to form the conductive material, are mixed is formed through the steps S102 to S105 in advance, so that the second region 12 functioning as a conductive region can include indium and zinc at high proportions. Moreover, the powder in which gallium oxide and the first zinc oxide, which are to form the insulating material, are mixed is formed through the steps S202 to S205 in advance, so that the first region 11 functioning as an insulating region can include gallium and zinc at high proportions. In this manner, the first region 11 and the second region 12 in the sputtering target 10 can each include zinc at high proportion.

<Sputtering Apparatus>

Figure 6A:
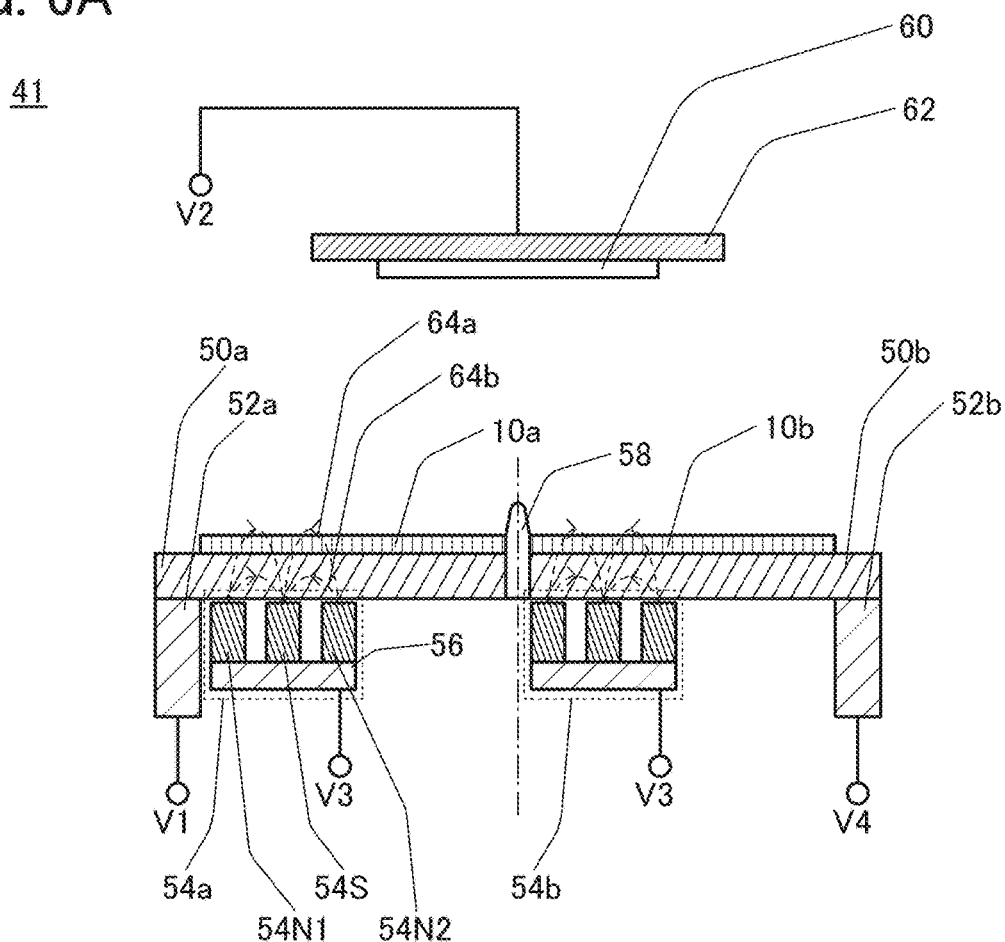
FIGS. 6A and 6B are schematic views illustrating a sputtering apparatus.
Figure 6B:
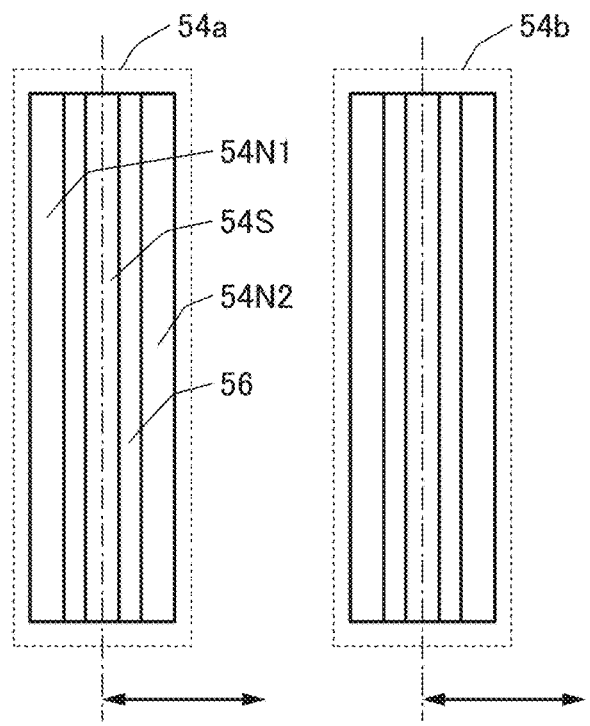

A sputtering apparatus in which the sputtering target 10 can be used is described with reference to FIGS. 6A and 6B. FIG. 6A is a cross-sectional view of a deposition chamber 41 of the sputtering apparatus. FIG. 6B is a plan view of a magnet unit 54a and a magnet unit 54b of the sputtering apparatus.

The deposition chamber 41 illustrated in FIG. 6A includes a target holder 52a, a target holder 52b, a backing plate 50a, a backing plate 50b, a sputtering target 10a, a sputtering target 10b, a member 58, and a substrate holder 62. Note that the sputtering target 10a is placed over the backing plate 50a. The backing plate 50a is placed over the target holder 52a. The magnet unit 54a is placed under the sputtering target 10a with the backing plate 50a therebetween. The sputtering target 10b is placed over the backing plate 50b. The backing plate 50b is placed over the target holder 52b. The magnet unit 54b is placed under the sputtering target 10b with the backing plate 50b therebetween.

As illustrated in FIGS. 6A and 6B, the magnet unit 54a includes a magnet 54N1, a magnet 54N2, a magnet 54S, and a magnet holder 56. The magnet 54N1, the magnet 54N2, and the magnet 54S are placed over the magnet holder 56 in the magnet unit 54a. The magnet 54N1, the magnet 54N2, and the magnet 54S are spaced. Note that the magnet unit 54b has a structure similar to that of the magnet unit 54a. When the substrate 60 is transferred into the deposition chamber 41, the substrate 60 is placed in contact with the substrate holder 62.

The sputtering target 10a, the backing plate 50a, and the target holder 52a are separated from the sputtering target 10b, the backing plate 50b, and the target holder 52b by the member 58. Note that the member 58 is preferably an insulator. The member 58 may be a conductor or a semiconductor. The member 58 may be a conductor or a semiconductor whose surface is covered with an insulator.

The target holder 52a and the backing plate 50a are fixed to each other with a screw (e.g., a bolt) and have the same potential. The target holder 52a has a function of supporting the sputtering target 10a with the backing plate 50a positioned therebetween. The target holder 52b and the backing plate 50b are fixed to each other with a screw (e.g., a bolt) and have the same potential. The target holder 52b has a function of supporting the sputtering target 10b with the backing plate 50b positioned therebetween.

The backing plate 50a has a function of fixing the sputtering target 10a. The backing plate 50b has a function of fixing the sputtering target 10b.

Magnetic lines of force 64a and 64b formed by the magnet unit 54a are illustrated in FIG. 6A.

As illustrated in FIG. 6B, the magnet unit 54a has a structure in which the magnet 54N1 having a rectangular or substantially rectangular shape, the magnet 54N2 having a rectangular or substantially rectangular shape, and the magnet 54S having a rectangular or substantially rectangular shape are fixed to the magnet holder 56. The magnet unit 54a can be oscillated horizontally as shown by an arrow in FIG. 6B. For example, the magnet unit 54a may be oscillated with a beat (also referred to as rhythm, pulse, frequency, period, cycle, or the like) of greater than or equal to 0.1 Hz and less than or equal to 1 kHz.

The magnetic field over the sputtering target 10a changes in accordance with oscillation of the magnet unit 54a. The region with an intense magnetic field is a high-density plasma region; thus, sputtering of the sputtering target 10a easily occurs in the vicinity of the region. The same applies to the magnet unit 54b.

An example in which a parallel-plate sputtering apparatus is used is illustrated in FIGS. 6A and 6B; however, a method for depositing a metal oxide according to this embodiment is not limited thereto. For example, a metal oxide may be deposited using a facing-target sputtering apparatus.

<Deposition Flow of Metal Oxide>

Next, a method for depositing a metal oxide using the sputtering target 10 is described. The method is divided into first to fourth steps.

The first step includes a step of placing a substrate in a deposition chamber.

For example, in the first step, the substrate 60 is placed on the substrate holder 62 of the deposition chamber 41 in FIG. 6A.

The temperature of the substrate 60 in deposition influences the electrical properties of a metal oxide. The higher the substrate temperature is, the higher the crystallinity and reliability of the metal oxide can be. In contrast, the lower the substrate temperature is, the lower the crystallinity of the metal oxide can be and the higher the carrier mobility thereof can be. In particular, the lower the substrate temperature in deposition is, the more the field-effect mobility at a low gate voltage (e.g., higher than 0 V and lower than or equal to 2 V) is notably increased in a transistor including the metal oxide.

The temperature of the substrate 60 is higher than or equal to room temperature (25° C.) and lower than or equal to 150° C., preferably higher than or equal to room temperature and lower than or equal to 130° C. Setting the substrate temperature in the above range is favorable for large glass substrates (e.g., 8th- to 10th-generation glass substrates). In particular, when the substrate temperature in deposition of a metal oxide is room temperature, i.e., the substrate is not heated intentionally, the substrate can be favorably prevented from bending or warping.

The substrate 60 may be cooled with a cooling mechanism or the like provided for the substrate holder 62.

When the temperature of the substrate 60 is higher than or equal to 100° C. and lower than or equal to 150° C., water attached to the metal oxide can be removed. Water that is an impurity is removed in this manner, whereby the field-effect mobility and the reliability can be improved at the same time.

The temperature of the substrate 60 is set to higher than or equal to 100° C. and lower than or equal to 150° C. for removal of water, whereby the sputtering apparatus can be prevented from warping due to overheat. For example, a large substrate like a 10th-generation substrate has a substrate temperature limit in accordance with its size. Accordingly, the substrate temperature is set as appropriate to a temperature which is higher than the evaporation temperature of water (100° C.) and maximizes the maintainability and throughput of the apparatus to the extent possible. This leads to an improvement in productivity of a semiconductor device. The productivity is stabilized, so that a large-scale production apparatus is easy to employ. Thus, a large display device manufactured using a large substrate can be easily manufactured.

When deposition is performed at a temperature of the substrate 60 of higher than or equal to room temperature and lower than or equal to 150° C., the shallow defect states (sDOS) in the metal oxide can be reduced.

The second step includes a step of introducing gas into the deposition chamber.

In the second step, for example, gas is introduced into the deposition chamber 41 in FIG. 6A. One or more of an argon gas, an oxygen gas, and a nitrogen gas are introduced as the gas. An inert gas such as helium, xenon, or krypton may be used instead of the argon gas.

In the case where a metal oxide is deposited using an oxygen gas, the smaller the oxygen flow rate ratio is, the higher the carrier mobility of the metal oxide can be. Specifically, in a transistor including the metal oxide, the smaller the oxygen flow rate ratio is, the more notably the field-effect mobility at a low gate voltage (e.g., higher than 0 V and lower than or equal to 2 V) is increased.

The oxygen flow rate ratio can be set as appropriate in a range of 0% to 30% for favorable characteristics in accordance with usage of the metal oxide. At this time, for example, the deposition gas can be a mixed gas of an argon gas and an oxygen gas. Furthermore, the deposition gas containing an oxygen gas can reduce the amount of oxygen vacancies in a metal oxide to be deposited. Thus, reduction in the amount of oxygen vacancies can improve the reliability of the metal oxide.

For example, in the case where the metal oxide is used for a semiconductor layer of a transistor having high field-effect mobility, the oxygen flow rate ratio is set to higher than or equal to 0% and lower than or equal to 30%, preferably higher than or equal to 5% and lower than or equal to 20% in deposition of the metal oxide.

Even when the sputtering target 10 does not include nitrogen, a metal oxide including nitrogen can be deposited using a deposition gas including a nitrogen gas. In the case where a metal oxide including nitrogen is deposited by adding a nitrogen gas, the nitrogen flow rate ratio is increased so that the metal oxide can include a sufficient amount of nitrogen, which results in high carrier mobility.

The nitrogen flow rate ratio can be set as appropriate in a range of 10% to 100% for favorable characteristics in accordance with usage of the metal oxide including nitrogen. At this time, for example, the deposition gas can be a mixed gas of a nitrogen gas and an argon gas. The deposition gas may be a mixed gas of a nitrogen gas and an oxygen gas or a mixed gas of a nitrogen gas, an oxygen gas, and an argon gas.

Furthermore, in the case where the deposition gas includes a nitrogen gas, sites corresponding to the oxygen vacancies in the metal oxide including nitrogen to be deposited can be filled by nitrogen and the amount of oxygen vacancies in the metal oxide including nitrogen can be reduced. At this time, in the case where an element that can be strongly bonded to oxygen, such as silicon or aluminum, is used as the element M1 included in the sputtering target 10, sites corresponding to the oxygen vacancies in the metal oxide including nitrogen can be filled by the element M1. This enables reduction of the amount of the oxygen vacancies in the metal oxide including nitrogen even when a deposition gas includes a reduced amount of oxygen or a deposition gas does not include oxygen. In addition, reduction in the amount of oxygen in the metal oxide including nitrogen and increase in the amount of nitrogen can improve the carrier mobility of the metal oxide including nitrogen.

In the case where an oxygen gas is used as a deposition gas in sputtering, the oxygen gas is negatively ionized and the ionized oxygen collides with the metal oxide during deposition. This might damage the metal oxide. In contrast to this, when the deposition gas including a reduced amount of oxygen or the deposition gas without oxygen is used as described above, damage to the metal oxide can be prevented.

In the case where a target including nitrogen is used as the sputtering target 10, even a deposition gas including no nitrogen can be used to deposit a metal oxide including nitrogen.

In addition, increasing the purity of a sputtering gas is necessary. For example, as an oxygen gas, a nitrogen gas, or an argon gas used for a sputtering gas, a gas which is highly purified to have a dew point of −40° C. or lower, preferably −80° C. or lower, further preferably −100° C. or lower, or still further preferably −120° C. or lower is used, whereby entry of moisture and the like into the metal oxide can be minimized.

The deposition chamber 41 is preferably evacuated to high vacuum (about $5\times10^{-7}$ Pa to $1\times10^{-4}$ Pa) with an entrapment vacuum evacuation pump such as a cryopump so that water or the like, which is an impurity for the metal oxide, is removed as much as possible.

Alternatively, a turbo molecular pump and a cold trap are preferably combined so as to prevent a backflow of a gas, especially a gas including carbon or hydrogen from an exhaust system to the inside of the chamber. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa. In addition, the partial pressure of gas molecules corresponding to $H_2O$ (gas molecules corresponding to m/z=18) in the chamber in discharge of the sputtering apparatus is preferably lower than or equal to $5\times10^{-5}$ Pa, further preferably lower than or equal to $1\times10^{-5}$ Pa. Entry of impurities into the metal oxide is reduced in this manner, whereby a highly reliable transistor can be obtained.

Thus, the metal oxide in which water, hydrogen, or the like is reduced includes a small amount of carriers due to hydrogen, so that the carrier density is low. However, the metal oxide deposited using the sputtering target 10 includes the element M2 (e.g., one or more kinds of elements selected from Ti, Ge, Sn, V, Ni, Mo, W, and Ta) serving as a carrier supply source, and thus can have a high carrier density even with a small amount of carriers due to hydrogen. The element M2 typified by Ti has a gettering effect on hydrogen, so that the amount of hydrogen serving as a carrier can be reduced and the reliability of a transistor can be improved.

The third step includes a step of applying voltage to the sputtering target 10.

In the third step, for example, voltage is applied to the target holder 52a and the target holder 52b in FIG. 6A. As an example, a potential applied to a terminal V1 connected to the target holder 52a is lower than a potential applied to a terminal V2 connected to the substrate holder 62. A potential applied to a terminal V4 connected to the target holder 52b is lower than the potential applied to the terminal V2 connected to the substrate holder 62. The potential applied to the terminal V2 connected to the substrate holder 62 is a ground potential. A potential applied to a terminal V3 connected to the magnet holder 56 is a ground potential.

Note that the potentials applied to the terminals V1, V2, V3, and V4 are not limited to the above-described potentials. Not all the target holder 52, the substrate holder 62, and the magnet holder 56 are necessarily supplied with potentials. For example, the substrate holder 62 may be electrically floating. Note that it is assumed that a power source capable of controlling a potential applied to the terminal V1 is electrically connected to the terminal V1. As the power source, a DC power source, an AC power source, or an RF power source may be used.

The fourth step includes a step of depositing the metal oxide on the substrate from the sputtering target 10.

In the fourth step, for example, in the deposition chamber 41 illustrated in FIG. 6A, an argon gas, a nitrogen gas, or an oxygen gas is ionized to be separated into cations and electrons, and plasma is created. Then, the cations in the plasma are accelerated toward the sputtering targets 10a and 10b by the potentials applied to the target holders 52a and 52b. Sputtered particles are generated when the cations collide with the sputtering targets 10a and 10b, and the sputtered particles are deposited on the substrate 60.

FIG. 1B is a schematic view of the vicinity of the sputtering target 10 during deposition of a metal oxide film. In FIG. 1B, the sputtering target 10, plasma 30, a cation 20, first sputtered particles 11a, and second sputtered particles 12a are illustrated.

In FIG. 1B, an argon gas, an oxygen gas, or a nitrogen gas is ionized and separated into the cation 20 and an electron (not illustrated), and the plasma 30 is created. After that, the cation 20 in the plasma 30 is accelerated toward the sputtering target 10. The cation 20 collides with the sputtering target 10, whereby the first sputtered particles 11a and the second sputtered particles 12a are generated and ejected from the sputtering target 10. Since the first sputtered particles 11a are ejected from the first region 11, a cluster including a large amount of one or more kinds selected from the element M1 (e.g., gallium, aluminum, or silicon) and zinc is formed in some cases. Since the second sputtered particles 12a are ejected from the second region 12, a cluster including a large amount of one or more kinds selected from indium, zinc, and the element M2 is formed in some cases.

The first sputtered particles 11a ejected from the first region 11 including the insulating material and the second sputtered particles 12a ejected from the second region 12 including the conductive material are individually deposited on a substrate. A region including the first sputtered particles 11a and having relatively low conductivity and a region including the second sputtered particles 12a and having relatively high conductivity are unevenly formed on the substrate.

Figure 7:
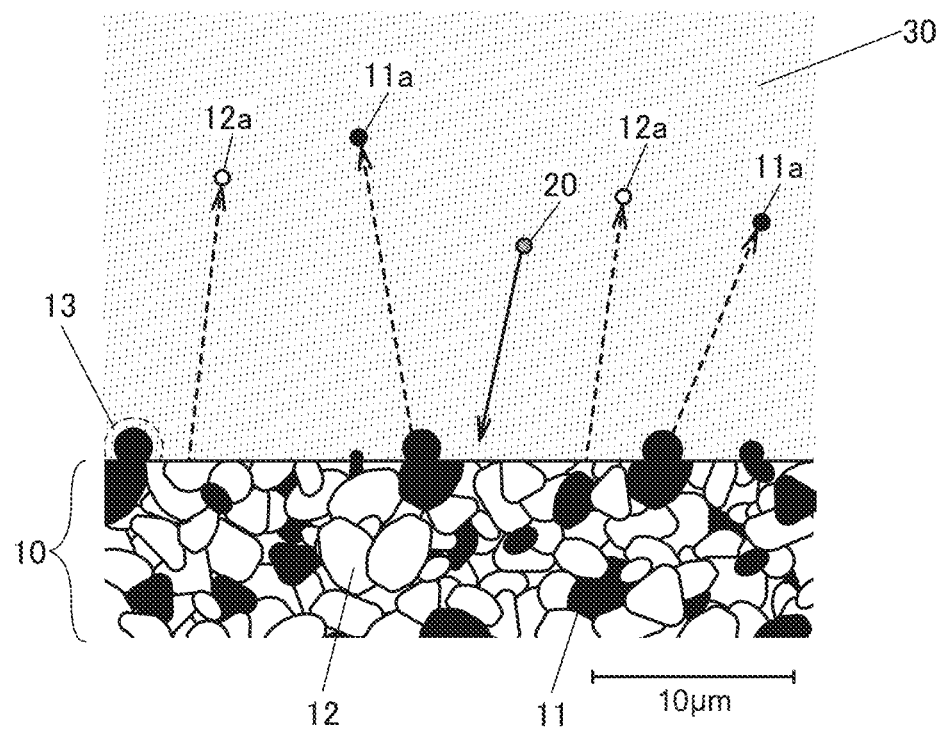
FIG. 7 is a schematic view illustrating deposition using a sputtering target according to one embodiment of the present invention.

In the case where gallium is used as the element M1, a precipitation portion 13 is formed on the upper surface of the sputtering target 10 in some cases as illustrated in FIG. 7. The precipitation portion 13 is formed mainly of gallium included in the first region 11, and has a spherical form or a granular form due to surface tension in some cases. The atomic ratio of gallium included in the precipitation portion 13 is higher than the atomic ratio of gallium included in the first region 11 in some cases. Furthermore, zinc, zinc oxide, or the like is formed to cover the surface of the precipitation portion 13 in some cases.

When the cation 20 typified by an argon ion or the like collides with the first region 11 exposed on the upper surface of the sputtering target 10, oxygen is released from the first region 11, and elemental gallium, elemental zinc, or the like is formed on the surface of the sputtering target 10. Since elemental gallium has a melting point of as low as approximately 30° C., the formed elemental gallium is melted due to heat generated by sputtering. Melted gallium aggregates owing to surface tension to form the spherical or granular precipitation portion 13.

The solid-solution range of zinc with respect to gallium in the vicinity of the melting point of elemental gallium is approximately 1 atomic %. Because of this, zinc rarely exists inside the precipitation portion 13, and zinc, zinc oxide, or the like is formed to cover the surface of the precipitation portion 13 in some cases.

The first sputtered particle 11a ejected from the precipitation portion 13 includes a larger amount of gallium than the first sputtered particle 11a ejected from the first region 11 in many cases. Accordingly, the amount of gallium included in a region including the first sputtered particle 11a, which is formed on the substrate by sputtering, is increased. Thus, a region including the first sputtered particle 11a and having relatively low conductivity includes a large amount of gallium, whereby the region can be more distinctively separated from a region including the second sputtered particle 12a and having relatively high conductivity. Zinc also exists on the surface of the precipitation portion 13, so that zinc also exists in the vicinity of the region including the first sputtered particles 11a on the substrate.

At this time, a high electric power is preferably applied to a terminal of a deposition chamber of a sputtering apparatus. For example, an electric power of 2.5 kW or higher, specifically, an electric power of approximately 4.5 kW is preferably applied. A larger sputtering power enables the precipitation portion 13 to be formed on a larger scale; accordingly, the region including the first sputtered particle 11a and having relatively low conductivity and the region including the second sputtered particle 12a and having relatively high conductivity can be more distinctively separated. A transistor including such a metal oxide film can have improved field-effect mobility.

Next, a metal oxide deposited using the sputtering target is described.

The metal oxide deposited using the sputtering target preferably includes at least In. In particular, In and Zn are preferably included. The metal oxide deposited using the sputtering target preferably includes, in addition to In and Zn, the element M1 (the element M1 is one or more kinds of elements selected from Al, Ga, Si, Mg, Zr, Be, and B), and further preferably includes the element M2 (the element M2 is one or more kinds of elements selected from Ti, Ge, Sn, V, Ni, Mo, W, and Ta). As the element M1, Ga is preferably used. As the element M2, Ti or Ge is preferably used.

For example, an In—Ga—Zn oxide, an In—Ga—Ti—Zn oxide, and an In—Ga—Ge—Zn oxide are given as the metal oxide deposited using the sputtering target.

The metal oxide deposited using the sputtering target includes a plurality of components.

The metal oxide deposited using the sputtering target includes a first component and a second component. The first component includes an M1 oxide (the M1 is one or more kinds of elements selected from Al, Ga, Si, Mg, Zr, Be, and B), an M1-Zn oxide, an In—M1-Zn oxide, or an In-M1-M2-Zn oxide (the M2 is one or more kinds of elements selected from Ti, Ge, Sn, V, Ni, Mo, W, and Ta). The second component includes an In oxide, a Zn oxide, an In—Zn oxide, an In-M2 oxide, or an In-M2-Zn oxide.

When the element M1 is Al or Si, the M1 oxide may be replaced with an M1 nitride. Specifically, the M1 oxide may be replaced with aluminum nitride or silicon nitride.

The first component and the second component are preferably mixed in a region. The first component preferably accounts for 1 atomic % to 50 atomic % of the metal oxide. The second component preferably accounts for 0.01 atomic % to 5 atomic % of the metal oxide.

The metal oxide deposited using the sputtering target includes a plurality of components, and thus has a plurality of energy gaps. Specifically, the metal oxide deposited using the sputtering target has energy levels of conduction band minimums of energy bands. Note that the term "a plurality of components" may be replaced with the term "a plurality of regions".

In other words, the metal oxide deposited using the sputtering target includes a first region and a second region. The first region has a high energy level of the conduction band minimum of the energy band. The second region has a lower energy level of the conduction band minimum of the energy band than the first region. The second region includes a larger amount of carriers than the first region. The difference between the energy level of the conduction band minimum of the first region and the energy level of the conduction band minimum of the second region is 0.2 eV or more.

A composition in which the metal oxide includes In, the element M1, the element M2, and Zn is described with reference to FIG. 8.

<Composition of Metal Oxide>

Figure 8:
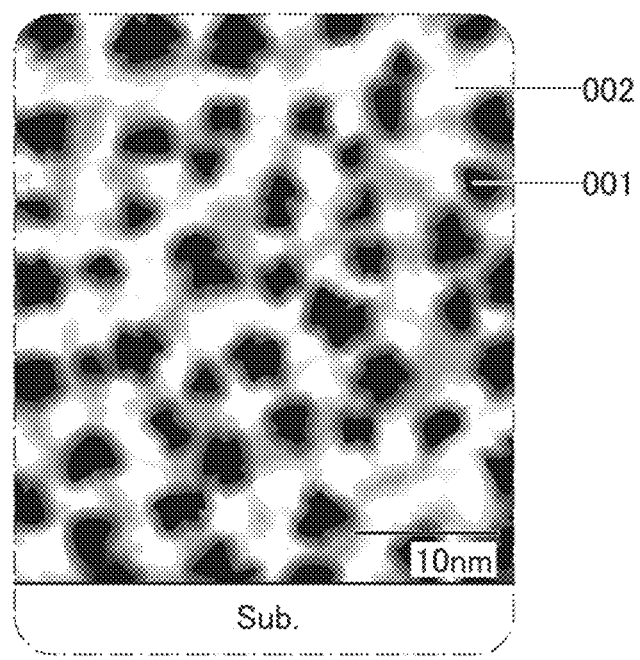
FIG. 8 is a conceptual view illustrating a composition of a metal oxide.

FIG. 8 is a conceptual view of a metal oxide having a cloud-aligned composite (CAC) composition in one embodiment of the present invention. In this specification, a metal oxide which is one embodiment of the present invention and has a semiconductor function is defined as a cloud-aligned composite oxide semiconductor (CAC-OS) or a CAC-metal oxide.

The CAC-OS or the CAC-metal oxide is referred to as a matrix composite or a metal matrix composite in some cases. Accordingly, the CAC-OS may be referred to as a cloud-aligned composite-OS.

For example, in the CAC-OS, as illustrated in FIG. 8, elements included in the metal oxide are unevenly distributed, and regions 001 mainly including an element and regions 002 mainly including another element are formed. The regions 001 and 002 are mixed to form a mosaic pattern. In other words, the CAC-OS has a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size of greater than or equal to 0.5 nm and less than or equal to 10 nm, preferably greater than or equal to 1 nm and less than or equal to 2 nm, or a similar size.

For example, an In-M1-M2-Zn oxide with the CAC composition has a composition in which materials are separated into an In oxide ($InO_{X1}$, where X1 is a real number greater than 0), an In—Zn oxide ($In_{X2}Zn_{Y2}O_{Z2}$, where X2, Y2, and Z2 are real numbers greater than 0), or an In-M2-Zn oxide ($In_{W3}M2_{X3}Zn_{Y3}O_{Z3}$, where W3, X3, Y3, and Z3 are real numbers greater than 0), and an oxide including the element M1, and a mosaic pattern is formed. Then, $InO_{X1}$, $In_{X2}Zn_{Y2}O_{Z2}$, or $In_{W3}M2_{X3}Zn_{Y3}O_{Z3}$, and the oxide including the element M1 forming the mosaic pattern are distributed in the film. This composition is also referred to as a cloud-like composition.

In other words, the metal oxide of one embodiment of the present invention includes at least two oxides or components selected from an In oxide, an In—Zn oxide, an In-M1 oxide, an In-M1-Zn oxide, an M1-Zn oxide, an M1-M2 oxide, an M2 oxide, an In-M2 oxide, an In-M2-Zn oxide, an M2-Zn oxide, and an In-M1-M2-Zn oxide. In particular, when two or more oxides are included, the oxides are preferably selected from each of a group of oxides including In and oxides including In and the element M2 and a group of oxides including the element M1.

In the case where the element M1 is Ga and the element M2 is Ti, the metal oxide of one embodiment of the present invention includes at least two oxides selected from an In oxide, an In—Zn oxide, a Ga—Ti oxide, an In—Ga oxide, an In—Ga—Zn oxide, a Ga—Zn oxide, a Ti oxide, an In—Ti oxide, an In—Ti—Zn oxide, a Ti—Zn oxide, and an In—Ti—Ga—Zn oxide. In particular, the metal oxide of one embodiment of the present invention may be an In—Ga—Ti—Zn oxide in which an oxide including Ga, an oxide including Ti, and an oxide including Zn of the above oxides are combined.

In the case where the element M1 is Ga and the element M2 is Ge, the metal oxide of one embodiment of the present invention includes at least two oxides selected from an In oxide, an In—Zn oxide, a Ga—Ge oxide, an In—Ga oxide, an In—Ga—Zn oxide, a Ga—Zn oxide, a Ge oxide, an In—Ge oxide, an In—Ge—Zn oxide, a Ge—Zn oxide, and an In—Ga—Ge—Zn oxide. In particular, the metal oxide of one embodiment of the present invention may be an In—Ga—Ge—Zn oxide in which an oxide including Ga, an oxide including Ge, and an oxide including Zn of the above oxides are combined.

A composition in which the element M1 is Ga and the element M2 is not included may be employed. In this case, the metal oxide of one embodiment of the present invention includes at least two oxides selected from an In oxide, an In—Zn oxide, a Ga oxide, an In—Ga oxide, an In—Ga—Zn oxide, a Ga—Zn oxide, and a Zn oxide.

That is, the metal oxide of one embodiment of the present invention can be referred to as a composite material including a plurality of materials or a plurality of components.

Here, let a concept in FIG. 8 illustrate an In-M1-M2-Zn oxide with the CAC composition. In this case, it can be said that the region 001 is a region including an oxide including the element M1 as a main component and the region 002 is a region including $InO_{X1}$, $In_{X2}Zn_{Y2}O_{Z2}$, or $In_{W3}M2_{X3}Zn_{Y3}O_{Z3}$ as a main component. Surrounding portions of the region 001 and the region 002 are unclear (blurred), so that boundaries of the region 001 and the region 002 are not clearly observed in some cases.

In other words, an In-M1-M2-Zn oxide with the CAC composition is a metal oxide in which a region including an oxide including the element M1 as a main component and a region including $InO_{X1}$, $In_{X2}Zn_{Y2}O_{Z2}$, or $In_{W3}M2_{X3}Zn_{Y3}O_{Z3}$ as a main component are mixed. Accordingly, the metal oxide is referred to as a composite metal oxide in some cases.

The region 001 preferably additionally includes zinc. In this case, both the region 001 and the region 002 include zinc. Furthermore, it is preferable that zinc be also included in a region between the region 001 and the region 002 (for example, such a region corresponds to a gray region in FIG. 8 and also includes the unclear region in the surrounding portions of the region 001 and the region 002). Zinc spreads in a cloud-like manner in the metal oxide, and the region 001 and the region 002 can be said to be connected to each other through a region including zinc. Note that the atomic ratio of zinc included in the region between the region 001 and the region 002 is sometimes higher than the atomic ratio of zinc included in the region 001 or the region 002.

In the In-M1-M2-Zn oxide with the CAC composition, crystal structures of the region 001 and the region 002 are not particularly limited. The region 001 and the region 002 may have different crystal structures.

For example, the In-M1-M2-Zn oxide with the CAC composition is preferably an oxide semiconductor having a non-single-crystal structure. Examples of a non-single-crystal oxide semiconductor include a CAAC-OS, a polycrystalline oxide semiconductor, a nanocrystalline oxide semiconductor (nc-OS), an amorphous-like oxide semiconductor (a-like OS), and an amorphous oxide semiconductor.

The CAAC-OS has a CAAC structure. An oxide semiconductor having a CAAC structure has c-axis alignment, its nanocrystals are connected in the a-b plane direction, and the crystal structure has distortion. Note that the distortion is a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Accordingly, in the CAAC-OS, a grain boundary cannot be clearly observed also in the vicinity of the distortion. That is, formation of a grain boundary is inhibited due to the distortion of lattice arrangement. This is probably because the CAAC-OS can tolerate distortion owing to a low density of the atomic arrangement in the a-b plane direction, the interatomic bond distance changed by substitution of a metal element, and the like.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

The a-like OS has a structure between those of the nc-OS and the amorphous oxide semiconductor. The a-like OS includes a void or a low-density region. That is, the a-like OS has an unstable structure, compared to the nc-OS and the CAAC-OS.

The case where the metal oxide of one embodiment of the present invention is an In—Ga—Ti—Zn oxide is described. Materials are separated into $InO_{X1}$, $In_{X2}Zn_{Y2}O_{Z2}$, or $In_{W3}Ti_{X3}Zn_{Y3}O_{Z3}$, and $In_aGa_bTi_cZn_dO_e$ (a, b, c, d, and e are real numbers greater than 0), and a mosaic pattern is formed.

In other words, an In—Ga—Ti—Zn oxide including a CAC-OS is a composite metal oxide having a composition in which a region including $In_aGa_bTi_cZn_dO_e$ as a main component and a region including $InO_{X1}$, $In_{X2}Zn_{Y2}O_{Z2}$, or $In_{W3}Ti_{X3}Zn_{Y3}O_{Z3}$ as a main component are mixed. Surrounding portions of the region including $In_aGa_bTi_cZn_dO_e$ as a main component and the region including $InO_{X1}$, $In_{X2}Zn_{Y2}O_{Z2}$, or $In_{W3}Ti_{X3}Zn_{Y3}O_{Z3}$ as a main component are unclear (blurred), so that a boundary is not clearly observed in some cases.

For example, in the conceptual view in FIG. 8, the region 001 corresponds to the region including $In_aGa_bTi_cZn_dO_e$ as a main component, and the region 002 corresponds to the region including $InO_{X1}$, $In_{X2}Zn_{Y2}O_{Z2}$, or $In_{W3}Ti_{X3}Zn_{Y3}O_{Z3}$ as a main component. The region including $In_aGa_bTi_cZn_dO_e$ as a main component and the region including $InO_{X1}$, $In_{X2}Zn_{Y2}O_{Z2}$, or $In_{W3}Ti_{X3}Zn_{Y3}O_{Z3}$ as a main component may each be referred to as a nanoparticle. The diameter of the nanoparticle is greater than or equal to 0.5 nm and less than or equal to 10 nm, typically greater than or equal to 1 nm and less than or equal to 2 nm. Surrounding portions of the nanoparticles are unclear (blurred), so that a boundary is not clearly observed in some cases.

The sizes of the region 001 and the region 002 can be measured with energy dispersive X-ray spectroscopy (EDX) mapping images obtained by EDX. For example, the diameter of the region 001 is greater than or equal to 0.5 nm and less than or equal to 10 nm, or greater than or equal to 1 nm and less than or equal to 2 nm in the EDX mapping image of a cross-sectional photograph in some cases. The density of an element which is a main component is gradually lowered from the central portion of the region toward the surrounding portion. For example, when the number (abundance) of atoms of an element countable in an EDX mapping image gradually changes from the central portion toward the surrounding portion, the surrounding portion of the region is unclear (blurred) in the EDX mapping of the cross-sectional photograph. For example, from the central portion toward the surrounding portion in the region including $In_aGa_bTi_cZn_dO_e$ as a main component, the number of Ga atoms gradually reduces and the numbers of In atoms, Ti atoms, and Zn atoms gradually increase, so that the region including $In_{W3}Ti_{X3}Zn_{Y3}O_{Z3}$ as a main component gradually appears. Accordingly, the surrounding portion of the region including $In_{W3}Ti_{X3}Zn_{Y3}O_{Z3}$ as a main component is unclear (blurred) in the EDX mapping image.

A crystal structure of the In—Ga—Ti—Zn oxide with the CAC composition is not particularly limited. The region 001 and the region 002 may have different crystal structures. For example, the In—Ga—Ti—Zn oxide with the CAC composition is preferably an oxide semiconductor having a non-single-crystal structure.

The crystallinity of the In—Ga—Ti—Zn oxide including a CAC-OS can be analyzed by electron diffraction. For example, in analysis of the In—Ga—Ti—Zn oxide by electron diffraction, a region with high luminance in a ring pattern and a plurality of spots in the region with high luminance in a ring pattern are observed in some cases in an electron diffraction pattern image.

In analysis of the crystallinity of the CAC-OS, in some cases, different patterns are observed in accordance with the diameter of an electron beam, i.e., the area of a region observed. For example, nanobeam electron diffraction (NBED) with an electron beam having a diameter of 1 nm to 100 nm inclusive is preferably employed in analysis of the crystallinity of the CAC-OS.

The carrier density of the region including $InO_{X1}$, $In_{X2}Zn_{Y2}O_{Z2}$, or $In_{W3}Ti_{X3}Zn_{Y3}O_{Z3}$ as a main component (the region 002 in FIG. 8) is higher than that of the region including $In_aGa_bTi_cZn_dO_e$ as a main component (the region 001 in FIG. 8). In other words, when carriers flow through the regions including $InO_{X1}$, $In_{X2}Zn_{Y2}O_{Z2}$, or $In_{W3}Ti_{X3}Zn_{Y3}O_{Z3}$ as a main component, the conductivity of a metal oxide is exhibited. Accordingly, when the regions including $InO_{X1}$, $In_{X2}Zn_{Y2}O_{Z2}$, or $In_{W3}Ti_{X3}Zn_{Y3}O_{Z3}$ as a main component are distributed in a metal oxide like a cloud, high field-effect mobility ($\mu$) can be achieved. The region including $InO_{X1}$, $In_{X2}Zn_{Y2}O_{Z2}$, $In_{W3}Ti_{X3}Zn_{Y3}O_{Z3}$, or the like as a main component can be said to be a semiconductor region whose properties are close to those of a conductor.

In contrast, the carrier density of the region including InaGabTicZna0, or the like as a main component is lower than that of the region including $InO_{X1}$, $In_{X2}Zn_{Y2}O_{Z2}$, or $In_{W3}Ti_{X3}Zn_{Y3}O_{Z3}$ as a main component. In other words, when the regions including $In_aGa_bTi_cZn_dO_e$ or the like as a main component are distributed in a metal oxide, leakage current can be suppressed and favorable switching operation can be achieved. The region including $In_aGa_bTi_cZn_dO_e$ or the like as a main component can be said to be a semiconductor region whose properties are close to those of an insulator.

Accordingly, when the In—Ga—Ti—Zn oxide including an CAC-OS is used for a semiconductor element, the property derived from InaGaaTicZndOe or the like and the property derived from $InO_{X1}$, $In_{X2}Zn_{Y2}O_{Z2}$, or $In_{W3}Ti_{X3}Zn_{Y3}O_{Z3}$ complement each other, whereby high on-state current ($I_{on}$), high field-effect mobility ($\mu$) and low off-state current ($I_{off}$) can be achieved.

As described above, the region 001, the region 002, and the region between the region 001 and the region 002 each include zinc, whereby the region 001 and the region 002 can be electrically connected to each other using zinc as a conductive path. In this manner, carriers (electrons) flow through the metal oxide film using zinc as a conductive path.

A semiconductor element including the In—Ga—Ti—Zn oxide including an CAC-OS has high reliability. Thus, the In—Ga—Ti—Zn oxide including an CAC-OS is suitably used in a variety of semiconductor devices typified by a display.

<Transistor Including Metal Oxide>

Next, the case where the metal oxide is used as a semiconductor in a transistor is described with reference to FIGS. 9A to 9C.

With the use of the metal oxide as a semiconductor in a transistor, the transistor can have high field-effect mobility and high switching characteristics. In addition, the transistor can have high reliability.

Figure 9A:
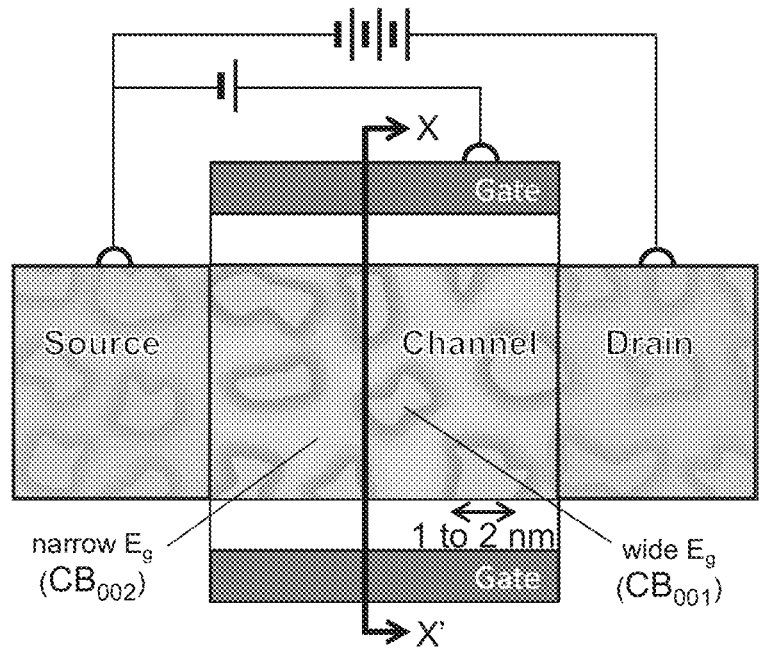
FIG. 9A is a schematic view of a transistor and FIGS. 9B and 9C are schematic views illustrating distribution of energy levels in the transistor.

FIG. 9A is a schematic view of a transistor including the metal oxide in a channel region. The transistor in FIG. 9A includes a source, a drain, a first gate, a second gate, a first gate insulating portion, a second gate insulating portion, and a channel portion. The resistance of a channel portion of a transistor can be controlled by application of a potential to a gate. That is, conduction (the on state of the transistor) or non-conduction (the off state of the transistor) between the source and the drain can be controlled by a potential applied to the first gate or the second gate.

The channel portion includes a CAC-OS in which the regions 001 having a first band gap and the regions 002 having a second band gap are distributed like a cloud. The first band gap is larger than the second band gap.

For example, the case where the In—Ga—Ti—Zn oxide having the CAC composition is used as the CAC-OS in the channel portion is described. The In—Ga—Ti—Zn oxide having the CAC composition has a composition in which materials are separated into, as the region 001, a region including $In_aGa_bTi_cZn_dO_e$ as a main component and having higher Ga concentration than the region 002, and, as the region 002, a region including $InO_{X1}$, $In_{X2}Zn_{Y2}O_{Z2}$, or $In_{W3}Ti_{X3}Zn_{Y3}O_{Z3}$ as a main component and having higher In concentration than the region 001, and a mosaic pattern is formed. $In_aGa_bTi_cZn_dO_e$ and $InO_{X1}$, $In_{X2}Zn_{Y2}O_{Z2}$, or $In_{W3}Ti_{X3}Zn_{Y3}O_{Z3}$ are distributed in the film. This composition is also referred to as a cloud-like composition. The region 001 including $In_aGa_bTi_cZn_dO_e$ as a main component has a band gap larger than that of the region 002 including $InO_{X1}$, $In_{X2}Zn_{Y2}O_{Z2}$, or $In_{W3}Ti_{X3}Zn_{Y3}O_{Z3}$ as a main component.

A conduction model of the transistor illustrated in FIG. 9A is described with reference to FIG. 9B. FIG. 9B is a schematic view showing distribution of energy levels between the source and the drain of the transistor illustrated in FIG. 9A. FIG. 9C is a conduction band diagram on solid line X-X' in the transistor illustrated in FIG. 9A. Note that in each conduction band diagram, a solid line indicates the energy of the conduction band minimum. A dashed line $E_f$ indicates the energy of the quasi-Fermi level of electrons. The case is assumed where a negative voltage is applied between the gate and the source as a first gate voltage and a drain voltage ($V_d>0$) is applied between the source and the drain. In FIGS. 9A to 9C, the energy of the conduction band minimum is denoted by CB.

Figure 9B:
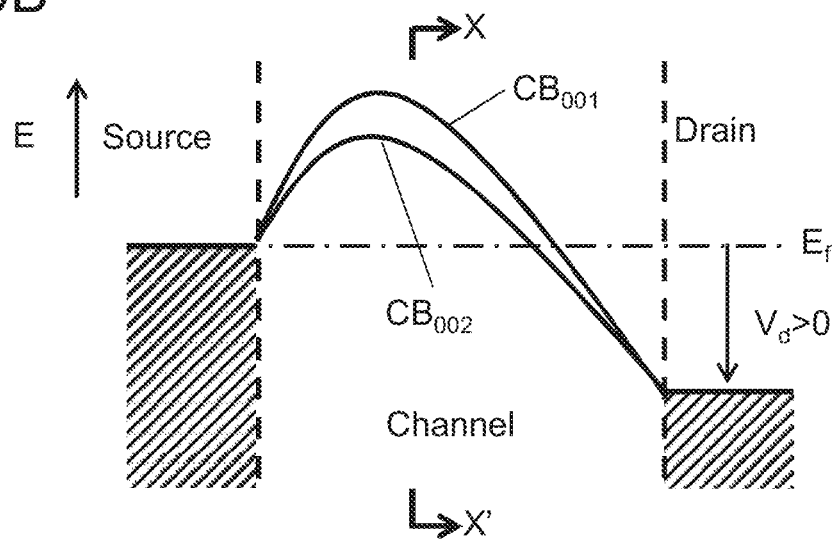

When a negative gate voltage is applied to the transistor illustrated in FIG. 9A, an energy of a conduction band minimum $CB_{001}$ derived from the region 001 and an energy of a conduction band minimum $CB_{002}$ derived from the region 002 are formed between the source and the drain as illustrated in FIG. 9B. Since the first band gap is larger than the second band gap, the potential barrier of the energy of the conduction band minimum $CB_{OOi}$ is higher than the potential barrier of the energy of the conduction band minimum 03002. That is, the maximum value of the potential barrier in the channel portion is a value derived from the region 001. Thus, the use of the CAC-OS in the channel portion in a transistor can suppress leakage current and achieve high switching characteristics.

Figure 9C:
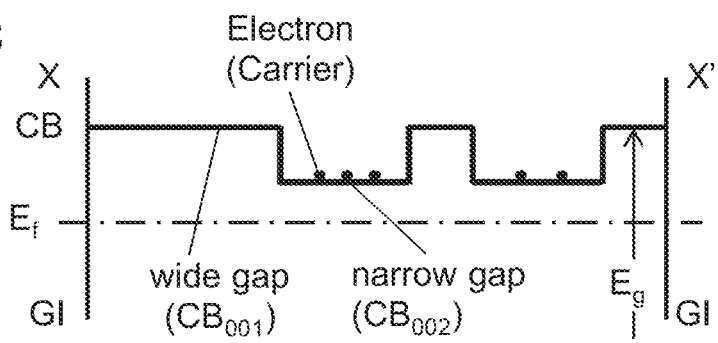

As illustrated in FIG. 9C, the band gap of the region 001 having the first band gap is relatively wider than the band gap of the region 002 having the second band gap; thus, the Ec edge of the region 001 having the first band gap can exist at a relatively higher level than the Ec edge of the region 002 having the second band gap.

Let the metal oxide of one embodiment of the present invention to be an In—Ga—Ti—Zn oxide having an atomic ratio of In:Ga:Ti:Zn=5:0.5:0.5:7.

In the In—Ga—Ti—Zn oxide, the valence of Ti is greater than those of In, Ga, and Zn. Specifically, Zn has a valence of 2, In and Ga each have a valence of 3, and Ti has a valence of 4. With the use of an element whose valence is greater than those of In, Ga, and Zn (here, Ti) in the metal oxide, this element serves as a carrier supply source and can increase the carrier density of the metal oxide. In addition, Ti is more strongly bonded to oxygen than In, Ga, and Zn. For this reason, when Ti is included in the metal oxide, the generation of oxygen vacancies can be suppressed. Therefore, when the metal oxide of one embodiment of the present invention is used in a semiconductor layer of a transistor, the field-effect mobility of the transistor is improved and oxygen vacancies are reduced, whereby a semiconductor device with high reliability can be obtained.

Although Ti is used in the above composition, Ge, Sn, V, Ni, Mo, W, or Ta may be used instead of Ti.

In the above composition, in some cases, a component of the region 001 having the first band gap is derived from the In—Ga—Ti—Zn oxide, and a component of the region 002 having the second band gap is derived from an In—Ti—Zn oxide. In this case, the first band gap is 3.3 eV or a value in the vicinity thereof, and the second band gap is 2.4 eV or a value in the vicinity thereof. Values obtained by measurement of single films of respective materials with an ellipsometer can be used as the values of the band gaps.

In the metal oxide of one embodiment of the present invention, the difference between the energy level of the conduction band minimum derived from the region 001 and the energy level of the conduction band minimum derived from the region 002 is preferably 0.2 eV or more. Since the position of the energy of the valence band maximum derived from the region 001 is different from the position of the energy of the valence band maximum derived from the region 002 in some cases, the difference between the energy level of the conduction band minimum derived from the region 001 and the energy level of the conduction band minimum derived from the region 002 is preferably 0.3 eV or more, further preferably 0.4 eV or more.

In the case of the above assumption, when carriers flow through the CAC-OS, the carriers flow owing to an In oxide, an In—Zn oxide, or an In—Ti—Zn oxide which has the second band gap, i.e., a narrow gap. At this time, the carriers overflow the second band gap into the In—Ga—Ti—Zn oxide side which has the first band gap, i.e., a wide gap. In other words, carriers are easily generated in the In oxide, the In—Zn oxide, or the In—Ti—Zn oxide which has a narrow gap, and the carriers move to the In—Ga—Ti—Zn oxide which has a wide gap.

Among the In oxide, the In—Zn oxide, and the In—Ti—Zn oxide which have narrow gaps, the In—Ti—Zn oxide has a narrower gap than those of the In oxide and the In—Zn oxide in some cases. Thus, the In—Ti—Zn oxide can have a higher carrier density than the In oxide or the In—Zn oxide.

The carrier density of a region having the first band gap, i.e., a wide gap, is higher than or equal to $1\times10^{10}$ cm$^{-3}$ and lower than or equal to $1\times10^{16}$ cm$^{-3}$, preferably approximately $1\times10^{15}$ cm$^{3}$. The carrier density of a region having the second band gap, i.e., a narrow gap, is preferably higher than or equal to $1\times10^{18}$ cm$^{3}$ and lower than $1\times10^{21}$ cm$^{3}$.

In the metal oxide where the channel is formed, the regions 001 and the regions 002 form a mosaic pattern and are irregularly unevenly distributed. For this reason, the conduction band diagram on the solid line X-X' is merely an example.

Figure 10A:
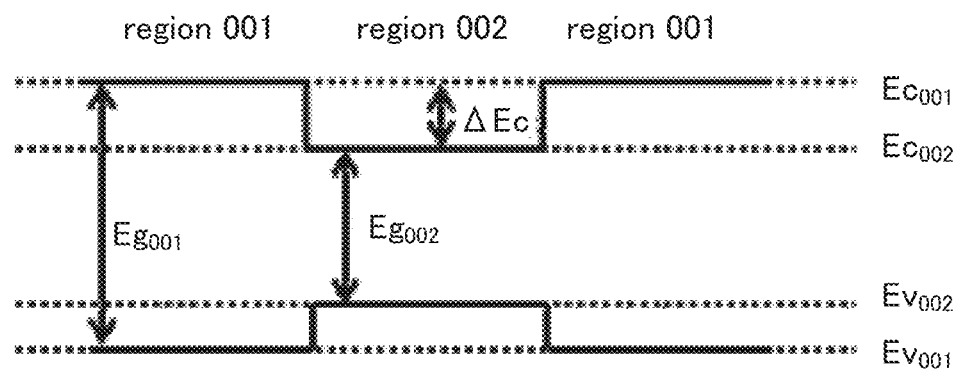
FIGS. 10A to 10C each illustrate a model of a band diagram of a transistor.
Figure 10B:
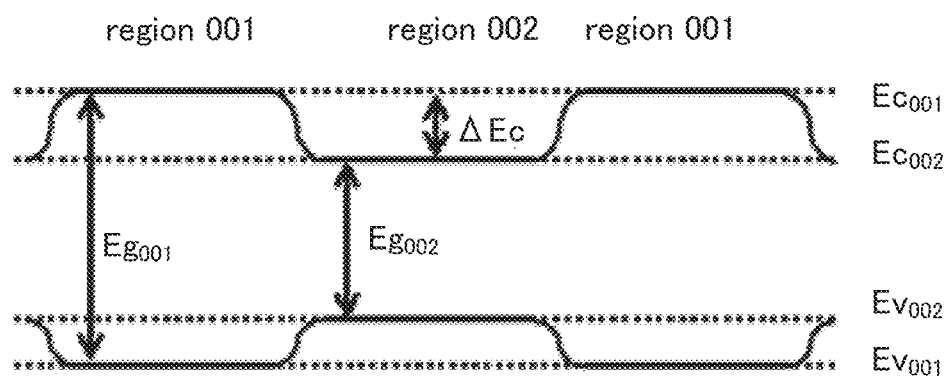
Figure 10C:
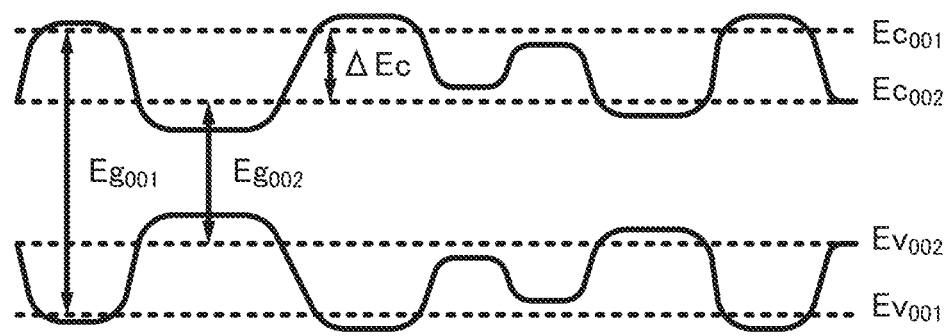

FIGS. 10A to 10C are conduction band diagrams different from the conduction band diagram in FIG. 9C.

In the metal oxide of one embodiment of the present invention, it is basically acceptable as long as a band in which the region 002 is between the regions 001 is formed as shown in FIG. 10A. Alternatively, a band in which the region 001 is between the regions 002 is formed.

In a connection portion of the region 001 having the first band gap and the region 002 having the second band gap in the CAC-OS, an aggregation state and the composition of the regions become unstable in some cases. Accordingly, as illustrated in FIGS. 10B and 10C, the bands change not discontinuously but continuously in some cases. In other words, the first band gap and the second band gap work together when carriers flow through the CAC-OS.

Figure 11A:
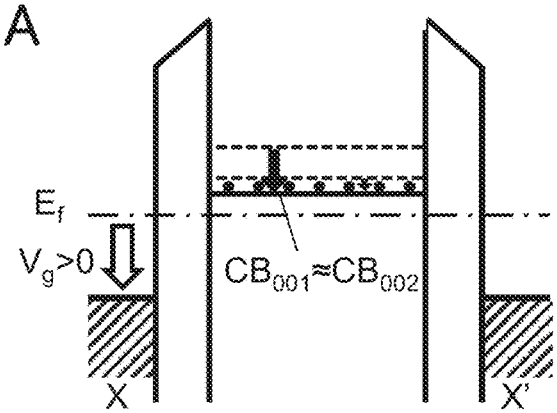
FIGS. 11A to 11C each illustrate a model of a band diagram of a transistor.
Figure 11B:
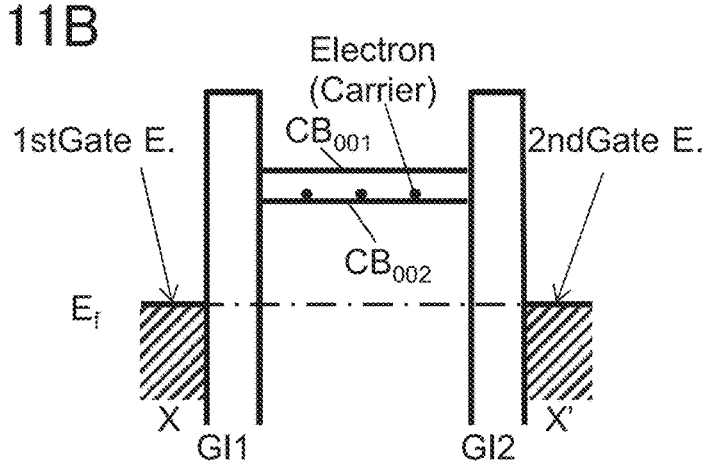
Figure 11C:
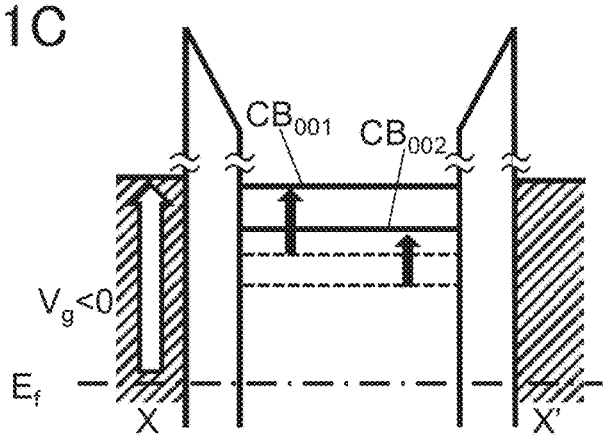

FIGS. 11A to 11C are model diagrams of band diagrams on the solid line X-X' in the transistor illustrated in FIG. 9A. When a voltage is applied to the first gate, the same voltage is applied to the second gate.

FIG. 11A shows a state (on state) in which, as a first gate voltage $V_g$, a positive voltage ($V_g$>0) is applied between each of the gates and the source. FIG. 11B shows a state in which the first gate voltage $V_g$ is not applied ($V_g$=0). FIG. 11C shows a state (off state) in which, as the first gate voltage $V_g$, a negative voltage ($V_g$<0) is applied between each of the gates and the source. Note that in each conduction band diagram, a solid line indicates the energy of the conduction band minimum. A dashed line $E_f$ indicates the energy of the quasi-Fermi level of electrons.

In a transistor including the CAC-OS in a channel portion, the region 001 having the first band gap and the region 002 having the second band gap electrically interact with each other. In other words, the region 001 having the first band gap and the region 002 having the second band gap function complementarily.

As illustrated in FIG. 11A, when a potential at which the transistor is turned on ($V_g$>0) is applied to the first gate, electrons flow in the region 002 having the second band gap with the low Ec edge and serving as a main conduction path. At the same time, electrons also flow in the region 001 having the first band gap. This enables high current drive capability in the on state of the transistor, i.e., high on-state current and high field-effect mobility.

In contrast, as illustrated in FIGS. 11B and 11C, when a voltage lower than the threshold voltage ($V_g$≤0) is applied to the first gate, the region 001 having the first band gap serves as a dielectric (insulator), so that the conduction path in the region 001 is blocked. The region 002 having the second band gap is in contact with the region 001 having the first band gap. Consequently, the region 001 having the first band gap electrically interact with each other and also with the region 002 having the second band gap, and thus, even the conduction path in the region 002 having the second band gap is blocked. Accordingly, the whole channel portion is brought into a non-conductive state, and the transistor is turned off As described above, with the use of the CAC-OS in a transistor, it is possible to reduce or prevent leakage current between a gate and a source or a drain, which is generated when the transistor operates, for example, when a potential difference is generated between the gate and the source or the drain.

A metal oxide with reduced hydrogen concentration is preferably used in a transistor. The metal oxide with reduced hydrogen concentration may be referred to as a highly purified intrinsic or substantially highly purified intrinsic metal oxide. The highly purified intrinsic or substantially highly purified intrinsic metal oxide can have a low carrier density because carriers due to hydrogen (e.g., $V_O H$ in which hydrogen exists in an oxygen vacancy) are few. The highly purified intrinsic or substantially highly purified intrinsic metal oxide has a low density of defect states and accordingly has a low density of trap states in some cases.

The highly purified intrinsic or substantially highly purified intrinsic metal oxide has few carriers due to hydrogen, and thus has a low carrier density. However, the metal oxide of one embodiment of the present invention includes an element (e.g., one or more kinds of elements selected from Ti, Ge, Sn, V, Ni, Mo, W, and Ta) serving as a carrier supply source, and thus can have a high carrier density even with a small amount of carriers due to hydrogen.

Charge trapped by the trap states in the metal oxide takes a long time to be released and may behave like fixed charge. Thus, a transistor whose channel region is formed in a metal oxide having a high density of trap states has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in a film that is adjacent to the metal oxide is preferably reduced. Examples of impurities include hydrogen and alkali metal.

Here, the influence of impurities in the metal oxide will be described.

When carbon that is a Group 14 element is contained in the metal oxide, defect states are formed in the metal oxide. Thus, the concentration of carbon (measured by secondary ion mass spectrometry (SIMS)) is set to be lower than or equal to $2 \times 10^{18}$ atoms/cm$^3$, preferably lower than or equal to $2 \times 10^{17}$ atoms/cm$^3$ in the metal oxide or around an interface with the metal oxide.

When the metal oxide contains alkali metal, defect states are formed and carriers are generated, in some cases. Thus, a transistor including a metal oxide that contains alkali metal is likely to be normally on. Therefore, it is preferable to reduce the concentration of alkali metal in the metal oxide. Specifically, the concentration of alkali metal in the metal oxide measured by SIMS is set to be lower than or equal to $1 \times 10^{18}$ atoms/cm$^3$, preferably lower than or equal to $2 \times 10^{16}$ atoms/cm$^3$.

Hydrogen included in the metal oxide reacts with oxygen bonded to a metal atom to be water, and thus causes an oxygen vacancy ($V_O$) in some cases. Due to entry of hydrogen into the oxygen vacancy ($V_O$), an electron serving as a carrier is generated in some cases. Furthermore, in some cases, bonding of part of hydrogen to oxygen bonded to a metal atom causes generation of an electron serving as a carrier. Thus, a transistor including the metal oxide that includes hydrogen is likely to be normally on. Accordingly, hydrogen in the metal oxide is preferably reduced as much as possible. Specifically, the hydrogen concentration of the metal oxide, which is measured by SIMS, is set to higher than or equal to $1 \times 10^{16}$ atoms/cm$^3$ and lower than $3 \times 10^{21}$ atoms/cm$^3$, preferably higher than or equal to $1 \times 10^{17}$ atoms/cm$^3$ and lower than $3 \times 10^{20}$ atoms/cm$^3$.

The oxygen vacancies ($V_O$) in the metal oxide can be reduced by introduction of oxygen into the metal oxide. That is, the oxygen vacancies ($V_O$) in the metal oxide disappear when the oxygen vacancies ($V_O$) are filled with oxygen. Accordingly, diffusion of oxygen in the metal oxide can reduce the oxygen vacancies ($V_O$) in a transistor and improve the reliability of the transistor.

As a method for introducing oxygen into the metal oxide, for example, an oxide in which oxygen content is higher than that in the stoichiometric composition is provided in contact with the metal oxide. That is, in the oxide, a region including oxygen in excess of that in the stoichiometric composition (hereinafter also referred to as an excess oxygen region) is preferably formed. In particular, in the case of using a metal oxide in a transistor, an oxide including an excess oxygen region is provided in a base film, an interlayer film, or the like in the vicinity of the transistor, whereby oxygen vacancies in the transistor are reduced, and the reliability can be improved.

When a metal oxide with sufficiently reduced impurity concentration is used for a channel formation region in a transistor, the transistor can have stable electrical characteristics.

The structures described in this embodiment can be used in appropriate combination with the structures described in any of the other embodiments.

Embodiment 2

In this embodiment, semiconductor devices each including the metal oxide of one embodiment of the present invention, and manufacturing methods thereof will be described with reference to FIGS. 12A to 12D, FIGS. 13A to 13D, FIGS. 14A to 14D, FIGS. 15A to 15D, FIGS. 16A to 16D, FIGS. 17A to 17D, FIGS. 18A to 18D, FIGS. 19A to 19D, FIGS. 20A to 20D, FIGS. 21A to 21C, FIGS. 22A to 22C, and FIGS. 23A and 23B.

<2-1. Structure Example 1 of Semiconductor Device>

Figure 12A:
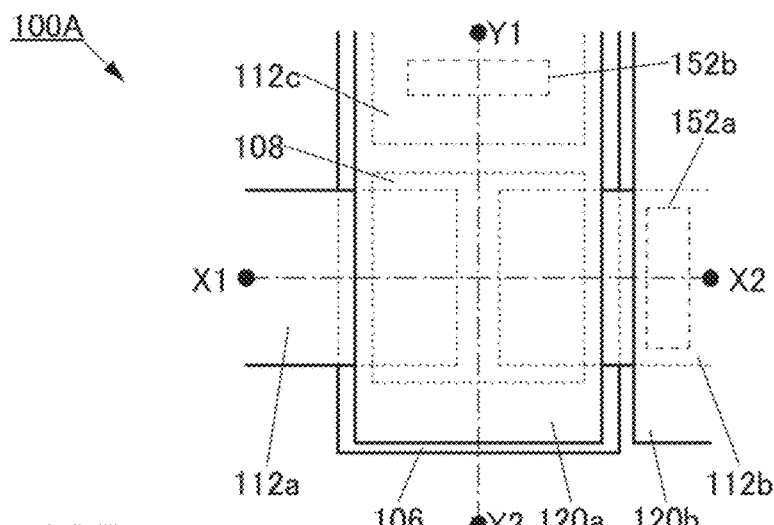
FIGS. 12A to 12D are a top view, cross-sectional views, and a cross-sectional conceptual view illustrating one embodiment of a semiconductor device.
Figure 12B:
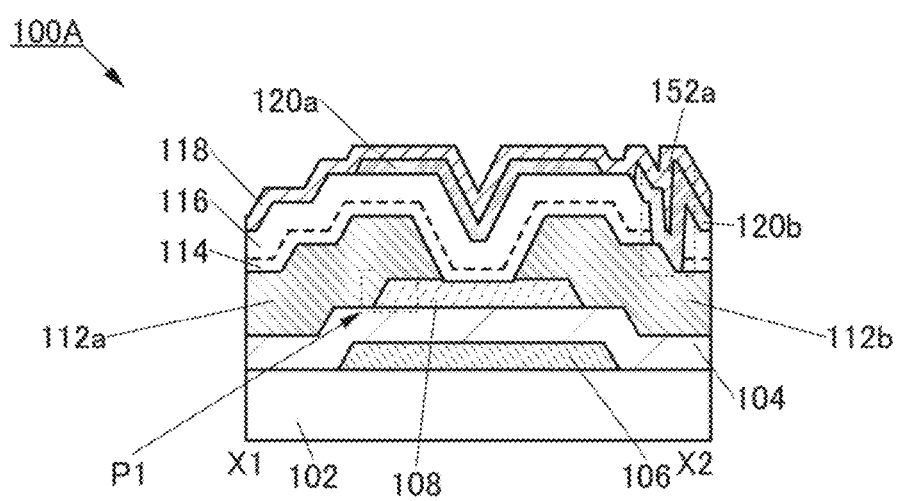
Figure 12C:
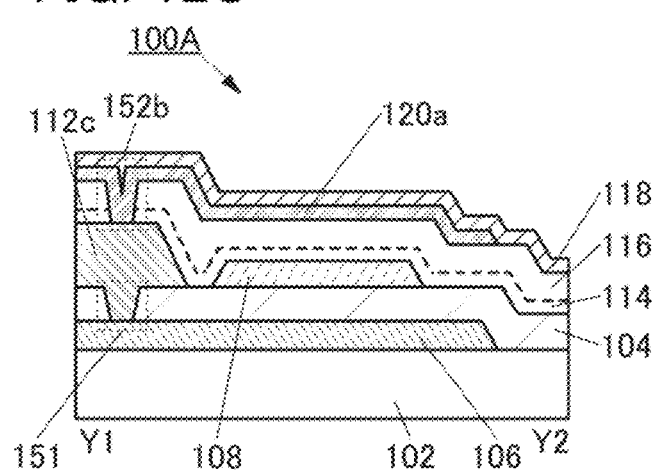
Figure 12D:
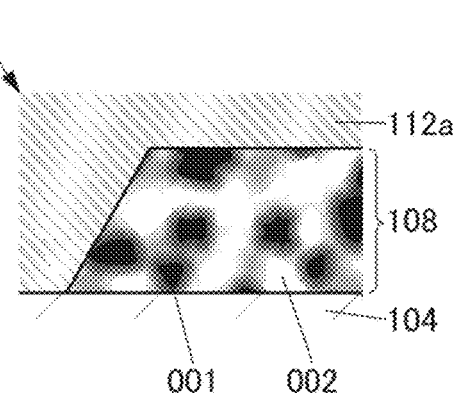

FIG. 12A is a top view of a transistor 100A that is a semiconductor device of one embodiment of the present invention. FIG. 12B is a cross-sectional view taken along dashed-dotted line X1-X2 in FIG. 12A. FIG. 12C is a cross-sectional view taken along dashed-dotted line Y1-Y2 in FIG. 12A. FIG. 12D is an enlarged cross-sectional conceptual view of a region P1 illustrated in FIG. 12B.

Note that in FIG. 12A, some components of the transistor 100A (e.g., an insulating film functioning as a gate insulating film) are not illustrated to avoid complexity. The direction of the dashed-dotted line X1-X2 may be called a channel length direction, and the direction of the dashed-dotted line Y1-Y2 may be called a channel width direction. As in FIG. 12A, some components are not illustrated in some cases in top views of transistors described below.

The transistor 100A includes a conductive film 106 over a substrate 102, an insulating film 104 over the substrate 102 and the conductive film 106, a metal oxide 108 over the insulating film 104, a conductive film 112*a* over the metal oxide 108, a conductive film 112*b* over the metal oxide 108, an insulating film 114 over the metal oxide 108, the conductive film 112*a*, and the conductive film 112*b*, an insulating film 116 over the insulating film 114, a conductive film 120*a* over the insulating film 116, and a conductive film 120*b* over the insulating film 116.

The insulating film 104 includes an opening 151, and a conductive film 112*c*, which is electrically connected to the conductive film 106 through the opening 151, is formed over the insulating film 104. The insulating films 114 and 116 include an opening 152*a* which reaches the conductive film 112*b* and an opening 152*b* which reaches the conductive film 112*c*.

The metal oxide 108 includes the metal oxide of one embodiment of the present invention described in Embodiment 1. Here, a connection between the metal oxide of one embodiment of the present invention and a conductive film is described with reference to FIG. 12D.

As illustrated in the region P1 in FIG. 12D, a top surface and a side surface of the metal oxide 108 are in contact with the conductive film 112*a*; thus, contact resistance can be reduced. In addition, the metal oxide 108 has the CAC composition in FIG. 8 and the region 002 included in the CAC composition, i.e., a region with a high conductivity is in contact with the conductive film 112*a*; thus, the contact resistance can be further reduced. Although not illustrated, a connection between the metal oxide 108 and the conductive film 112*b* is similar to that in the region P1.

The metal oxide of one embodiment of the present invention includes a highly conductive region and the contact resistance between the metal oxide and the conductive film is reduced. Thus, the field-effect mobility of the transistor including the metal oxide can be increased.

For example, the field-effect mobility of the transistor 100A can be higher than 50 cm$^2$/Vs, preferably higher than 100 cm$^2$/Vs.

For example, the use of the transistor with high field-effect mobility in a gate driver that is included in a display device and generates a gate signal allows the display device to have a narrow frame. The use of the transistor with high field-effect mobility in a source driver (particularly in a demultiplexer connected to an output terminal of a shift register included in a source driver) that is included in a display device and supplies a signal from a signal line can reduce the number of wirings connected to the display device.

Impurities such as hydrogen and moisture entering the metal oxide 108 adversely affect the transistor characteristics and therefore cause a problem. Thus, it is preferable that the amount of impurities such as hydrogen and moisture in the channel region of the metal oxide 108 be as small as possible. Furthermore, oxygen vacancies formed in the channel region of the metal oxide 108 adversely affect the transistor characteristics and therefore cause a problem. For example, oxygen vacancies formed in the channel region of the metal oxide 108 are bonded to hydrogen to serve as a carrier supply source. The carrier supply source generated in the channel region of the metal oxide 108 causes a change in the electrical characteristics, typically, a shift in the threshold voltage, of the transistor 100A including the metal oxide 108. Thus, it is preferable that the amount of oxygen vacancies in the channel region of the metal oxide 108 be as small as possible.

In addition, the conductive film 112*c* is electrically connected to the conductive film 120*a* through the opening 152*b*, and the conductive film 112*b* is electrically connected to the conductive film 120*b* through the opening 152*a*. Note that the conductive film 120*a* and the conductive film 120*b* are formed by processing the same conductive film.

In addition, an insulating film 118 is provided over the transistor 100A. The insulating film 118 is formed to cover the insulating film 116, the conductive film 120*a*, and the conductive film 120*b*.

Note that in the transistor 100A, the insulating film 104 functions as a first gate insulating film of the transistor 100A, the insulating films 114 and 116 function as a second gate insulating film of the transistor 100A, and the insulating film 118 functions as a protective insulating film of the transistor 100A.

In addition, in the transistor 100A, the conductive film 106 functions as a first gate electrode, the conductive film 120*a* functions as a second gate electrode, and the conductive film 120*b* functions as a pixel electrode included in the display device. Moreover, in the transistor 100A, the conductive film 112*a* functions as a source electrode and the conductive film 112*b* functions as a drain electrode. Furthermore, in the transistor 100A, the conductive film 112*c* functions as a connection electrode. In this specification and the like, the insulating film 104 may be referred to as a first insulating film, the insulating films 114 and 116 may be referred to as a second insulating film, and the insulating film 118 may be referred to as a third insulating film.

As illustrated in FIG. 12C, the conductive film 120*a* functioning as the second gate electrode is electrically connected to the conductive film 106 functioning as the first gate electrode through the conductive film 112*c* functioning as the connection electrode. Accordingly, the conductive film 106 and the conductive film 120*a* are supplied with the same potential.

As illustrated in FIG. 12C, the metal oxide 108 faces the conductive film 106 functioning as the first gate electrode and the conductive film 120*a* functioning as the second gate electrode, and is positioned between the two films functioning as the gate electrodes. The length of the conductive film 120*a* in the channel length direction and the length of the conductive film 120*a* in the channel width direction are longer than the length of the metal oxide 108 in the channel length direction and the length of the metal oxide 108 in the channel width direction, respectively, and the whole metal oxide 108 is covered with the conductive film 120*a* with the insulating films 114 and 116 provided therebetween.

In other words, in the channel width direction of the transistor 100A, the metal oxide 108 is surrounded by the conductive film 106 functioning as the first gate electrode and the conductive film 120*a* functioning as the second gate electrode with the insulating film 104 functioning as the first gate insulating film and the insulating films 114 and 116 functioning as the second gate insulating film provided therebetween.

Such a structure makes it possible that the metal oxide 108 included in the transistor 100A is electrically surrounded by electric fields of the conductive film 106 functioning as the first gate electrode and the conductive film 120*a* functioning as the second gate electrode. A device structure of a transistor in which electric fields of a first gate electrode and a second gate electrode electrically surround a metal oxide where a channel region is formed, like in the transistor 100A, can be referred to as a surrounded channel (S-channel) structure.

Since the transistor 100A has the S-channel structure, an electric field for inducing a channel can be effectively applied to the metal oxide 108 by the conductive film 106 functioning as the first gate electrode; therefore, the current drive capability of the transistor 100A can be improved and high on-state current characteristics can be obtained. Since the on-state current can be increased, it is possible to reduce the size of the transistor 100A. In addition, since the transistor 100A has a structure where the metal oxide 108 is surrounded by the conductive film 106 functioning as the first gate electrode and the conductive film 120a functioning as the second gate electrode, the mechanical strength of the transistor 100A can be increased.

<2-2. Structure Example 2 of Semiconductor Device>

Next, modification examples of the transistor 100A shown in FIGS. 12A to 12D are described with reference to FIGS. 13A to 13D, FIGS. 14A to 14D, and FIGS. 15A to 15D.

First, description is made with reference to FIGS. 13A to 13D.

Figure 13A:
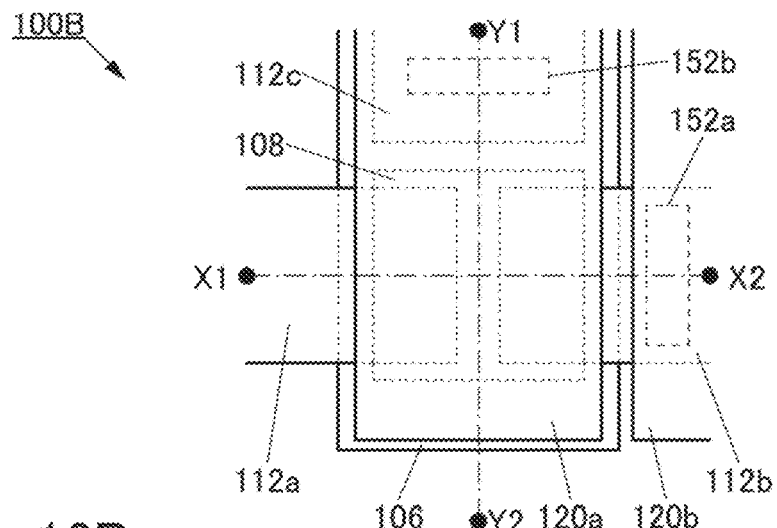
FIGS. 13A to 13D are a top view, cross-sectional views, and a cross-sectional conceptual view illustrating one embodiment of a semiconductor device.
Figure 13B:
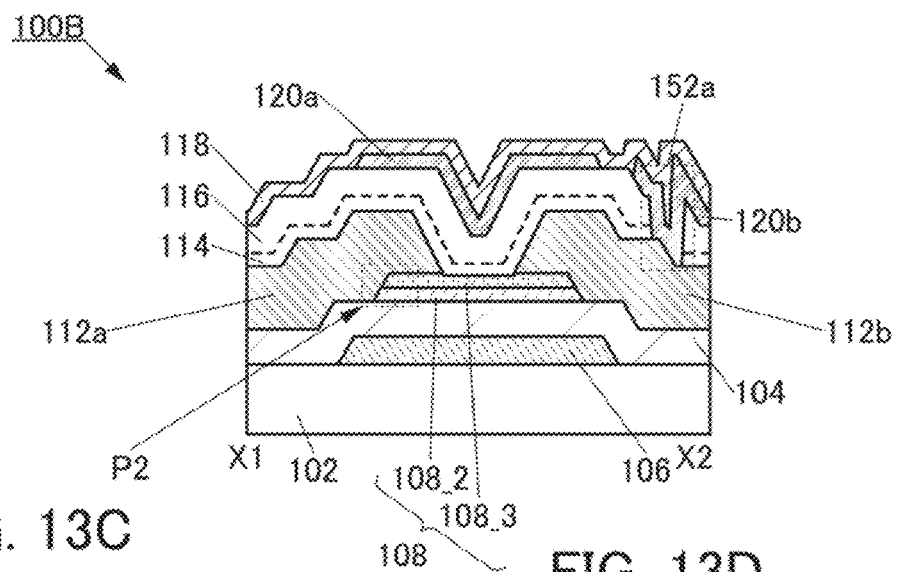
Figure 13C:
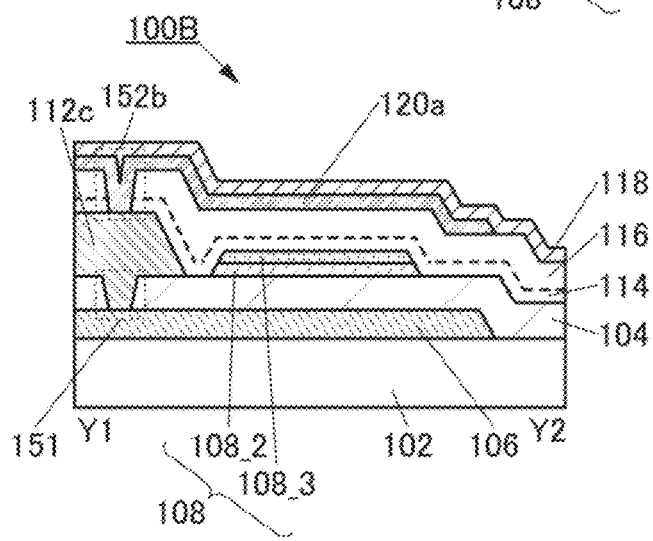
Figure 13D:
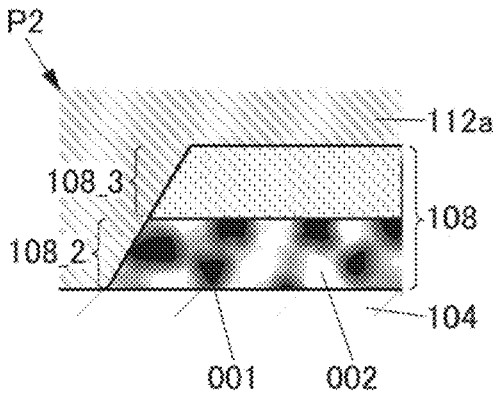

FIGS. 13A to 13C are a top view and cross-sectional views of a transistor 100B, which is a modification example of the transistor 100A in FIGS. 12A to 12C. FIG. 13D is an enlarged cross-sectional conceptual view of a region P2 illustrated in FIG. 13B.

In the transistor 100B in FIGS. 13A to 13C, the metal oxide 108, which is also included in the transistor 100A in FIGS. 12A to 12C, has a two-layer structure. Specifically, the metal oxide 108 included in the transistor 100B includes a metal oxide 108_2 and a metal oxide 108_3 over the metal oxide 108_2.

For example, as the metal oxide 108_2 included in the metal oxide 108, the metal oxide of one embodiment of the present invention can be used.

As shown in the region P2 in FIG. 13D, the top surface and the side surface of the metal oxide 108 are in contact with the conductive film 112a; thus, contact resistance can be reduced. In addition, the metal oxide 108_2 included in the metal oxide 108 has the CAC composition in FIG. 8, and the region 002 included in the CAC composition, that is, a region with a high conductivity is in contact with the conductive film 112a; thus, the contact resistance can be further reduced. Even if a metal oxide having low conductivity, for example, an oxide with a wide band gap (e.g., Eg is larger than or equal to 3.3 eV) is used as the metal oxide 108_3, the side surface of the metal oxide 108_2 is in contact with the conductive film 112a, whereby the contact resistance can be reduced. Although not illustrated, a connection between the metal oxide 108 and the conductive film 112b is similar to that in the region P2.

Next, description is made with reference to FIGS. 14A to 14D.

Figure 14A:
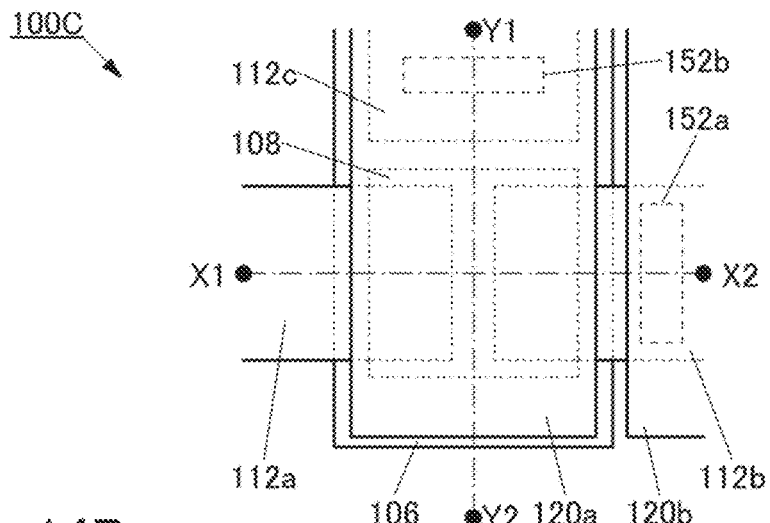
FIGS. 14A to 14D are a top view, cross-sectional views, and a cross-sectional conceptual view illustrating one embodiment of a semiconductor device.
Figure 14B:
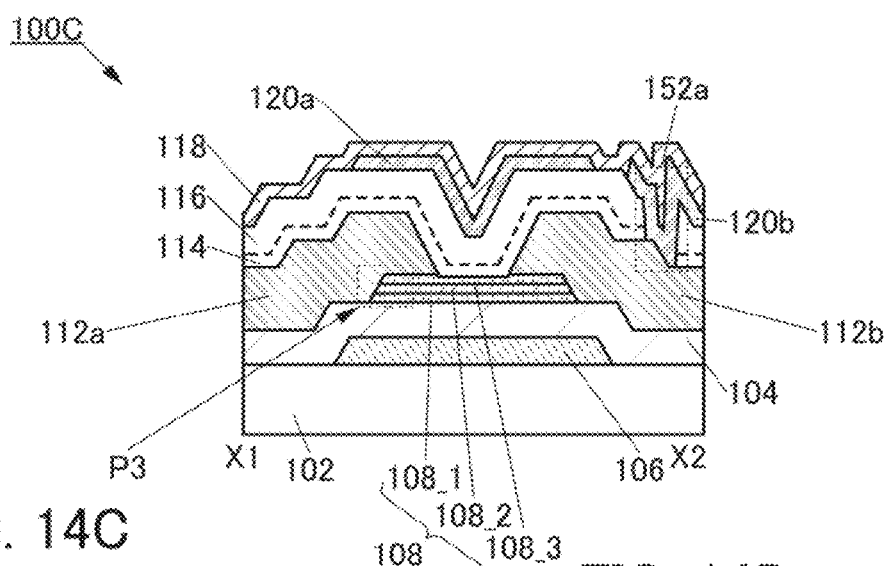
Figure 14C:
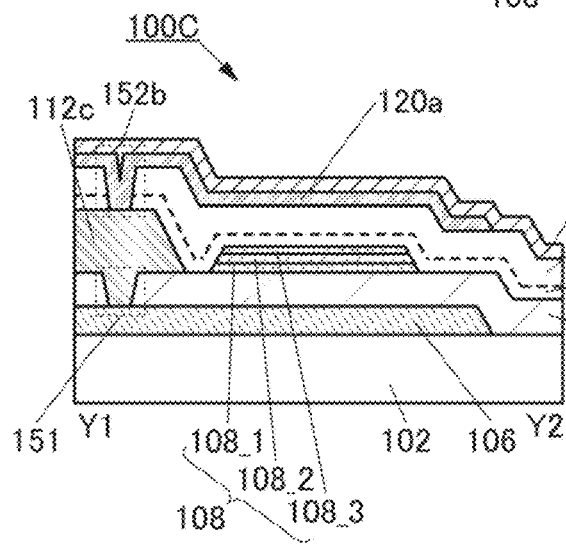
Figure 14D:
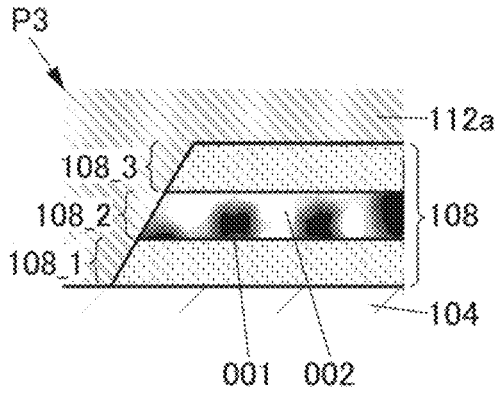

FIGS. 14A to 14C are a top view and cross-sectional views of a transistor 100C, which is a modification example of the transistor 100A in FIGS. 12A to 12C. FIG. 14D is an enlarged cross-sectional conceptual view of a region P3 illustrated in FIG. 14B.

In the transistor 100C in FIGS. 14A to 14C, the metal oxide 108, which is also included in the transistor 100A in FIGS. 12A to 12C, has a three-layer structure. Specifically, the metal oxide 108 included in the transistor 100C includes a metal oxide 108_1, a metal oxide 108_2 over the metal oxide 108_1, and a metal oxide 108_3 over the metal oxide 108_2.

For example, as the metal oxide 108_2 included in the metal oxide 108, the metal oxide of one embodiment of the present invention can be used.

As shown in the region P3 in FIG. 14D, the top surface and the side surface of the metal oxide 108 are in contact with the conductive film 112a; thus, contact resistance can be reduced. In addition, the metal oxide 108_2 included in the metal oxide 108 has the CAC composition in FIG. 8, and the region 002 included in the CAC composition, that is, a region with a high conductivity is in contact with the conductive film 112a; thus, the contact resistance can be further reduced. Even if a metal oxide having low conductivity, for example, an oxide with a wide band gap (e.g., Eg is larger than or equal to 3.3 eV) is used as the metal oxide 108_1 and the metal oxide 108_3, the side surface of the metal oxide 108_2 is in contact with the conductive film 112a, whereby the contact resistance can be reduced. Although not illustrated, a connection between the metal oxide 108 and the conductive film 112b is similar to that in the region P3.

Then, description is made with reference to FIGS. 15A to 15D.

Figure 15A:
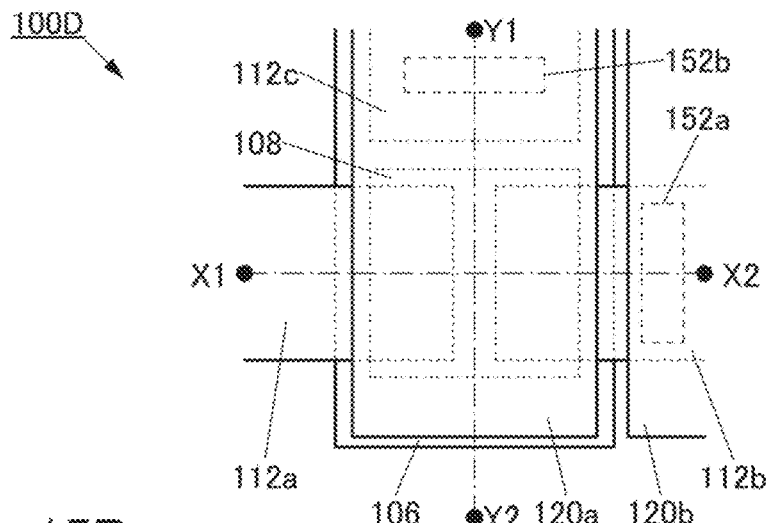
FIGS. 15A to 15D are a top view, cross-sectional views, and a cross-sectional conceptual view illustrating one embodiment of a semiconductor device.
Figure 15B:
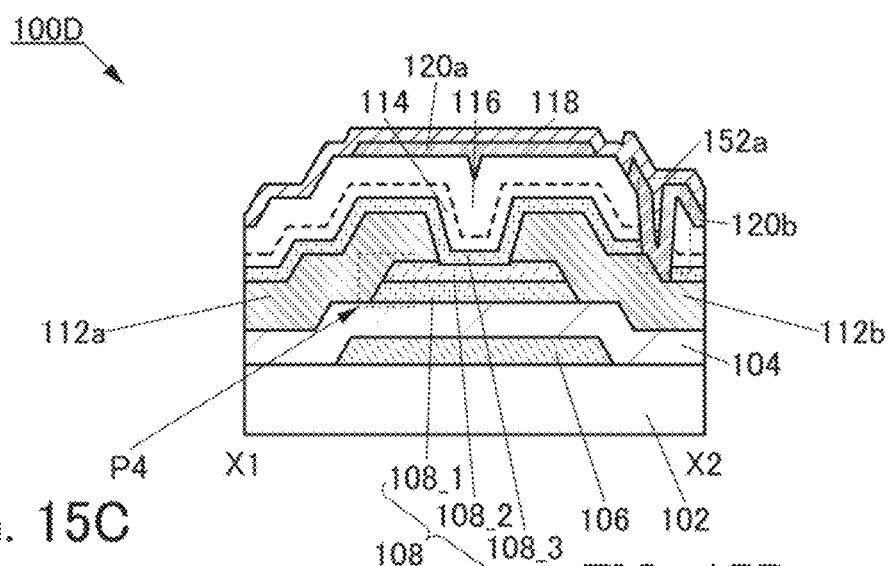
Figure 15C:
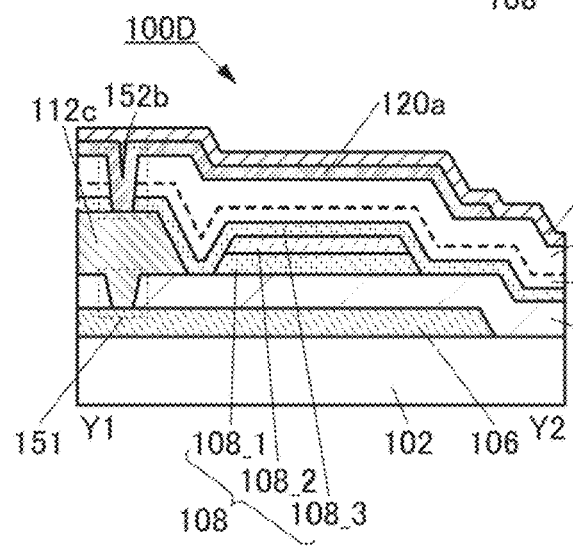
Figure 15D:
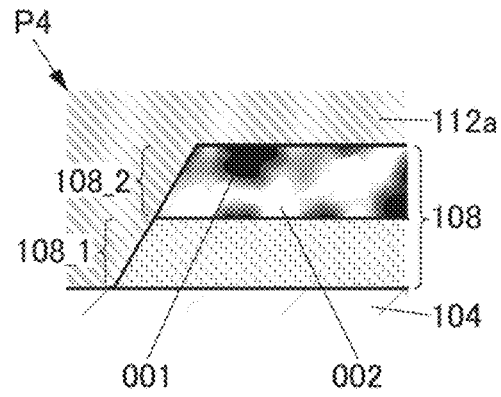

FIGS. 15A to 15C are a top view and cross-sectional views of a transistor 100D, which is a modification example of the transistor 100A in FIGS. 12A to 12C. FIG. 15D is an enlarged cross-sectional conceptual view of a region P4 illustrated in FIG. 15B.

In the transistor 100D in FIGS. 15A to 15C, the metal oxide 108, which is also included in the transistor 100A in FIGS. 12A to 12C, has a three-layer structure. Specifically, the metal oxide 108 included in the transistor 100D includes the metal oxide 108_1, the metal oxide 108_2 over the metal oxide 108_1, and the metal oxide 108_3 over the metal oxide 108_2.

For example, as the metal oxide 108_2 included in the metal oxide 108, the metal oxide of one embodiment of the present invention can be used. As shown in the region P4 in FIG. 15D, the top surface and the side surface of the metal oxide 108 are in contact with the conductive film 112a; thus, contact resistance can be reduced. In addition, the metal oxide 108_2 included in the metal oxide 108 has the CAC composition in FIG. 8, and the region 002 included in the CAC composition, that is, a region with a high carrier density is in contact with the conductive film 112a; thus, the contact resistance can be further reduced.

In addition, the position of the metal oxide 108_3 in the transistor 100D is different from that in the transistor 100C, and the metal oxide 108_3 included in the transistor 100D is formed over the conductive films 112a and 112b which function as a source electrode and a drain electrode. The metal oxide 108_3 is positioned over the conductive films 112a and 112b, whereby the contact resistance between the metal oxide 108_2 and the conductive films 112a and 112b can be further reduced.

As illustrated in FIGS. 13A to 13D, FIGS. 14A to 14D, and FIGS. 15A to 15D, in the transistor of one embodiment of the present invention, the metal oxide preferably has a stacked-layer structure.

<2-3. Band Structure>

Next, band structures of the metal oxide 108 which has a stacked-layer structure are described with reference to FIGS. 23A and 23B.

Figure 23A:
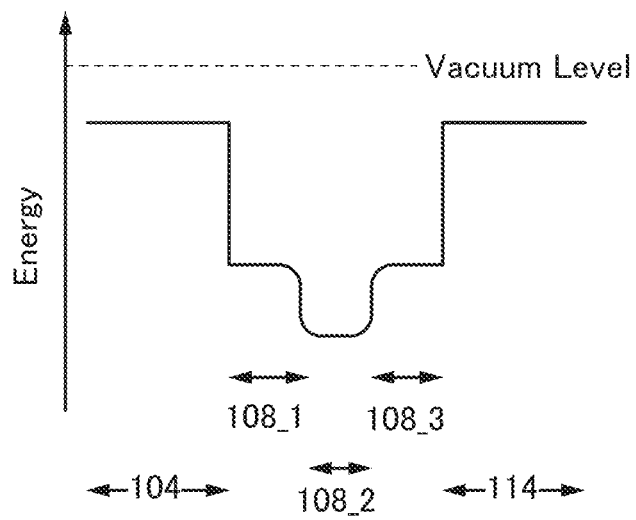
FIGS. 23A and 23B each show a band structure.
Figure 23B:
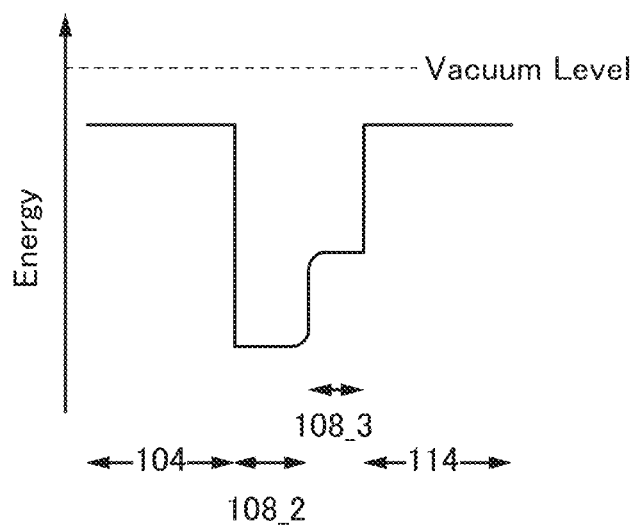

FIGS. 23A and 23B show a band structure of the insulating film 104, the metal oxides 108_1, 108_2, and 108_3, and the insulating film 114 and a band structure of the insulating film 104, the metal oxides 108_2 and 108_3, and the insulating film 114, respectively.

FIG. 23A shows an example of a band structure in the thickness direction of a stack including the insulating film 104, the metal oxides 108_1, 108_2, and 108_3, and the insulating film 114. FIG. 23B shows an example of a band structure in the thickness direction of a stack including the insulating film 104, the metal oxides 108_2 and 108_3, and the insulating film 114. For easy understanding, the band structures show the energy levels of the conduction band minimums (Ec) of the insulating film 104, the metal oxides 108_1, 108_2, and 108_3, and the insulating film 114.

As illustrated in FIG. 23A, the energy level of the conduction band minimum gradually varies between the metal oxides 108_1, 108_2, and 108_3. As illustrated in FIG. 23B, the energy level of the conduction band minimum gradually varies between the metal oxides 108_2 and 108_3. In other words, the energy level of the conduction band minimum is continuously changed or continuously connected. To obtain such a band structure, there exists no impurity which forms a defect state such as a trap center or a recombination center at the interface between the metal oxides 108_1 and 108_2 or the interface between the metal oxides 108_2 and 108_3.

To form a continuous junction between the metal oxides 108_1, 108_2, and 108_3, it is necessary to form the films successively without exposure to the air by using a multi-chamber deposition apparatus (sputtering apparatus) provided with a load lock chamber.

With the band structure of FIG. 23A or FIG. 23B, the metal oxide 108_2 serves as a well, and a channel region is formed in the metal oxide 108_2 in the transistor with the stacked-layer structure.

As the metal oxide 108_2, the metal oxide of one embodiment of the present invention can be used. In FIGS. 23A and 23B, the band structures of the metal oxide 108_2 each have a flat shape; however, the metal oxide 108_2 may have any of the band structures in FIGS. 10A to 10C described in Embodiment 1.

The metal oxides 108_1 and 108_3 are provided, whereby trap states which can be formed in the metal oxide 108_2 can be provided in the metal oxide 108_1 or 108_3. Thus, it is difficult to form the trap states in the metal oxide 108_2.

In addition, the trap states might be more distant from the vacuum level than the energy level of the conduction band minimum (Ec) of the metal oxide 108_2 functioning as a channel region, so that electrons are likely to be accumulated in the trap states. When the electrons are accumulated in the trap states, the electrons become negative fixed charges, so that the threshold voltage of the transistor is shifted in the positive direction. Therefore, it is preferable that the trap states be closer to the vacuum level than the energy level of the conduction band minimum (Ec) of the metal oxide 108_2. Such a structure inhibits accumulation of electrons in the trap states. As a result, the on-state current and the field-effect mobility of the transistor can be increased.

The energy level of the conduction band minimum of each of the metal oxides 108_1 and 108_3 is closer to the vacuum level than that of the metal oxide 108_2. A typical difference between the energy level of the conduction band minimum of the metal oxide 108_2 and the energy level of the conduction band minimum of each of the metal oxides 108_1 and 108_3 is 0.15 eV or more or 0.5 eV or more and 2 eV or less or 1 eV or less. That is, the difference between the electron affinity of each of the metal oxides 108_1 and 108_3 and the electron affinity of the metal oxide 108_2 is 0.15 eV or more or 0.5 eV or more and 2 eV or less or 1 eV or less.

In such a structure, the metal oxide 108_2 serves as a main path of a current. In other words, the metal oxide 108_2 serves as a channel region, and the metal oxides 108_1 and 108_3 serve as oxide insulating films. It is preferable that the metal oxides 108_1 and 108_3 each include one or more metal elements constituting a part of the metal oxide 108_2 in which a channel region is formed. With such a structure, interface scattering hardly occurs at the interface between the metal oxide 108_1 and the metal oxide 108_2 or at the interface between the metal oxide 108_2 and the metal oxide 108_3. Thus, the transistor can have high field-effect mobility because the movement of carriers is not hindered at the interface.

To prevent each of the metal oxides 108_1 and 108_3 from functioning as part of a channel region, a material having sufficiently low conductivity is used for the metal oxides 108_1 and 108_3. Thus, the metal oxides 108_1 and 108_3 can be referred to as oxide insulating films for such properties and/or functions. Alternatively, a material that has a smaller electron affinity (a difference between the vacuum level and the energy level of the conduction band minimum) than the metal oxide 108_2 and has a difference in the energy level of the conduction band minimum from the metal oxide 108_2 (band offset) is used for the metal oxides 108_1 and 108_3. Furthermore, to inhibit generation of a difference in threshold voltage due to the value of the drain voltage, it is preferable to form the metal oxides 108_1 and 108_3 using a material whose energy level of the conduction band minimum is closer to the vacuum level than that of the metal oxide 108_2. For example, a difference between the energy level of the conduction band minimum of the metal oxide 108_2 and the energy level of the conduction band minimum of each of the metal oxides 108_1 and 108_3 is preferably greater than or equal to 0.2 eV, further preferably greater than or equal to 0.5 eV.

It is preferable that the metal oxides 108_1 and 108_3 not have a spinel crystal structure. This is because if the metal oxides 108_1 and 108_3 have a spinel crystal structure, constituent elements of the conductive films 120a and 120b might be diffused into the metal oxide 108_2 at the interface between the spinel crystal structure and another region. Note that each of the metal oxides 108_1 and 108_3 is preferably a CAAC-OS film, in which case a higher blocking property against constituent elements of the conductive films 120a and 120b, for example, copper elements, can be obtained.

The metal oxides 108_1 and 108_3 can be formed using a metal oxide target having an atomic ratio of In:Ga:Zn=1:1:1, In:Ga:Zn=1:3:4, In:Ga:Zn=1:3:6, or the like.

<2-4. Structure Example 3 of Semiconductor Device>

Next, a transistor having a structure different from those of the transistors described above is described with reference to FIGS. 16A to 16D.

Figure 16A:
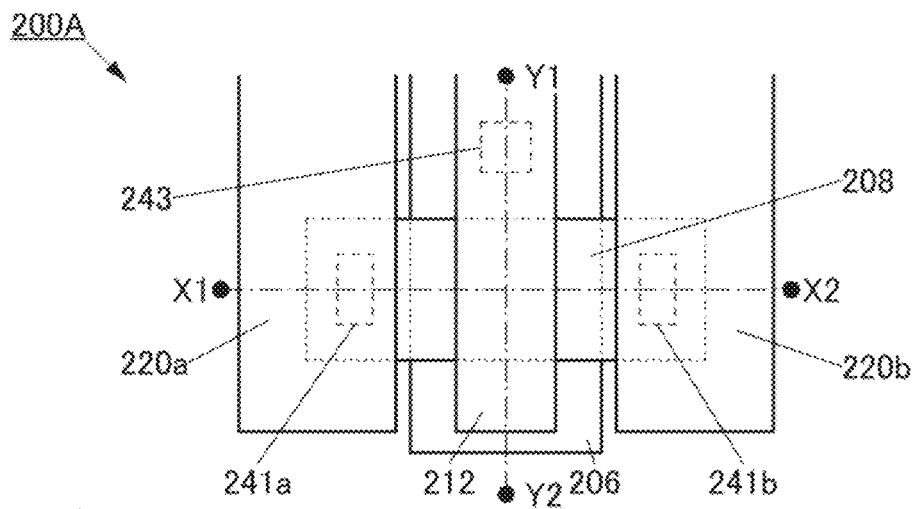
FIGS. 16A to 16D are a top view, cross-sectional views, and a cross-sectional conceptual view illustrating one embodiment of a semiconductor device.
Figure 16B:
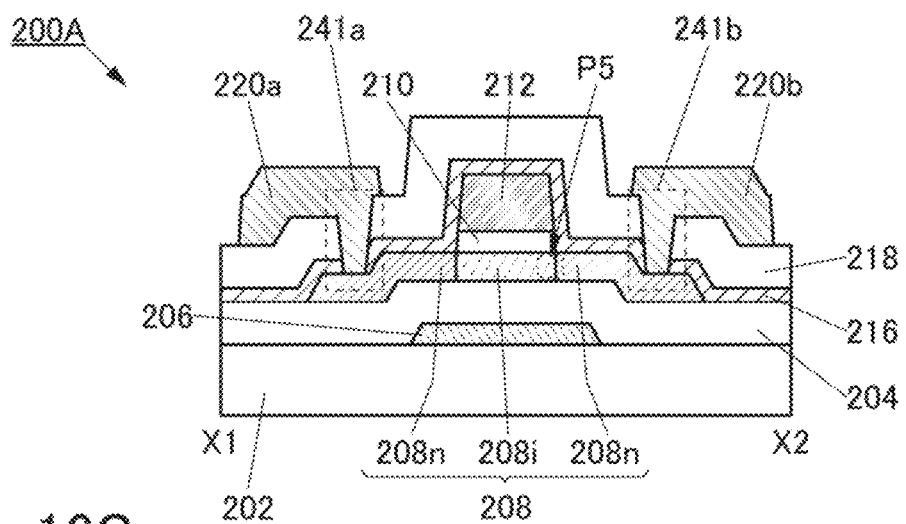
Figure 16C:
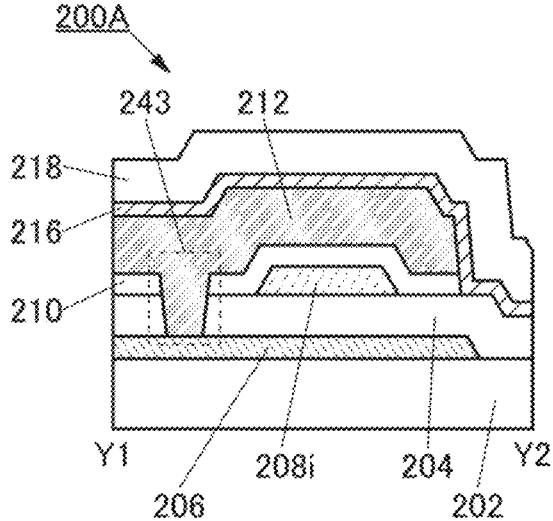
Figure 16D:
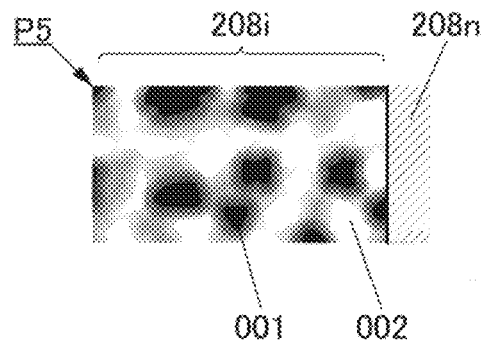

FIG. 16A is a top view of a transistor 200A that is a semiconductor device of one embodiment of the present invention. FIG. 16B is a cross-sectional view taken along dashed-dotted line X1-X2 in FIG. 16A. FIG. 16C is a cross-sectional view taken along dashed-dotted line Y1-Y2 in FIG. 16A. FIG. 16D is an enlarged cross-sectional conceptual view of a region P5 illustrated in FIG. 16B.

The transistor 200A illustrated in FIGS. 16A to 16C has what is called a top-gate structure.

The transistor 200A includes a conductive film 206 over a substrate 202, an insulating film 204 over the substrate 202 and the conductive film 206, a metal oxide 208 over the insulating film 204, an insulating film 210 over the metal oxide 208, a conductive film 212 over the insulating film 210, and an insulating film 216 over the insulating film 204, the metal oxide 208, and the conductive film 212.

As the metal oxide 208, the metal oxide of one embodiment of the present invention is preferably used.

The metal oxide 208 includes a region 208i overlapping with the conductive film 212 and being in contact with the insulating film 210 and regions 208n overlapping with the insulating film 216. The regions 208n each include a region having a higher carrier density than the region 208i. That is, the metal oxide 208 includes a plurality of regions having different carrier densities. In addition, the regions 208n can be referred to as a source region and a drain region.

Here, a connection between the region 208i and the region 208n is described with reference to FIG. 16D.

As illustrated in the region P5 in FIG. 16D, a side surface of the region 208i is in contact with a side surface of the region 208n; thus, contact resistance can be reduced. In addition, the region 208i of the metal oxide 208 has the CAC composition in FIG. 8, and the region 002 included in the CAC composition, i.e., a region with a high conductivity is in contact with the region 208n, i.e., the source region; thus, contact resistance can be further reduced. Although not illustrated, a connection between the other side surface of the region 208i and a side surface of the region 208n is similar to that in the region P5.

The metal oxide of one embodiment of the present invention includes a highly conductive region and the contact resistance between the metal oxide and the source region or the drain region is reduced. Thus, the field-effect mobility of the transistor including the metal oxide can be increased.

The regions 208n are also in contact with the insulating film 216. The insulating film 216 contains nitrogen or hydrogen. Thus, nitrogen or hydrogen in the insulating film 216 is added to the regions 208n. The regions 208n have an increased carrier density owing to the addition of nitrogen or hydrogen from the insulating film 216.

The transistor 200A may further include an insulating film 218 over the insulating film 216, a conductive film 220a electrically connected to the region 208n through an opening 241a provided in the insulating films 216 and 218, and a conductive film 220b electrically connected to the region 208n through an opening 241b provided in the insulating films 216 and 218.

As illustrated in FIG. 16C, an opening 243 is provided in the insulating films 204 and 210. The conductive film 206 is electrically connected to the conductive film 212 through the opening 243. Thus, the same potential is applied to the conductive film 206 and the conductive film 212. Different potentials may be applied to the conductive film 206 and the conductive film 212 without providing the opening 243.

Note that the conductive film 206 functions as a first gate electrode (also referred to as a bottom-gate electrode), the conductive film 212 functions as a second gate electrode (also referred to as a top-gate electrode), the insulating film 204 functions as a first gate insulating film, and the insulating film 210 functions as a second gate insulating film.

In this manner, the transistor 200A in FIGS. 16A to 16C has a structure in which conductive films functioning as gate electrodes are provided over and under the metal oxide 208. As in the transistor 200A, a semiconductor device of one embodiment of the present invention may have two or more gate electrodes.

As illustrated in FIG. 16C, the metal oxide 208 faces the conductive film 206 functioning as a first gate electrode and the conductive film 212 functioning as a second gate electrode and is positioned between the two conductive films functioning as the gate electrodes.

Furthermore, the length of the conductive film 212 in the channel width direction is larger than the length of the metal oxide 208 in the channel width direction. In the channel width direction, the whole metal oxide 208 is covered with the conductive film 212 with the insulating film 210 provided therebetween. Since the conductive film 212 is connected to the conductive film 206 through the opening 243 provided in the insulating films 204 and 210, a side surface of the metal oxide 208 in the channel width direction faces the conductive film 212 with the insulating film 210 provided therebetween.

In other words, in the channel width direction of the transistor 200A, the conductive films 206 and 212 are connected to each other through the opening 243 provided in the insulating films 204 and 210, and the conductive films 206 and 212 surround the metal oxide 208 with the insulating films 204 and 210 positioned therebetween. That is, the transistor 200A has the S-channel structure described above.

<2-5. Structure Example 4 of Semiconductor Device>

Next, modification examples of the transistor 200A shown in FIGS. 16A to 16C are described with reference to FIGS. 17A to 17D, FIGS. 18A to 18D, and FIGS. 19A to 19D.

First, description is made with reference to FIGS. 17A to 17D.

Figure 17A:
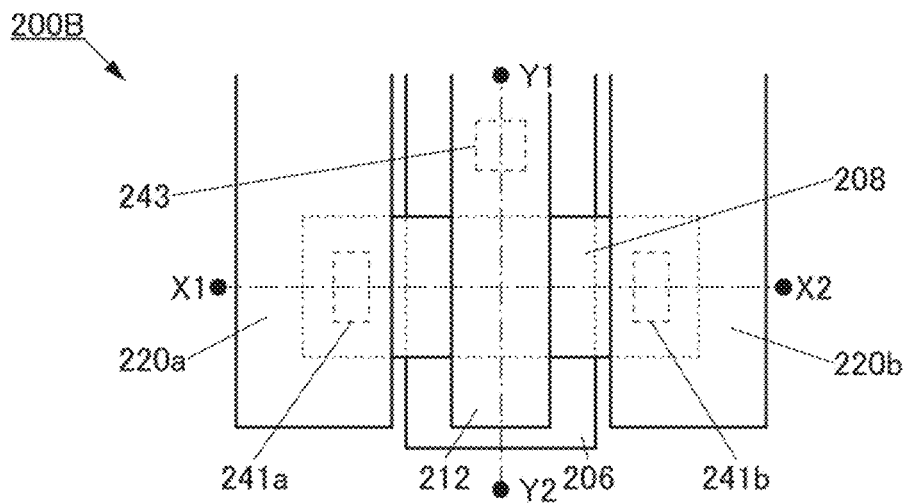
FIGS. 17A to 17D are a top view, cross-sectional views, and a cross-sectional conceptual view illustrating one embodiment of a semiconductor device.
Figure 17B:
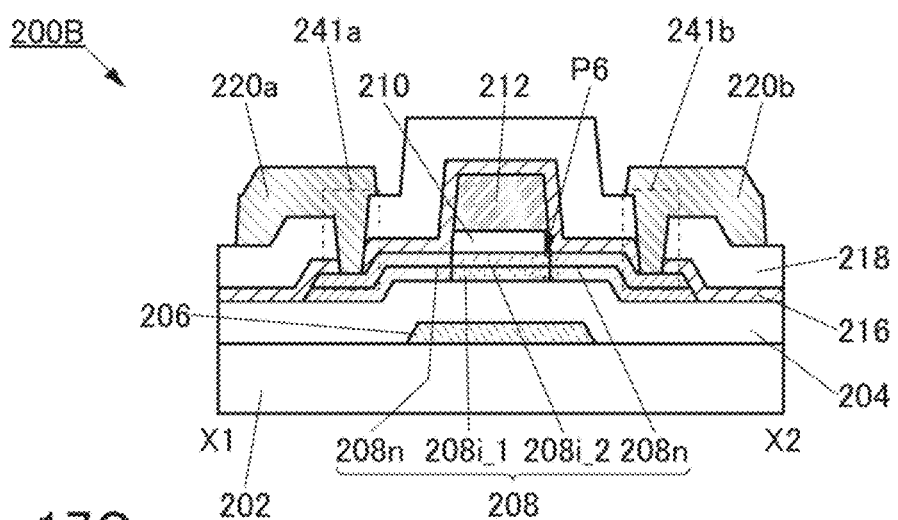
Figure 17C:
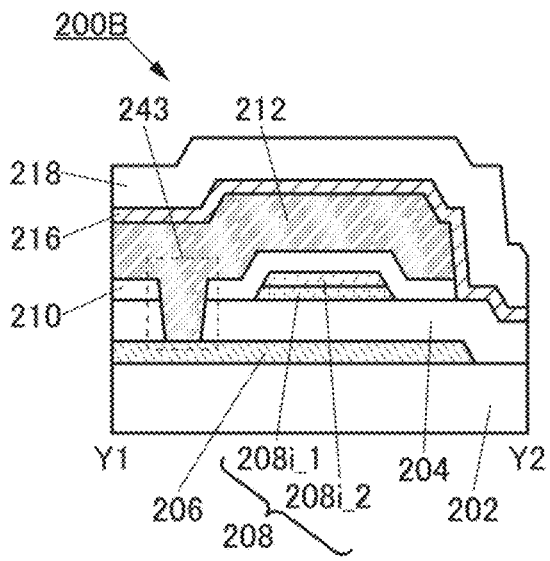
Figure 17D:
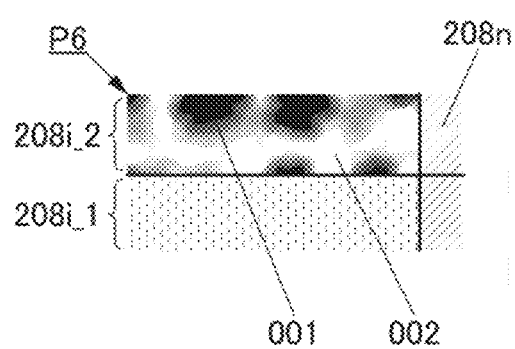

FIGS. 17A to 17C are a top view and cross-sectional views of a transistor 200B, which is a modification example of the transistor 200A in FIGS. 16A to 16C. FIG. 17D is an enlarged cross-sectional conceptual view of a region P6 illustrated in FIG. 17B.

In the transistor 200B in FIGS. 17A to 17C, the metal oxide 208, which is also included in the transistor 200A in FIGS. 16A to 16C, has a two-layer structure. Specifically, the metal oxide 208 of the transistor 200B includes a region 208i_1, a region 208i_2 over the region 208i_1, and regions 208n overlapping with the insulating film 216.

For example, for the region 208i_2 included in the metal oxide 208, the metal oxide of one embodiment of the present invention can be used.

As illustrated in the region P6 in FIG. 17D, a side surface of the region 208i_2 is in contact with a side surface of the region 208n; thus, contact resistance can be reduced. In addition, the region 208i_2 of the metal oxide 208 has the CAC composition in FIG. 8, and the region 002 included in the CAC composition, i.e., a region with a high conductivity is in contact with the region 208n, i.e., the source region; thus, contact resistance can be further reduced. Although not illustrated, a connection between the other side surface of the region 208i_2 and a side surface of the region 208n is similar to that in the region P6.

Next, description is made with reference to FIGS. 18A to 18D.

Figure 18A:
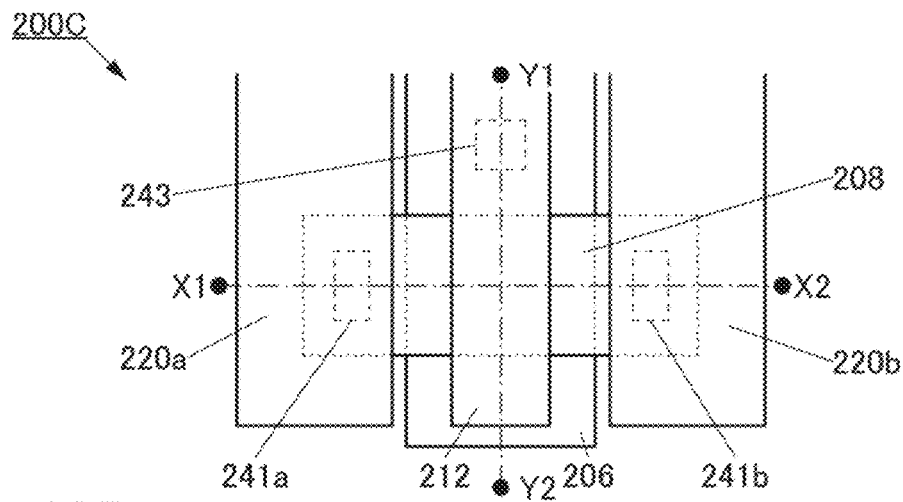
FIGS. 18A to 18D are a top view, cross-sectional views, and a cross-sectional conceptual view illustrating one embodiment of a semiconductor device.
Figure 18B:
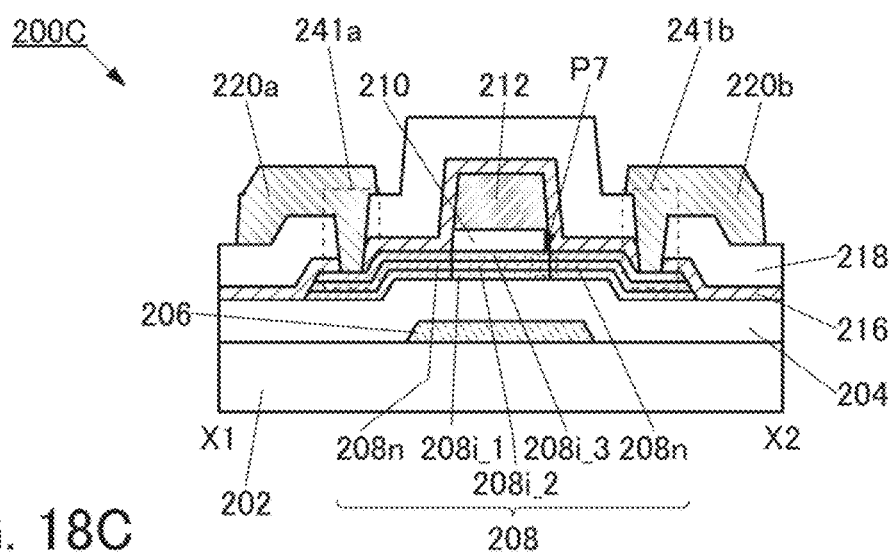
Figure 18C:
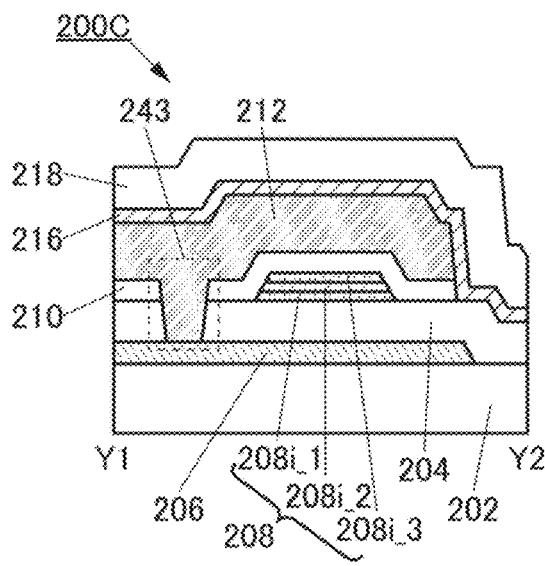
Figure 18D:
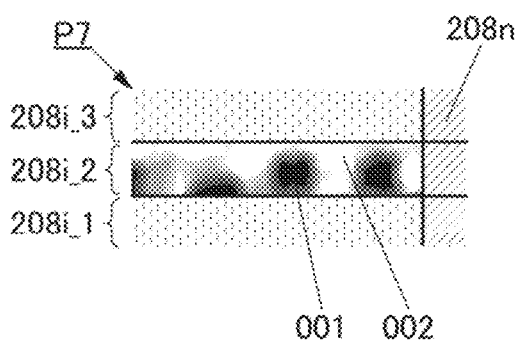

FIGS. 18A to 18C are a top view and cross-sectional views of a transistor 200C, which is a modification example of the transistor 200A in FIGS. 16A to 16C. FIG. 18D is an enlarged cross-sectional conceptual view of a region P7 illustrated in FIG. 18B.

In the transistor 200C in FIGS. 18A to 18C, the metal oxide 208, which is also included in the transistor 200A in FIGS. 16A to 16C, has a three-layer structure. Specifically, the metal oxide 208 of the transistor 200C includes the region 208i_1, the region 208i_2 over the region 208i_1, a region 208i_3 over the region 208i_2, and the regions 208n overlapping with the insulating film 216.

For example, for the region 208i_2 included in the metal oxide 208, the metal oxide of one embodiment of the present invention can be used.

As illustrated in the region P7 in FIG. 18D, a side surface of the region 208i_2 is in contact with a side surface of the region 208n; thus, contact resistance can be reduced. In addition, the region 208i_2 of the metal oxide 208 has the CAC composition in FIG. 8, and the region 002 included in the CAC composition, i.e., a region with a high conductivity is in contact with the region 208n, i.e., the source region; thus, contact resistance can be further reduced. Although not illustrated, a connection between the other side surface of the region 208i_2 and a side surface of the region 208n is similar to that in the region P7.

Next, description is made with reference to FIGS. 19A to 19D.

Figure 19A:
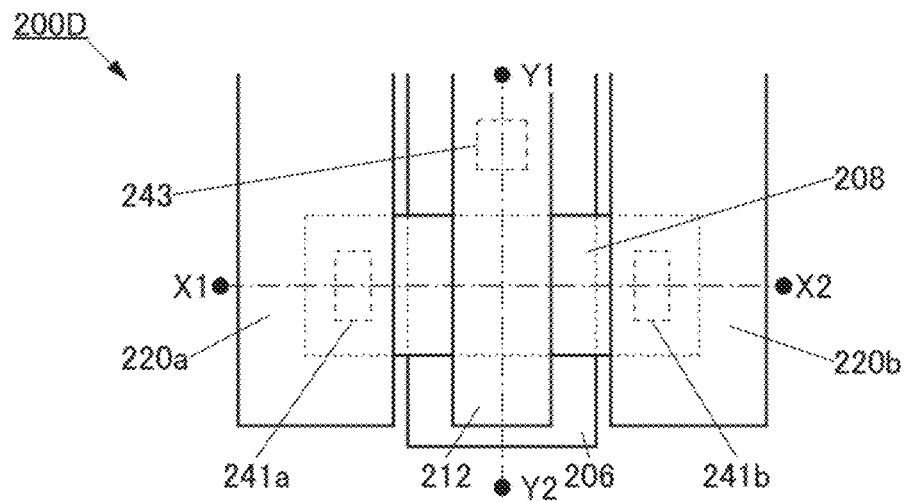
FIGS. 19A to 19D are a top view, cross-sectional views, and a cross-sectional conceptual view illustrating one embodiment of a semiconductor device.
Figure 19B:
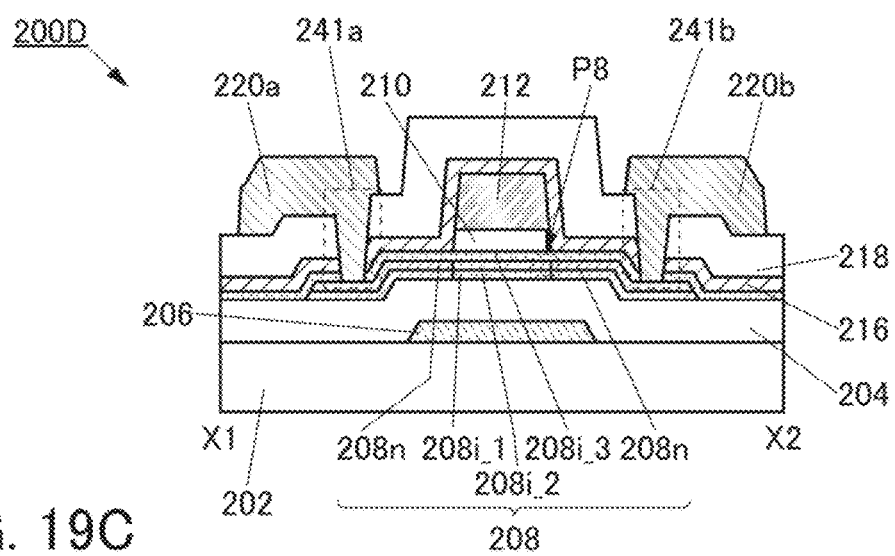
Figure 19C:
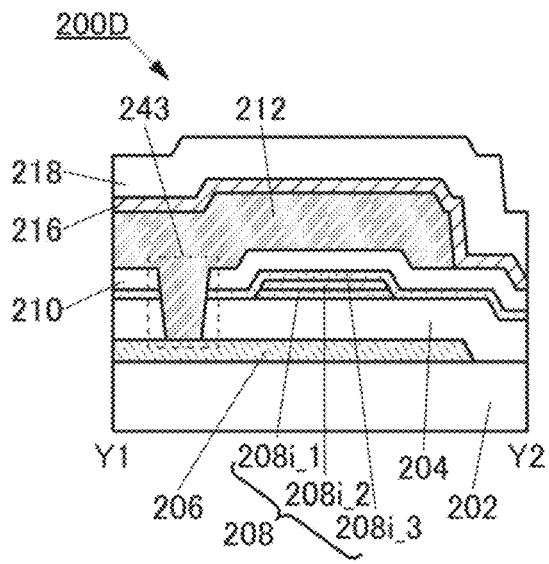
Figure 19D:
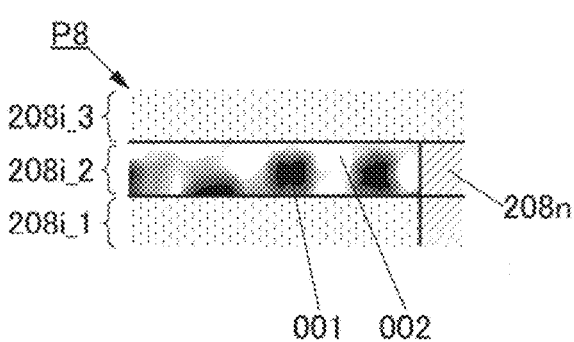

FIGS. 19A to 19C are a top view and cross-sectional views of a transistor 200D, which is a modification example of the transistor 200A in FIGS. 16A to 16C. FIG. 19D is an enlarged cross-sectional conceptual view of a region P8 illustrated in FIG. 19B.

In the transistor 200D in FIGS. 19A to 19C, the metal oxide 208, which is also included in the transistor 200A in FIGS. 16A to 16C, has a three-layer structure. Specifically, the metal oxide 208 of the transistor 200D includes the region 208i_1, the region 208i_2 over the region 208i_1, the region 208i_3 over the region 208i_2, and the regions 208n overlapping with the insulating film 216.

For example, as the region 208i_2 included in the metal oxide 208, the metal oxide of one embodiment of the present invention can be used. As illustrated in the region P8, a side surface of the region 208i_2 is in contact with a side surface of the region 208n; thus, contact resistance can be reduced. In addition, the region 208i_2 of the metal oxide 208 has the CAC composition in FIG. 8, and the region 002 included in the CAC composition, i.e., a region with a high carrier density is in contact with the region 208n, i.e., the source region; thus, contact resistance can be further reduced. Although not illustrated, a connection between the other side surface of the region 208i_2 and a side surface of the region 208n is similar to that in the region P8.

The metal oxide 208 included in the transistor 200D is different from the metal oxide 208 included in the transistor 200C in the shape of the region 208i_3. Specifically, in the metal oxide 208 included in the transistor 200D, side surfaces of the region 208i_1 and side surfaces of the region 208i_2 are covered with the region 208i_3. With the shape, the side surfaces of the region 208i_1 and the side surfaces of the region 208i_2 are not in contact with the insulating film 210. With the structure, the impurities can be prevented from entering the regions 208i_1 and 208i_2, particularly the region 208i_2; thus, a highly reliable semiconductor device can be provided.

As illustrated in FIGS. 17A to 17D, FIGS. 18A to 18D, and FIGS. 19A to 19D, in the transistor of one embodiment of the present invention, the metal oxide preferably has a stacked-layer structure. Note that for the band structure of the metal oxide which has a stacked-layer structure, <2-3. Band structure> can be referred to.

<2-6. Components of Semiconductor Device>

Components of the semiconductor devices of this embodiment will be described below in detail.

[Substrate]

There is no particular limitation on a material and the like of the substrates 102 and 202 as long as the material has heat resistance high enough to withstand at least heat treatment to be performed later. For example, a glass substrate, a ceramic substrate, a quartz substrate, a sapphire substrate, or the like may be used as the substrates 102 and 202. Alternatively, a single crystal semiconductor substrate or a polycrystalline semiconductor substrate made of silicon or silicon carbide, a compound semiconductor substrate made of silicon germanium or the like, an SOI substrate, or the like can be used as the substrates 102 and 202. Further alternatively, any of these substrates provided with a semiconductor element may be used as the substrates 102 and 202. In the case where a glass substrate is used as the substrates 102 and 202, a large-area glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrates 102 and 202, and the transistor may be provided directly on the flexible substrate. Further alternatively, a separation layer may be provided between the transistor and the substrate 102 or 202. The separation layer can be used when part or the whole of a semiconductor device formed over the separation layer is completed and is then separated from the substrate 102 or 202 and transferred to another substrate. In such a case, the transistor can be transferred to a substrate having low heat resistance or a flexible substrate as well.

[Conductive Film]

The conductive films 106 and 206 each functioning as a first gate electrode, the conductive films 112a and 220a each functioning as a source electrode, the conductive films 112b and 220b each functioning as a drain electrode, the conductive film 112c functioning as a connection electrode, the conductive films 120a and 212 each functioning as a second gate electrode, and the conductive film 120b functioning as a pixel electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 106, 112a, 112b, 112c, 120a, 120b, 206, 220a, 220b, and 212 can be formed using an oxide conductor such as an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, or an oxide including indium, gallium, and zinc.

In particular, the above-described oxide conductor can be favorably used for the conductive films 120a and 212. Note that in this specification and the like, the oxide conductor may be referred to as OC. For example, the oxide conductor is obtained in the following manner. Oxygen vacancies are formed in an oxide semiconductor, and then hydrogen is added to the oxygen vacancies, so that a donor level is formed in the vicinity of the conduction band. As a result, the conductivity of the oxide semiconductor is increased, so that the oxide semiconductor becomes a conductor. An oxide semiconductor having become a conductor can be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level on an oxide conductor is small, and the oxide conductor has a visible light transmitting property comparable to that of an oxide semiconductor.

A Cu—X alloy film (X is Mn, Ni, Cr, Fe, Co, Mo, Ta, or Ti) may be used as the conductive films 106, 112a, 112b, 112c, 120a, 120b, 206, 220a, 220b, and 212. Use of a Cu—X alloy film enables the manufacturing cost to be reduced because a wet etching process can be used in the processing.

In particular, the above-described Cu—X alloy film can be favorably used as the conductive films 112a, 112b, 220a, and 220b. Specifically, the Cu—X alloy film is preferably a Cu—Mn alloy film.

[Insulating Film Functioning as First Gate Insulating Film]

As the insulating films 104 and 204 each functioning as a first gate insulating film of the transistor, an insulating layer including at least one of the following films formed by a plasma-enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that an insulating film of a single layer formed using a material selected from the above or an insulating film of two or more layers may be used as the insulating films 104 and 204.

Note that the insulating films that are in contact with the metal oxides 108 and 208 each functioning as a channel region of the transistor are preferably oxide insulating films and further preferably include regions each including oxygen in excess of the stoichiometric composition (oxygen-excess regions).

Note that one embodiment of the present invention is not limited to the above structure, and a nitride insulating film may be used as the insulating films that are in contact with the metal oxides 108 and 208. In one example, a silicon nitride film is formed and a surface of the silicon nitride film is oxidized by performing oxygen plasma treatment or the like on the surface of the silicon nitride film. In the case where oxygen plasma treatment or the like is performed on the surface of the silicon nitride film, the surface of the silicon nitride film may be oxidized at the atomic level. For this reason, an oxide film might not be observed by cross-sectional observation or the like of the transistor. That is, in the case of performing cross-sectional observation of the transistor, the silicon nitride film and the metal oxide may be observed to be in contact with each other in some cases.

Note that the silicon nitride film has a higher dielectric constant than a silicon oxide film and needs a larger thickness for capacitance equivalent to that of the silicon oxide film. Thus, when the silicon nitride film is included as the gate insulating film of the transistor, the thickness of the insulating film can be increased. This makes it possible to suppress a decrease in withstand voltage of the transistor and furthermore to increase the withstand voltage, thereby reducing electrostatic discharge damage to the transistor.

In the case where hafnium oxide is used for the insulating films 104 and 204, the following effect is attained. Hafnium oxide has a higher dielectric constant than silicon oxide and silicon oxynitride. Therefore, by using hafnium oxide, the thicknesses of the insulating films 104 and 204 can be made large as compared with the case where silicon oxide is used; thus, leakage current due to tunnel current can be reduced. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

[Metal oxide]

As the metal oxides 108 and 208, the metal oxide of one embodiment of the present invention described in Embodiment 1 can be used.

The energy gap of each of the metal oxides 108 and 208 is 2 eV or more, preferably 2.5 eV or more, further preferably 3 eV or more. With the use of a metal oxide having such a wide energy gap, the off-state current of the transistor can be reduced.

The thickness of each of the metal oxides 108 and 208 is greater than or equal to 3 nm and less than or equal to 200 nm, preferably greater than or equal to 3 nm and less than or equal to 100 nm, further preferably greater than or equal to 3 nm and less than or equal to 50 nm.

Furthermore, in order to obtain required semiconductor characteristics of a transistor, it is preferable that the carrier density, the impurity concentration, the defect density, the atomic ratio of a metal element to oxygen, the density, and the like of each of the metal oxides 108 and 208 be set to be appropriate.

[Insulating Film Functioning as Second Gate Insulating Film]

The insulating films 114, 116 and 210 each function as a second gate insulating film of the transistor. In addition, the insulating films 114, 116, and 210 each have a function of supplying oxygen to the metal oxide 108 or 208. That is, the insulating films 114, 116, and 210 contain oxygen. The insulating film 114 is an insulating film that is permeable to oxygen. The insulating film 114 also functions as a film that relieves damage to the metal oxide 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that transmits the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film that can transmit oxygen is formed as the insulating film 114, oxygen released from the insulating film 116 provided over the insulating film 114 can be moved to the metal oxide 108 through the insulating film 114.

Note that the insulating film 114 can be formed using an oxide insulating film having a low density of states due to nitrogen oxide. Note that the density of states due to nitrogen oxide can be formed between the energy of the valence band maximum (Ev_os) and the energy of the conduction band minimum (Ec_os) of the metal oxide. A silicon oxynitride film that releases less nitrogen oxide, an aluminum oxynitride film that releases less nitrogen oxide, or the like can be used as the above oxide insulating film.

Note that a silicon oxynitride film that releases less nitrogen oxide is a film of which the amount of released ammonia is larger than the amount of released nitrogen oxide in thermal desorption spectroscopy (TDS); the amount of released ammonia is typically greater than or equal to $1\times10^{18}$ cm$^{-3}$ and less than or equal to $5\times10^{19}$ cm$^{-3}$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The level is positioned in the energy gap of the metal oxide 108.

Therefore, when nitrogen oxide is diffused to the interface between the insulating film 114 and the metal oxide 108, an electron is in some cases trapped by the level on the insulating film 114 side. As a result, the trapped electron remains in the vicinity of the interface between the insulating film 114 and the metal oxide 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interface between the insulating film 114 and the metal oxide 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 corresponds to the sum of the spin densities of signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6\times10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating films 116 and 210 are preferably formed using an oxide insulating film whose oxygen content is higher than that in the stoichiometric composition. Part of oxygen is released by heating from the oxide insulating film whose oxygen content is higher than that in the stoichiometric composition. The oxide insulating film whose oxygen content is higher than that in the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$ in TDS. Note that the surface temperature of the film in the TDS is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating films 116 and 210.

It is preferable that the number of defects in the insulating films 116 and 210 be small, and typically the spin density corresponding to a signal that appears at g=2.001 due to a dangling bond of silicon be lower than $1.5\times10^{18}$ spins/cm$^3$, preferably lower than or equal to $1\times10^{18}$ spins/cm$^3$ by ESR measurement. Note that the insulating film 116 is provided more apart from the metal oxide 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, one embodiment of the present invention is not limited thereto. For example, a single-layer structure of the insulating film 114 or a stacked-layer structure of three or more layers may be used.

[Insulating Film Functioning as Protective Insulating Film]

The insulating films 118 and 216 each function as a protective insulating film for the transistor.

The insulating films 118 and 216 contain either hydrogen or nitrogen, or both. Alternatively, the insulating films 118 and 216 contain nitrogen and silicon. The insulating films 118 and 216 each have a function of blocking oxygen, hydrogen, water, alkali metal, alkaline earth metal, and the like. It is possible to prevent outward diffusion of oxygen from the metal oxides 108 and 208, outward diffusion of oxygen included in the insulating films 114, 116, and 210, and entry of hydrogen, water, or the like into the metal oxides 108 and 208 from the outside by providing the insulating films 118 and 216.

As the insulating films 118 and 216, a nitride insulating film can be used, for example. The nitride insulating film is formed using silicon nitride, silicon nitride oxide, aluminum nitride, aluminum nitride oxide, or the like.

Although the above-described variety of films such as the conductive films, the insulating films, the metal oxide, and the metal film can be formed by a sputtering method or a PECVD method, they may be formed by another method, e.g., a thermal chemical vapor deposition (CVD) method. Examples of the thermal CVD method include a metal organic chemical vapor deposition (MOCVD) method, an atomic layer deposition (ALD) method, and the like.

The thermal CVD method has an advantage that no defect due to plasma damage is generated since it does not utilize plasma for forming a film.

Deposition by the thermal CVD method may be performed in such a manner that a source gas and an oxidizer are supplied to a chamber at a time while the pressure in the chamber is set to an atmospheric pressure or a reduced pressure, and the source gas and the oxidizer react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated.

The variety of films such as the conductive films, the insulating films, and the metal oxide in this embodiment can be formed by a thermal CVD method such as an MOCVD method or an ALD method.

<2-7. Method for Manufacturing Semiconductor Device>

Next, a method for manufacturing the transistor 200C that is a semiconductor device of one embodiment of the present invention is described with reference to FIGS. 20A to 20D, FIGS. 21A to 21C, and FIGS. 22A to 22C.

FIGS. 20A to 20D, FIGS. 21A to 21C, and FIGS. 22A to 22C are cross-sectional views illustrating a method for manufacturing a semiconductor device. In FIGS. 20A to 20D, FIGS. 21A to 21C, and FIGS. 22A to 22C, cross-sectional views in the channel length direction are on the left side, and cross-sectional views in the channel width direction are on the right side.

First, the conductive film 206 is formed over the substrate 202. Next, the insulating film 204 is formed over the substrate 202 and the conductive film 206, and a first metal oxide, a second metal oxide, and a third metal oxide are formed over the insulating film 204. Then, the first metal oxide, the second metal oxide, and the third metal oxide are processed into an island shape, whereby a metal oxide 208_1a, a metal oxide 208_2a, and a metal oxide 208_3a are formed (see FIG. 20A).

The conductive film 206 can be formed using a material selected from the above-mentioned materials. In this embodiment, for the conductive film 206, a stack including a 50-nm-thick tungsten film and a 400-nm-thick copper film is formed with a sputtering apparatus.

To process a conductive film to be the conductive film 206, a wet etching method and/or a dry etching method can be used. In this embodiment, in the processing of the conductive film into the conductive film 206, the copper film is etched by a wet etching method, and then the tungsten film is etched by a dry etching method.

The insulating film 204 can be formed by a sputtering method, a CVD method, an evaporation method, a pulsed laser deposition (PLD) method, a printing method, a coating method, or the like as appropriate. In this embodiment, as the insulating film 204, a 400-nm-thick silicon nitride film and a 50-nm-thick silicon oxynitride film are formed with a PECVD apparatus.

After the insulating film 204 is formed, oxygen may be added to the insulating film 204. As oxygen added to the insulating film 204, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating film 204, and then oxygen may be added to the insulating film 204 through the film.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulating film 204 can be increased.

The metal oxide 208_1a, the metal oxide 208_2a, and the metal oxide 208_3a are preferably formed successively in a vacuum using a sputtering apparatus. By successive formation of the metal oxide 208_1a, the metal oxide 208_2a, and the metal oxide 208_3a in a vacuum using a sputtering apparatus, impurities (such as hydrogen and water) that can be attached to each interface can be reduced.

A film to be the metal oxide 208_2a is deposited by a method using the sputtering target 10.

The metal oxide 208_2a is preferably formed with a lower oxygen partial pressure than the metal oxide 208_1a and/or the metal oxide 208_3a.

In forming the metal oxide 208_1a, the metal oxide 208_2a, and the metal oxide 208_3a, an inert gas (such as a helium gas, an argon gas, or a xenon gas) may be mixed into the oxygen gas. Note that the proportion of the oxygen gas in the whole deposition gas (hereinafter also referred to as oxygen flow rate ratio) in forming the metal oxide 208_1a is higher than or equal to 70% and lower than or equal to 100%, preferably higher than or equal to 80% and lower than or equal to 100%, further preferably higher than or equal to 90% and lower than or equal to 100%. The oxygen flow rate ratio in forming the metal oxide 208_2a is higher than 0% and lower than or equal to 30%, preferably higher than or equal to 5% and lower than or equal to 15%. The oxygen flow rate ratio in forming the metal oxide 208_3a is higher than or equal to 70% and lower than or equal to 100%, preferably higher than or equal to 80% and lower than or equal to 100%, further preferably higher than or equal to 90% and lower than or equal to 100%.

Note that the metal oxide 208_2a may be formed at a lower substrate temperature than the metal oxide 208_1a and/or the metal oxide 208_3a.

Specifically, the metal oxide 208_2a is formed at a substrate temperature higher than or equal to room temperature and lower than 150° C., preferably higher than or equal to room temperature and lower than or equal to 140° C. In addition, the metal oxide 208_1a and the metal oxide 208_3a are formed at a substrate temperature higher than or equal to room temperature and lower than or equal to 300° C., preferably higher than or equal to room temperature and lower than or equal to 200° C. Note that the substrate temperatures when the metal oxides 208_1a, 208_2a, and 208_3a are formed are preferably the same (e.g., higher than or equal to room temperature and lower than 150° C.) because the productivity is increased.

Under the above-described conditions, the metal oxide 208_2a can have a region with lower crystallinity than the metal oxides 208_1a and 208_3a.

The thickness of the metal oxide 208_1a is greater than or equal to 1 nm and less than 20 nm, preferably greater than or equal to 5 nm and less than or equal to 10 nm. The thickness of the metal oxide 208_2a is greater than or equal to 20 nm and less than or equal to 100 nm, preferably greater than or equal to 20 nm and less than or equal to 50 nm. The thickness of the metal oxide 208_3a is greater than or equal to 1 nm and less than 20 nm, preferably greater than or equal to 5 nm and less than or equal to 15 nm.

Note that the metal oxide 208 is formed while being heated, so that the crystallinity of the metal oxide 208 can be increased. On the other hand, in the case where a large-sized glass substrate (e.g., the 6th generation to the 10th generation) is used as the substrate 202 and the metal oxide 208 is formed at a substrate temperature higher than or equal to 200° C. and lower than or equal to 300° C., the substrate 202 might be changed in shape (distorted or warped). Therefore, in the case where a large-sized glass substrate is used, the change in the shape of the glass substrate can be suppressed by forming the metal oxide 208 at a substrate temperature higher than or equal to 100° C. and lower than 200° C.

In addition, increasing the purity of the sputtering gas is necessary. For example, when a gas which is highly purified to have a dew point of −40° C. or lower, preferably −80° C. or lower, further preferably −100° C. or lower, still further preferably −120° C. or lower, is used as the sputtering gas, i.e., the oxygen gas or the argon gas, entry of moisture or the like into the metal oxide can be minimized.

In the case where the metal oxide is deposited by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the metal oxide, as much as possible. In particular, the partial pressure of gas molecules corresponding to $H_2O$ (gas molecules corresponding to m/z=18) in the chamber in the standby mode of the sputtering apparatus is preferably lower than or equal to $1 \times 10^{-4}$ Pa, further preferably lower than or equal to $5 \times 10^{-5}$ Pa.

To process the first metal oxide, the second metal oxide, and the third metal oxide into the metal oxide 208_1a, the metal oxide 208_2a, and the metal oxide 208_3a, a wet etching method and/or a dry etching method can be used.

After the metal oxide 208_1a, the metal oxide 208_2a, and the metal oxide 208_3a are formed, the metal oxide 208_1a, the metal oxide 208_2a, and the metal oxide 208_3a may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Alternatively, the heat treatment may be performed in an inert gas atmosphere first, and then in an oxygen atmosphere. It is preferable that the above inert gas atmosphere and the above oxygen atmosphere not contain hydrogen, water, or the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the metal oxide while it is heated or by performing heat treatment after the deposition of the metal oxide, the hydrogen concentration in the metal oxide, which is measured by SIMS, can be $5 \times 10^{19}$ atoms/cm$^3$ or lower, $1 \times 10^{19}$ atoms/cm$^3$ or lower, $5 \times 10^{18}$ atoms/cm$^3$ or lower, $1 \times 10^{18}$ atoms/cm$^3$ or lower, $5 \times 10^{17}$ atoms/cm$^3$ or lower, or $1 \times 10^{16}$ atoms/cm$^3$ or lower.

Figure 20A:
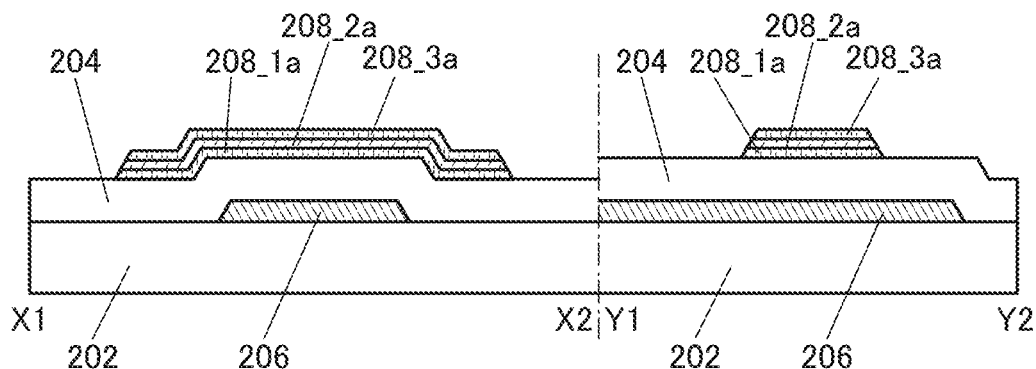
FIGS. 20A to 20D are cross-sectional views illustrating an example of a manufacturing process of a semiconductor device.
Figure 20B:
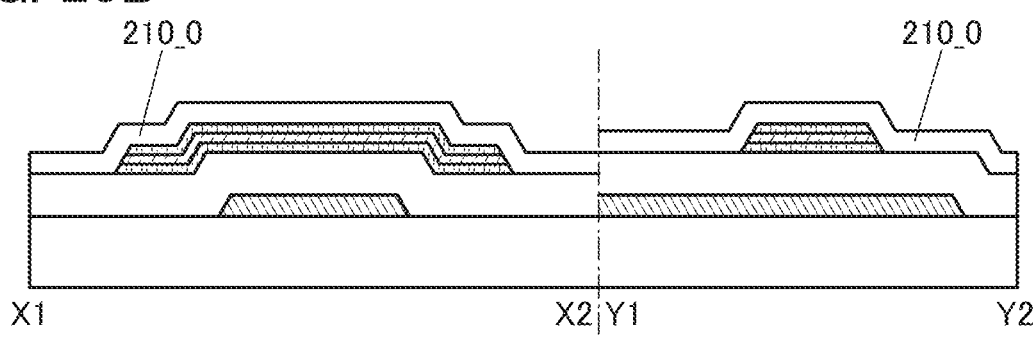

Next, an insulating film 210_0 is formed over the insulating film 204 and the metal oxide 208 (see FIG. 20B).

For the insulating film 210_0, a silicon oxide film, a silicon oxynitride film, or a silicon nitride film can be formed with a plasma-enhanced chemical vapor deposition apparatus (also referred to as a PECVD apparatus or simply a plasma CVD apparatus). In this case, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having few defects can be formed as the insulating film 210_0 with the PECVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa or lower than or equal to 50 Pa.

As the insulating film 210_0, a dense silicon oxide film or a dense silicon oxynitride film can be formed under the following conditions: the substrate placed in a vacuum-evacuated treatment chamber of the PECVD apparatus is held at a temperature higher than or equal to 280° C. and lower than or equal to 400° C.; the pressure in the treatment chamber into which a source gas is introduced is set to be higher than or equal to 20 Pa and lower than or equal to 250 Pa, preferably higher than or equal to 100 Pa and lower than or equal to 250 Pa; and a high-frequency power is supplied to an electrode provided in the treatment chamber.

The insulating film 210_0 may be formed by a PECVD method using a microwave. A microwave refers to a wave in the frequency range of 300 MHz to 300 GHz. In the case of using a microwave, electron temperature and electron energy are low. Furthermore, in supplied power, the proportion of power used for acceleration of electrons is low, and therefore, much more power can be used for dissociation and ionization of molecules. Thus, plasma with a high density (high-density plasma) can be excited. This method causes little plasma damage to the deposition surface or a deposit, so that the insulating film 210_0 having few defects can be formed.

In this embodiment, as the insulating film 210_0, a 100-nm-thick silicon oxynitride film is formed with the PECVD apparatus.

Figure 20C:
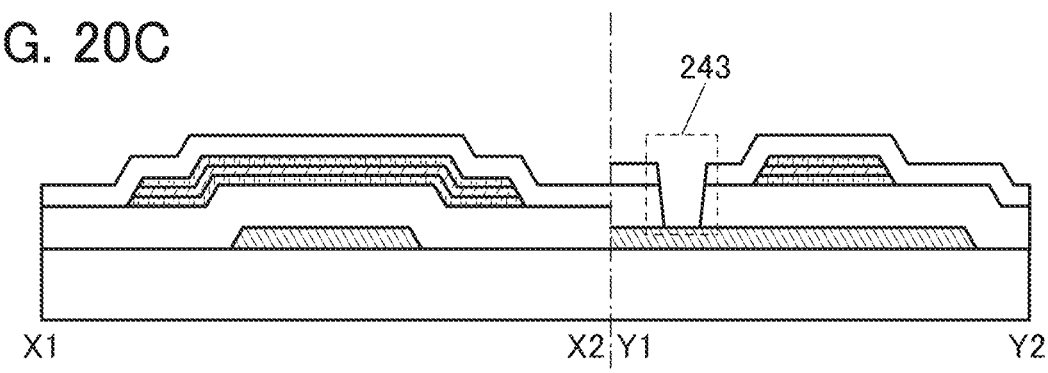

Subsequently, a mask is formed by lithography in a desired position over the insulating film 210_0, and then the insulating film 210_0 and the insulating film 204 are partly etched, so that the opening 243 reaching the conductive film 206 is formed (see FIG. 20C).

To form the opening 243, a wet etching method and/or a dry etching method can be used. In this embodiment, the opening 243 is formed by a dry etching method.

Next, a conductive film 212_0 is formed over the conductive film 206 and the insulating film 210_0 so as to cover the opening 243. In the case where a metal oxide film is used as the conductive film 212_0, for example, oxygen might be added to the insulating film 210_0 during the formation of the conductive film 212_0 (see FIG. 20D).

Figure 20D:
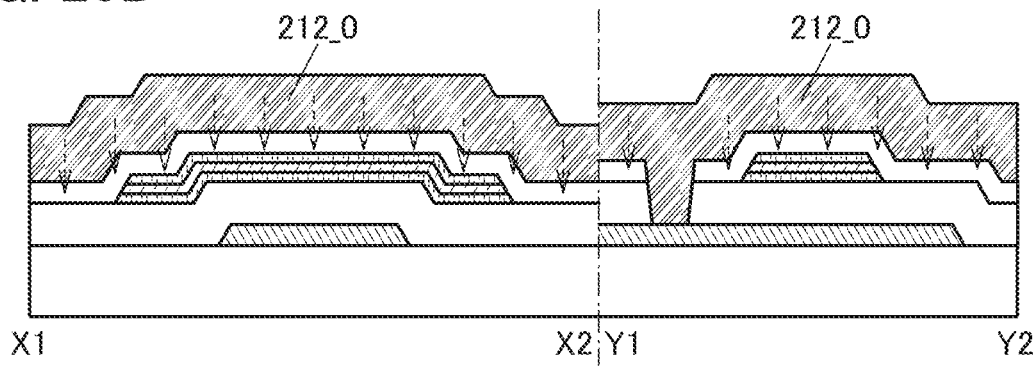

In FIG. 20D, oxygen added to the insulating film 210_0 is schematically shown by arrows. Furthermore, the conductive film 212_0 formed to cover the opening 243 is electrically connected to the conductive film 206.

In the case where a metal oxide film is used as the conductive film 212_0, the conductive film 212_0 is preferably formed by a sputtering method in an atmosphere containing an oxygen gas. Formation of the conductive film 212_0 in an atmosphere containing an oxygen gas allows suitable addition of oxygen to the insulating film 210_0. Note that a method for forming the conductive film 212_0 is not limited to a sputtering method, and another method such as an ALD method may be used.

In this embodiment, a 100-nm-thick In—Ga—Zn oxide film (In:Ga:Zn=4:2:4.1 (atomic ratio)) is formed as the conductive film 212_0 by a sputtering method. Oxygen addition treatment may be performed on the insulating film 210_0 before or after the formation of the conductive film 212_0. The oxygen addition treatment can be performed similarly to the oxygen addition treatment that can be performed after the formation of the insulating film 204.

Figure 21A:
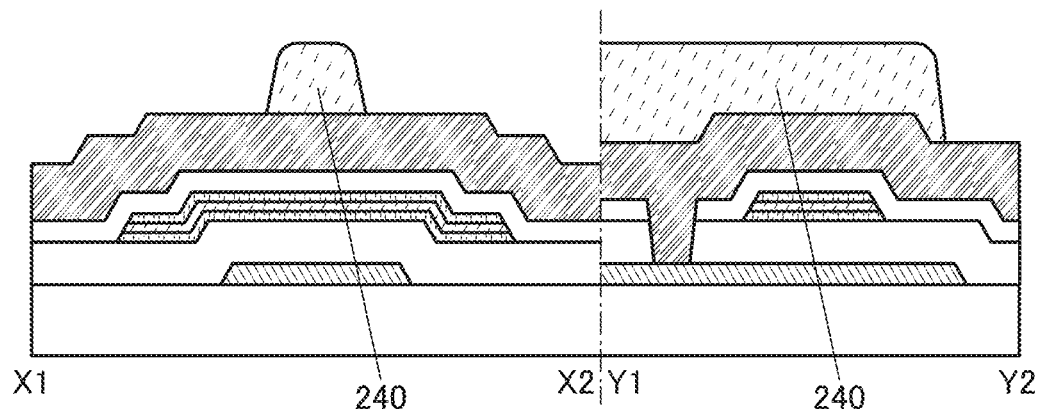
FIGS. 21A to 21C are cross-sectional views illustrating an example of a manufacturing process of a semiconductor device.
Figure 21B:
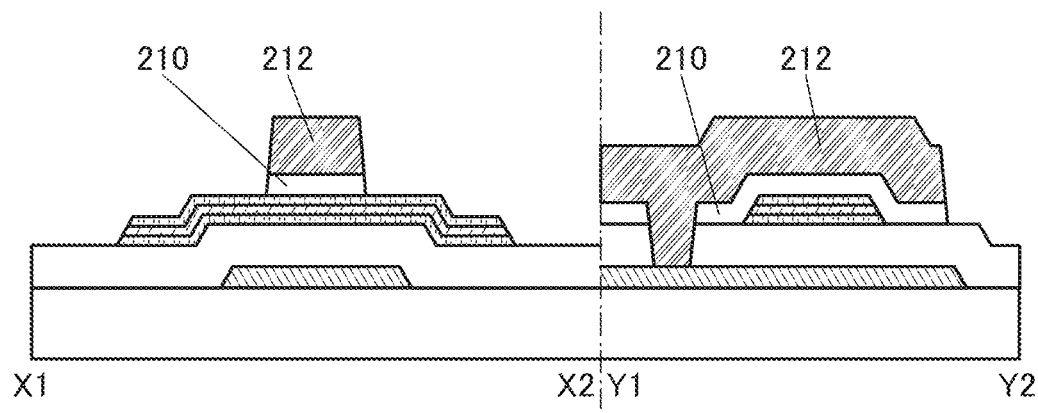
Figure 21C:
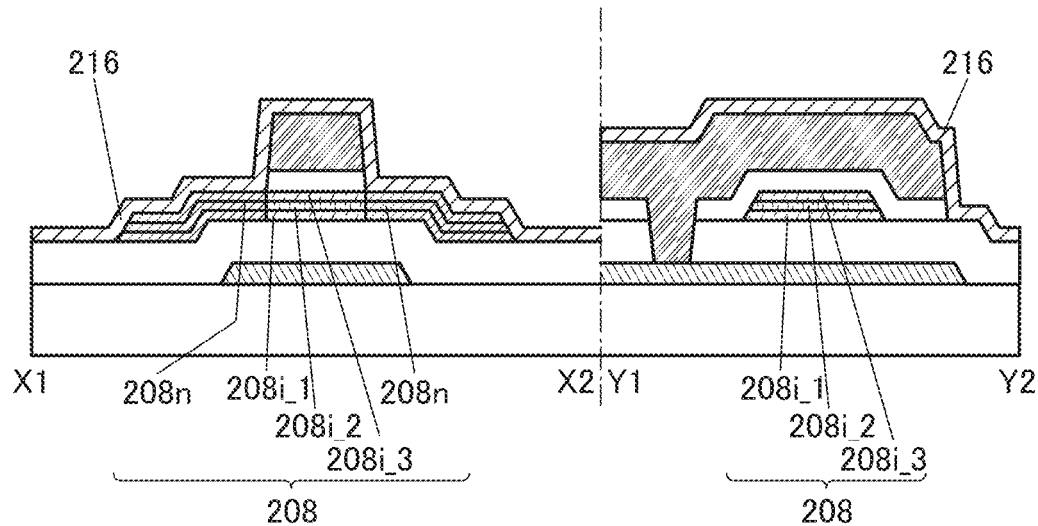

Subsequently, a mask 240 is formed by a lithography process in a desired position over the conductive film 212_0 (see FIG. 21A).

Next, etching is performed from above the mask 240 to process the conductive film 212_0 and the insulating film 210_0. After the processing of the conductive film 212_0 and the insulating film 210_0, the mask 240 is removed. As a result of the processing of the conductive film 212_0 and the insulating film 210_0, the island-shaped conductive film 212 and the island-shaped insulating film 210 are formed (see FIG. 21B).

In this embodiment, the conductive film 212_0 and the insulating film 210_0 are processed by a dry etching method.

In the processing of the conductive film 212_0 and the insulating film 210_0, the thickness of the metal oxide 208 in a region not overlapping with the conductive film 212 is decreased in some cases. In other cases, in the processing of the conductive film 212_0 and the insulating film 210_0, the thickness of the insulating film 204 in a region not overlapping with the metal oxide 208 is decreased. In the processing of the conductive film 212_0 and the insulating film 210_0, an etchant or an etching gas (e.g., chlorine) might be added to the metal oxide 208 or the constituent element of the conductive film 212_0 or the insulating film 210_0 might be added to the metal oxide 208.

Next, the insulating film 216 is formed over the insulating film 204, the metal oxide 208, and the conductive film 212. By the formation of the insulating film 216, the metal oxide 208 in contact with the insulating film 216 becomes the regions 208n. In addition, the region 208i_1, the region 208i_2, and the region 208i_3 are formed in the metal oxide 208 overlapping with the conductive film 212 (see FIG. 21C).

The insulating film 216 can be formed using a material selected from the above-mentioned materials. In this embodiment, as the insulating film 216, a 100-nm-thick silicon nitride oxide film is formed with a PECVD apparatus. In the formation of the silicon nitride oxide film, two steps, i.e., plasma treatment and deposition treatment, are performed at a temperature of 220° C. The plasma treatment is performed under the following conditions: an argon gas at a flow rate of 100 sccm and a nitrogen gas at a flow rate of 1000 sccm are introduced into a chamber before deposition; the pressure in the chamber is set to 40 Pa; and a power of 1000 W is supplied to an RF power source (27.12 MHz). The deposition treatment is performed under the following conditions: a silane gas at a flow rate of 50 sccm, a nitrogen gas at a flow rate of 5000 sccm, and an ammonia gas at a flow rate of 100 sccm are introduced into the chamber; the pressure in the chamber is set to 100 Pa; and a power of 1000 W is supplied to the RF power source (27.12 MHz).

When a silicon nitride oxide film is used as the insulating film 216, nitrogen or hydrogen in the silicon nitride oxide film can be supplied to the regions 208n in contact with the insulating film 216. In addition, when the formation temperature of the insulating film 216 is the above temperature, release of excess oxygen contained in the insulating film 210 to the outside can be suppressed.

Figure 22A:
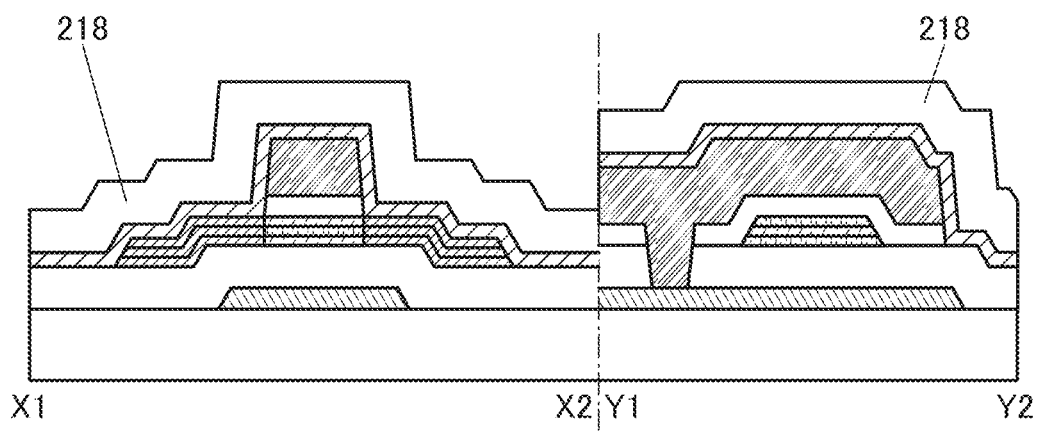
FIGS. 22A to 22C are cross-sectional views illustrating an example of a manufacturing process of a semiconductor device.

Next, the insulating film 218 is formed over the insulating film 216 (see FIG. 22A).

The insulating film 218 can be formed using a material selected from the above-mentioned materials. In this embodiment, as the insulating film 218, a 300-nm-thick silicon oxynitride film is formed with a PECVD apparatus.

Figure 22B:
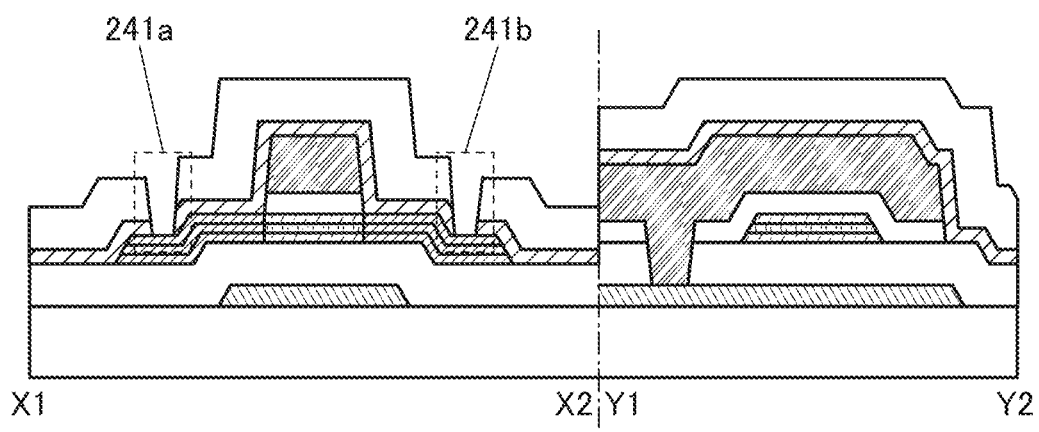

Subsequently, a mask is formed by lithography in a desired position over the insulating film 218, and then the insulating film 218 and the insulating film 216 are partly etched, so that the opening 241a and the opening 241b reaching the regions 208n are formed (see FIG. 22B).

To etch the insulating film 218 and the insulating film 216, a wet etching method and/or a dry etching method can be used. In this embodiment, the insulating film 218 and the insulating film 216 are processed by a dry etching method.

Figure 22C:
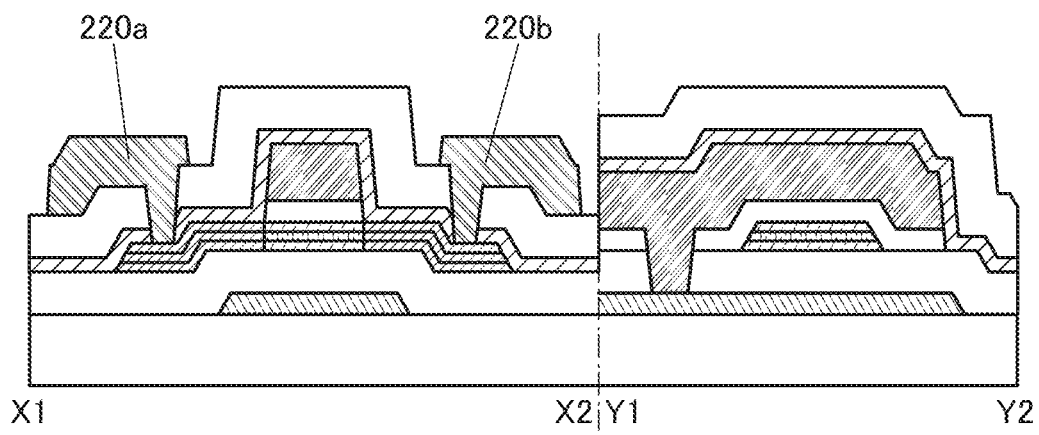

Next, a conductive film is formed over the regions 208n and the insulating film 218 so as to cover the openings 241a and 241b, and the conductive film is processed into a desired shape, whereby the conductive films 220a and 220b are formed (see FIG. 22C).

The conductive films 220a and 220b can be formed using a material selected from the above-mentioned materials. In this embodiment, for the conductive films 220a and 220b, a stack including a 50-nm-thick tungsten film and a 400-nm-thick copper film is formed with a sputtering apparatus.

To process the conductive film to be the conductive films 220a and 220b, a wet etching method and/or a dry etching method can be used. In this embodiment, in the processing of the conductive film into the conductive films 220a and 220b, the copper film is etched by a wet etching method, and then the tungsten film is etched by a dry etching method.

Through the above steps, the transistor 200C in FIGS. 18A to 18C can be manufactured.

Note that the films included in the transistor (the insulating film, the metal oxide, the conductive film, and the like) can be formed by, other than the above methods, a sputtering method, a chemical vapor deposition (CVD) method, a vacuum evaporation method, a pulsed laser deposition (PLD) method, or an ALD method. Alternatively, a coating method or a printing method can be used. Although a sputtering method and a PECVD method are typical examples of the deposition method, a thermal CVD method may be used. As an example of a thermal CVD method, a metal organic chemical vapor deposition (MOCVD) method can be given.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Note that the structures and the methods described in this embodiment can be combined as appropriate with any of the structures and the methods described in the other embodiments.

Embodiment 3

In this embodiment, an example of a display panel which can be used for a display portion or the like in a display device including the semiconductor device of one embodiment of the present invention is described with reference to FIG. 24 and FIG. 25. The display panel described below as an example includes both a reflective liquid crystal element and a light-emitting element and can display an image in both the transmissive mode and the reflective mode. Note that the metal oxide of one embodiment of the present invention and a transistor including the metal oxide can be preferably used in a transistor in a pixel of a display device, a driver for driving the display device, an LSI supplying data to the display device, or the like.

<3-1. Structure Example of Display Panel>

Figure 24:
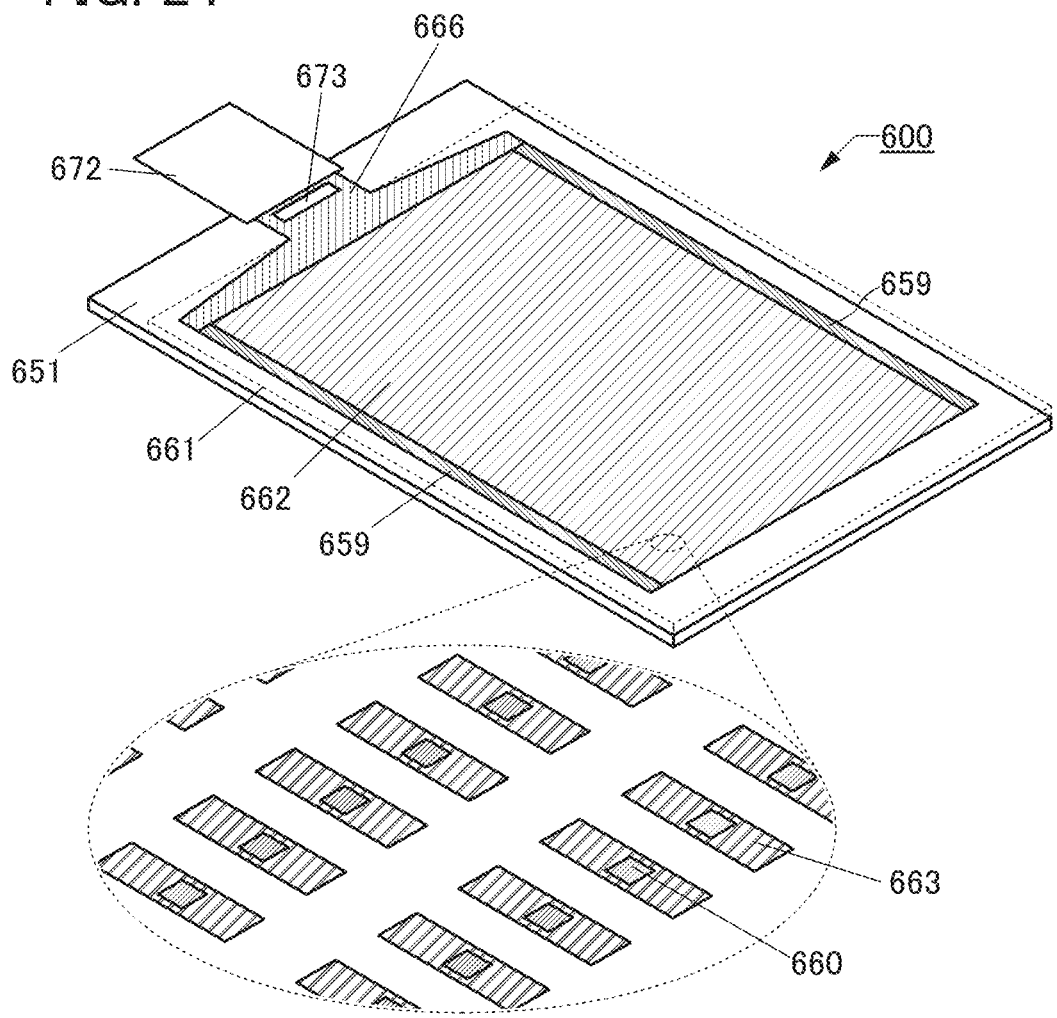
FIG. 24 illustrates a structure example of a display panel.

FIG. 24 is a schematic perspective view illustrating a display panel 600 of one embodiment of the present invention. In the display panel 600, a substrate 651 and a substrate 661 are attached to each other. In FIG. 24, the substrate 661 is denoted by a dashed line.

The display panel 600 includes a display portion 662, a circuit 659, a wiring 666, and the like. The substrate 651 is provided with the circuit 659, the wiring 666, a conductive film 663 which serves as a pixel electrode, and the like. In FIG. 24, an IC 673 and an FPC 672 are mounted on the substrate 651. Thus, the structure illustrated in FIG. 24 can be referred to as a display module including the display panel 600, the FPC 672, and the IC 673.

As the circuit 659, for example, a circuit functioning as a scan line driver circuit can be used.

The wiring 666 has a function of supplying a signal or electric power to the display portion 662 or the circuit 659. The signal or electric power is input to the wiring 666 from the outside through the FPC 672 or from the IC 673.

FIG. 24 shows an example in which the IC 673 is provided on the substrate 651 by a chip on glass (COG) method or the like. As the IC 673, an IC functioning as a scan line driver circuit, a signal line driver circuit, or the like can be used. Note that it is possible that the IC 673 is not provided when, for example, the display panel 600 includes circuits serving as a scan line driver circuit and a signal line driver circuit and when the circuits serving as a scan line driver circuit and a signal line driver circuit are provided outside and a signal for driving the display panel 600 is input through the FPC 672. Alternatively, the IC 673 may be mounted on the FPC 672 by a chip on film (COF) method or the like.

FIG. 24 also shows an enlarged view of part of the display portion 662. The conductive films 663 included in a plurality of display elements are arranged in a matrix in the display portion 662. The conductive film 663 has a function of reflecting visible light and serves as a reflective electrode of a liquid crystal element 640 described later.

As illustrated in FIG. 24, the conductive film 663 has an opening. A light-emitting element 660 is positioned closer to the substrate 651 than the conductive film 663 is. Light is emitted from the light-emitting element 660 to the substrate 661 side through the opening in the conductive film 663.

<3-2. Cross-Sectional Structure Example>

Figure 25:
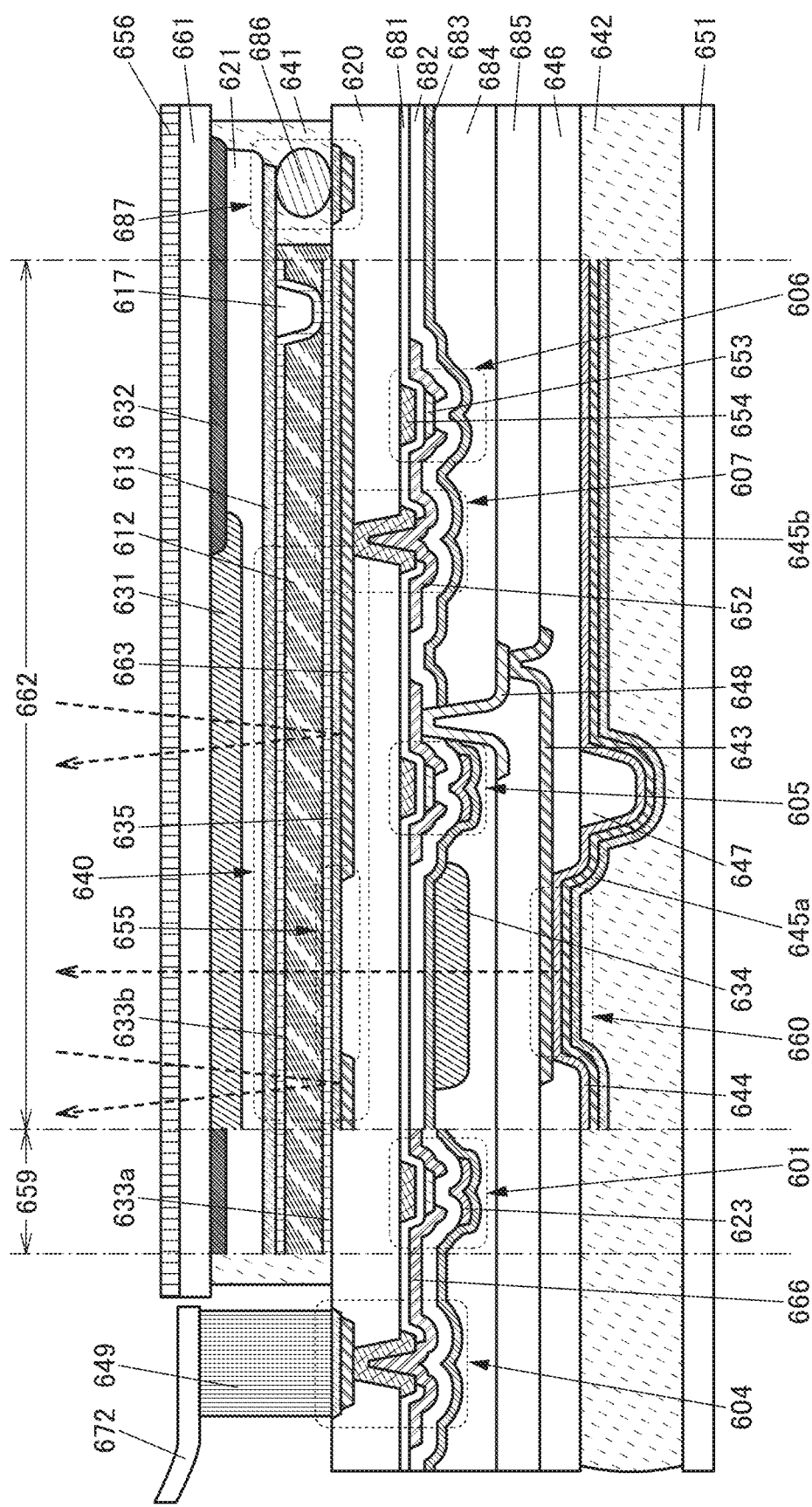
FIG. 25 illustrates a structure example of a display panel.

FIG. 25 shows an example of cross sections of part of a region including the FPC 672, part of a region including the circuit 659, and part of a region including the display portion 662 of the display panel illustrated in FIG. 24.

The display panel includes an insulating film 620 between the substrates 651 and 661. The display panel also includes the light-emitting element 660, a transistor 601, a transistor 605, a transistor 606, a coloring layer 634, and the like between the substrate 651 and the insulating film 620. Furthermore, the display panel includes the liquid crystal element 640, a coloring layer 631, and the like between the insulating film 620 and the substrate 661. The substrate 661 and the insulating film 620 are bonded with an adhesive layer 641. The substrate 651 and the insulating film 620 are bonded with an adhesive layer 642.

The transistor 606 is electrically connected to the liquid crystal element 640 and the transistor 605 is electrically connected to the light-emitting element 660. Since the transistors 605 and 606 are formed on a surface of the insulating film 620 which is on the substrate 651 side, the transistors 605 and 606 can be formed through the same process.

The substrate 661 is provided with the coloring layer 631, a light-blocking film 632, an insulating film 621, a conductive film 613 serving as a common electrode of the liquid crystal element 640, an alignment film 633b, an insulating film 617, and the like. The insulating film 617 serves as a spacer for holding a cell gap of the liquid crystal element 640.

Insulating layers such as an insulating film 681, an insulating film 682, an insulating film 683, an insulating film 684, and an insulating film 685 are provided on the substrate 651 side of the insulating film 620. Part of the insulating film 681 functions as a gate insulating layer of each transistor. The insulating films 682, 683, and 684 are provided to cover each transistor. The insulating film 685 is provided to cover the insulating film 684. The insulating films 684 and 685 each function as a planarization layer. Note that an example where the three insulating layers, the insulating films 682, 683, and 684, are provided to cover the transistors and the like is described here; however, one embodiment of the present invention is not limited to this example, and four or more insulating layers, a single insulating layer, or two insulating layers may be provided. The insulating film 684 functioning as a planarization layer is not necessarily provided when not needed.

The transistors 601, 605, and 606 each include a conductive film 654 part of which functions as a gate, a conductive film 652 part of which functions as a source or a drain, and a semiconductor film 653. Here, a plurality of layers obtained by processing the same conductive film are shown with the same hatching pattern.

The liquid crystal element 640 is a reflective liquid crystal element. The liquid crystal element 640 has a stacked structure of a conductive film 635, a liquid crystal layer 612, and the conductive film 613. In addition, the conductive film 663 which reflects visible light is provided in contact with the surface of the conductive film 635 that faces the substrate 651. The conductive film 663 includes an opening 655. The conductive films 635 and 613 contain a material transmitting visible light. In addition, an alignment film 633a is provided between the liquid crystal layer 612 and the conductive film 635 and the alignment film 633b is provided between the liquid crystal layer 612 and the conductive film 613. A polarizing plate 656 is provided on an outer surface of the substrate 661.

In the liquid crystal element 640, the conductive film 663 has a function of reflecting visible light and the conductive film 613 has a function of transmitting visible light. Light entering from the substrate 661 side is polarized by the polarizing plate 656, passes through the conductive film 613 and the liquid crystal layer 612, and is reflected by the conductive film 663. Then, the light passes through the liquid crystal layer 612 and the conductive film 613 again and reaches the polarizing plate 656. In this case, alignment of the liquid crystal is controlled with a voltage that is applied between the conductive film 613 and the conductive films 663 and 635, and thus optical modulation of light can be controlled. That is, the intensity of light emitted through the polarizing plate 656 can be controlled. Light excluding light in a particular wavelength region is absorbed by the coloring layer 631, and thus, emitted light is red light, for example.

The light-emitting element 660 is a bottom-emission light-emitting element. The light-emitting element 660 has a structure in which a conductive film 643, an EL layer 644, and a conductive film 645b are stacked in this order from the insulating film 620 side. In addition, a conductive film 645a is provided to cover the conductive film 645b. The conductive film 645b contains a material reflecting visible light, and the conductive films 643 and 645a contain a material transmitting visible light. Light is emitted from the light-emitting element 660 to the substrate 661 side through the coloring layer 634, the insulating film 620, the opening 655, the conductive film 613, and the like.

Here, as illustrated in FIG. 25, the conductive film 635 transmitting visible light is preferably provided for the opening 655. Accordingly, the liquid crystal is aligned in a region overlapping with the opening 655 as well as in the other regions, in which case an alignment defect of the liquid crystal is prevented from being generated in the boundary portion of these regions and undesired light leakage can be suppressed.

As the polarizing plate 656 provided on an outer surface of the substrate 661, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 640 are controlled depending on the kind of the polarizing plate so that desirable contrast is obtained.

In addition, an insulating film 647 is provided on the insulating film 646 covering an end portion of the conductive film 643. The insulating film 647 has a function as a spacer for preventing the insulating film 620 and the substrate 651 from getting closer more than necessary. In the case where the EL layer 644 or the conductive film 645a is formed using a blocking mask (metal mask), the insulating film 647 may have a function of preventing the blocking mask from being in contact with a surface on which the EL layer 644 or the conductive film 645a is formed. Note that the insulating film 647 is not necessarily provided when not needed.

One of a source and a drain of the transistor 605 is electrically connected to the conductive film 643 of the light-emitting element 660 through a conductive film 648.

One of a source and a drain of the transistor 606 is electrically connected to the conductive film 663 through a connection portion 607. The conductive films 663 and 635 are in contact with and electrically connected to each other. Here, in the connection portion 607, the conductive layers provided on both surfaces of the insulating film 620 are connected to each other through an opening in the insulating film 620.

A connection portion 604 is provided in a region of the substrate 651 that does not overlap with the substrate 661. The connection portion 604 is electrically connected to the FPC 672 through a connection layer 649. The connection portion 604 has a structure similar to that of the connection portion 607. On the top surface of the connection portion 604, a conductive layer obtained by processing the same conductive film as the conductive film 635 is exposed. Thus, the connection portion 604 and the FPC 672 can be electrically connected to each other through the connection layer 649.

A connection portion 687 is provided in part of a region where the adhesive layer 641 is provided. In the connection portion 687, the conductive layer obtained by processing the same conductive film as the conductive film 635 is electrically connected to part of the conductive film 613 with a connector 686. Accordingly, a signal or a potential input from the FPC 672 connected to the substrate 651 side can be supplied to the conductive film 613 formed on the substrate 661 side through the connection portion 687.

As the connector 686, a conductive particle can be used, for example. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 686, a material capable of elastic deformation or plastic deformation is preferably used. As illustrated in FIG. 25, the connector 686 which is the conductive particle has a shape that is vertically crushed in some cases. With the crushed shape, the contact area between the connector 686 and a conductive layer electrically connected to the connector 686 can be increased, thereby reducing contact resistance and suppressing the generation of problems such as disconnection.

The connector 686 is preferably provided so as to be covered with the adhesive layer 641. For example, the connectors 686 are dispersed in the adhesive layer 641 before curing of the adhesive layer 641.

FIG. 25 illustrates an example of the circuit 659 in which the transistor 601 is provided.

The structure in which the semiconductor film 653 where a channel is formed is provided between two gates is used as an example of the transistors 601 and 605 in FIG. 25. One gate is formed using the conductive film 654 and the other gate is formed using a conductive film 623 overlapping with the semiconductor film 653 with the insulating film 682 provided therebetween. Such a structure enables control of threshold voltages of a transistor. In that case, the two gates may be connected to each other and supplied with the same signal to operate the transistor. Such a transistor can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel in which the number of wirings is increased because of increase in size or resolution.

Note that the transistor included in the circuit 659 and the transistor included in the display portion 662 may have the same structure. A plurality of transistors included in the circuit 659 may have the same structure or different structures. A plurality of transistors included in the display portion 662 may have the same structure or different structures.

A material through which impurities such as water and hydrogen do not easily diffuse is preferably used for at least one of the insulating films 682 and 683 which cover the transistors. That is, the insulating film 682 or the insulating film 683 can function as a barrier film. Such a structure can effectively suppress diffusion of the impurities into the transistors from the outside, and a highly reliable display panel can be provided.

The insulating film 621 is provided on the substrate 661 side to cover the coloring layer 631 and the light-blocking film 632. The insulating film 621 may have a function as a planarization layer. The insulating film 621 enables the conductive film 613 to have an almost flat surface, resulting in a uniform alignment state of the liquid crystal layer 612.

An example of the method for manufacturing the display panel 600 is described. For example, the conductive film 635, the conductive film 663, and the insulating film 620 are formed in order over a support substrate provided with a separation layer, and the transistor 605, the transistor 606, the light-emitting element 660, and the like are formed. Then, the substrate 651 and the support substrate are bonded with the adhesive layer 642. After that, separation is performed at the interface between the separation layer and each of the insulating film 620 and the conductive film 635, whereby the support substrate and the separation layer are removed. Separately, the coloring layer 631, the light-blocking film 632, the conductive film 613, and the like are formed over the substrate 661 in advance. Then, the liquid crystal is dropped onto the substrate 651 or 661 and the substrates 651 and 661 are bonded with the adhesive layer 641, whereby the display panel 600 can be manufactured.

A material for the separation layer can be selected such that separation at the interface with the insulating film 620 and the conductive film 635 occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating film 620 over the separation layer. The use of the high-melting-point metal material for the separation layer can increase the formation temperature of a layer formed in a later step, which reduces impurity concentration and achieves a highly reliable display panel.

As the conductive film 635, an oxide or a nitride such as a metal oxide or a metal nitride is preferably used. In the case of using a metal oxide, a material in which at least one of the concentrations of hydrogen, boron, phosphorus, nitrogen, and other impurities and the number of oxygen vacancies is made to be higher than those in a semiconductor layer of a transistor is used for the conductive film 635.

<3-3. Components>

The above components will be described below.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layer, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of the components.

<3-4. Manufacturing Method Example>

A manufacturing method example of a display panel using a flexible substrate is described.

Here, layers including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 μm and the like.

As a method for forming an element layer over a flexible substrate provided with an insulating surface, typically, there are two methods shown below. One of them is to directly form an element layer over the substrate. The other method is to form an element layer over a support substrate that is different from the substrate and then to separate the element layer from the support substrate to be transferred to the substrate. Although not described in detail here, in addition to the above two methods, there is a method in which an element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, selected is a material with which separation at an interface between the support substrate and the separation layer, at an interface between the separation layer and the insulating layer, or in the separation layer occurs. With the method, it is preferable that a material having high heat resistance be used for the support substrate or the separation layer, in which case the upper limit of the temperature applied when the element layer is formed can be increased, and an element layer including a more highly reliable element can be formed.

For example, it is preferable that a stack of a layer containing a high-melting-point metal material, such as tungsten, and a layer containing an oxide of the metal material be used as the separation layer, and a stack of a plurality of layers, such as a silicon oxide layer, a silicon nitride layer, a silicon oxynitride layer, and a silicon nitride oxide layer be used as the insulating layer over the separation layer.

As the method for separating the support substrate from the element layer, applying mechanical force, etching the separation layer, and making a liquid permeate the separation interface are given as examples. Alternatively, separation may be performed by heating or cooling two layers of the separation interface by utilizing a difference in thermal expansion coefficient.

The separation layer is not necessarily provided in the case where the separation can be performed at an interface between the support substrate and the insulating layer.

For example, glass and an organic resin such as polyimide can be used as the support substrate and the insulating layer, respectively. In that case, a separation trigger may be formed by, for example, locally heating part of the organic resin with laser light or the like, or by physically cutting part of or making a hole through the organic resin with a sharp tool, and separation may be performed at an interface between the glass and the organic resin. As the above-described organic resin, a photosensitive material is preferably used because an opening or the like can be easily formed. The above-described laser light preferably has a wavelength region, for example, from visible light to ultraviolet light. For example, light having a wavelength of greater than or equal to 200 nm and less than or equal to 400 nm, preferably greater than or equal to 250 nm and less than or equal to 350 nm can be used. In particular, an excimer laser having a wavelength of 308 nm is preferably used because the productivity is increased. Alternatively, a solid-state UV laser (also referred to as a semiconductor UV laser), such as a UV laser having a wavelength of 355 nm which is the third harmonic of an Nd:YAG laser, may be used.

Alternatively, a heat generation layer may be provided between the support substrate and the insulating layer formed of an organic resin, and separation may be performed at an interface between the heat generation layer and the insulating layer by heating the heat generation layer. For the heat generation layer, any of a variety of materials such as a material which generates heat by feeding current, a material which generates heat by absorbing light, and a material which generates heat by applying a magnetic field can be used. For example, for the heat generation layer, a material selected from a semiconductor, a metal, and an insulator can be used.

In the above-described methods, the insulating layer formed of an organic resin can be used as a substrate after the separation.

The above is the description of a manufacturing method of a flexible display panel.

Note that the structure and the method described in this embodiment can be used in appropriate combination with any of the structures and the methods described in the other embodiments.

REFERENCE NUMERALS

P1: region, P2: region, P3: region, P4: region, P5: region, P6: region, P7: region, P8: region, 001: region, 002: region, 10: sputtering target, 10*a*: sputtering target, 10*b*: sputtering target, 11: region, 11*a*: sputtered particle, 12: region, 12*a*: sputtered particle, 13: precipitation portion, 20: cation, 30: plasma, 41: deposition chamber, 50*a*: backing plate, 50*b*: backing plate, 52: target holder, 52*a*: target holder, 52*b*: target holder, 54*a*: magnet unit, 54*b*: magnet unit, 54N1: magnet, 54N2: magnet, 54S: magnet, 56: magnet holder, 58: member, 60: substrate, 62: substrate holder, 64*a*: magnetic line of force, 64*b*: magnetic line of force, 100: transistor, 100A: transistor, 100B: transistor, 100C: transistor, 100D: transistor, 102: substrate, 104: insulating film, 106: conductive film, 108: metal oxide, 108_1: metal oxide, 108_2: metal oxide, 108_3: metal oxide, 112*a*: conductive film, 112*b*: conductive film, 112*c*: conductive film, 114: insulating film, 116: insulating film, 118: insulating film, 120*a*: conductive film, 120*a*_2: conductive film, 120*b*: conductive film, 120*b*_2: conductive film, 151: opening, 152*a*: opening, 152*b*: opening, 200A: transistor, 200B: transistor, 200C: transistor, 200D: transistor, 202: substrate, 204: insulating film, 206: conductive film, 208: metal oxide, 208_1*a*: metal oxide, 208_2*a*: metal oxide, 2083*a*: metal oxide, 208*i*: region, 208*i*_1: region, 208*i*_2: region, 208*i*_3: region, 208*n*: region, 210: insulating film, 210_0: insulating film, 212: conductive film, 212_0: conductive film, 216: insulating film, 218: insulating film, 220*a*: conductive film, 220*b*: conductive film, 240: mask, 241*a*: opening, 241*b*: opening, 243: opening, 600: display panel, 601: transistor, 604: connection portion, 605: transistor, 606: transistor, 607: connection portion, 612: liquid crystal layer, 613: conductive film, 617: insulating film, 620: insulating film, 621: insulating film, 623: conductive film, 631: coloring layer, 632: light-blocking film, 633*a*: alignment film, 633*b*: alignment film, 634: coloring layer, 635: conductive film, 640: liquid crystal element, 641: adhesive layer, 642: adhesive layer, 643: conductive film, 644: EL layer, 645*a*: conductive film, 645*b*: conductive film, 646: insulating film, 647: insulating film, 648: conductive film, 649: connection layer, 651: substrate, 652: conductive film, 653: semiconductor film, 654: conductive film, 655: opening, 656: polarizing plate, 659: circuit, 660: light-emitting element, 661: substrate, 662: display portion, 663: conductive film, 666: wiring, 672: FPC, 673: IC, 681: insulating film, 682: insulating film, 683: insulating film, 684: insulating film, 685: insulating film, 686: connector, and 687: connection portion.

This application is based on Japanese Patent Application serial no. 2016-137190 filed with Japan Patent Office on Jul. 11, 2016, and Japanese Patent Application serial no. 2016-144334 filed with Japan Patent Office on Jul. 22, 2016, the entire contents of which are hereby incorporated by reference.

The invention claimed is:

1. A method for manufacturing a sputtering target, comprising the steps of:
    weighing an oxide of an element M1 and a first zinc oxide as raw materials of an insulating material;
    weighing an indium oxide and a second zinc oxide as raw materials of a conductive material;
    forming a first mixture by mixing the oxide of the element M1 and the first zinc oxide;
    forming a first molded body by molding the first mixture with pressure;
    forming a first baked body by baking the first molded body;
    forming a first powder by pulverizing the first baked body;
    forming a second mixture by mixing the indium oxide and the second zinc oxide;
    forming a second molded body by molding the second mixture with pressure;
    forming a second baked body by baking the second molded body;
    forming a second powder by pulverizing the second baked body;
    forming a third mixture by mixing the first powder and the second powder; and
    forming a third molded body by molding the third mixture with pressure,
    wherein the element M1 is one or more kinds of elements selected from Al, Ga, Si, Mg, Zr, Be and B, and
    wherein baking the third molded body is not performed after forming the third molded body, or baking the third molded body is performed at a temperature at which part of the conductive material and part of the insulating material are not combined with each other after forming the third molded body.

2. The method for manufacturing a sputtering target, according to claim 1, wherein baking the third molded body is performed at a temperature lower than baking temperatures of the first molded body and the second molded body.

3. A method for manufacturing a sputtering target, comprising the steps of:
    weighing an oxide of an element M1 and a first zinc oxide as raw materials of an insulating material;
    weighing an indium oxide, a second zinc oxide, and an oxide of an element M2 as raw materials of a conductive material;
    forming a first mixture by mixing the indium oxide and the oxide of the element M2;
    forming a first molded body by molding the first mixture with pressure;
    forming a first baked body by baking the first molded body;
    forming a first powder by pulverizing the first baked body;
    forming a second mixture by mixing the first powder and the oxide of the element M1; and
    forming a second molded body by molding the second mixture with pressure,
    wherein the element M1 is one or more kinds of elements selected from Al, Ga, Si, Mg, Zr, Be and B,
    wherein the element M2 is one or more kinds of elements selected from Ti, Ge, Sn, V, Ni, Mo, W and Ta, and
    wherein baking the second molded body is not performed after forming the second molded body, or baking the second molded body is performed at a temperature at which part of the conductive material and part of the insulating material are not combined with each other after forming the second molded body.

4. The method for manufacturing a sputtering target, according to claim 3, wherein baking the second molded body is performed at a temperature lower than a baking temperature of the first molded body.

5. The method for manufacturing a sputtering target, according to claim 3, wherein the first zinc oxide is further used as a raw material of the insulating material.

6. A method for manufacturing a sputtering target, comprising the steps of:
    weighing an oxide of an element M1A and an oxide of an element M1B, and a first zinc oxide as raw materials of an insulating material;
    weighing an indium oxide and a second zinc oxide as raw materials of a conductive material;
    forming a first mixture by mixing the oxide of the element M1A and the oxide of the element M1B;
    forming a first molded body by molding the first mixture with pressure;
    forming a first baked body by baking the first molded body;
    forming a first powder by pulverizing the first baked body;
    forming a second mixture by mixing the first powder and the indium oxide; and
    forming a second molded body by molding the second mixture with pressure,
    wherein the element M1A is one or more kinds of elements selected from Al, Ga, Si, Mg, Zr, Be and B,
    wherein the element M1B is one or more kinds of elements selected from Al, Ga, Si, Mg, Zr, Be and B and comprises an element of a different kind from the element M1A, and
    wherein baking the second molded body is not performed after forming the second molded body, or baking the second molded body is performed at a temperature at which part of the conductive material and part of the insulating material are not combined with each other after forming the second molded body.

7. The method for manufacturing a sputtering target, according to claim 6, wherein baking the second molded body is performed at a temperature lower than a baking temperature of the first molded body.

8. The method for manufacturing a sputtering target, according to claim 6, wherein the first zinc oxide is further used as a raw material of the insulating material.

* * * * *